United States Patent
Morishita

(10) Patent No.: US 9,383,727 B1
(45) Date of Patent: Jul. 5, 2016

(54) DISCRETE-TIME ANALOG CIRCUIT, TRANSMITTING DEVICE, AND RECEIVING DEVICE

(71) Applicant: Panasonic Corporation, Osaka (JP)

(72) Inventor: Yohei Morishita, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/975,643

(22) Filed: Dec. 18, 2015

(30) Foreign Application Priority Data

Jan. 6, 2015 (JP) ................................. 2015-001146
Aug. 5, 2015 (JP) ................................. 2015-155272

(51) Int. Cl.
*H03M 1/50* (2006.01)
*G04F 10/00* (2006.01)
*H03M 1/06* (2006.01)

(52) U.S. Cl.
CPC ........... *G04F 10/005* (2013.01); *H03M 1/0604* (2013.01)

(58) Field of Classification Search
CPC ....... H03M 1/18; H03M 1/50; H03M 1/0604; H03M 5/00; G04F 10/005; H03H 19/004; H03H 19/00; H03H 7/00; H03H 7/12
USPC .......... 341/122, 124, 160, 166; 333/167, 174, 333/181
See application file for complete search history.

(56) References Cited

U.S. PATENT DOCUMENTS

| 8,018,272 B2 * | 9/2011 | Iida | ........................ | H03H 15/00 327/137 |
| 8,279,023 B2 * | 10/2012 | Iida | ...................... | H03H 19/004 333/167 |

(Continued)

FOREIGN PATENT DOCUMENTS

| JP | 2010-147944 | 7/2010 |
| JP | 2010-148043 | 7/2010 |
| JP | 2010-148044 | 7/2010 |

OTHER PUBLICATIONS

Tomonori Yamashita et al. "Direct Sampling Mixer with Complex Poles Enhansing Sharpness Passband Edge Characteristic", Institute of Electrical Engineers of Japan, Electric Circuit Study Group, ECT-08-89, pp. 29-33, Oct. 2008.

(Continued)

*Primary Examiner* — Lam T Mai
(74) *Attorney, Agent, or Firm* — Greenblum & Bernstein, P.L.C.

(57) ABSTRACT

A discrete-time analog circuit comprises: a voltage-current conversion circuit that converts an input voltage signal into a current signal and outputs the current signal; and a charge inverting circuit that is connected to an output terminal of the voltage-current conversion circuit to perform charge sharing. The charge inverting circuit includes 2M capacitors (M is an integer greater than or equal to 1) that are provided parallel to each other. In accordance with a predetermined sampling interval, one of the 2M capacitors repeats: (1) sharing input charge that is input by the current signal, (2) holding at least part of the input charge, (3) inverting a polarity of the held charge and connecting to the output terminal to share the held charge, and (4) holding remaining charge. At time period when one of the 2M capacitors is connected to the output terminal, the other capacitor(s) of the 2M capacitors is not connected to either of an input terminal and the output terminal.

14 Claims, 59 Drawing Sheets

(56) References Cited

U.S. PATENT DOCUMENTS

| | | | |
|---|---|---|---|
| 8,390,370 B2* | 3/2013 | Iida | H03H 19/004 |
| | | | 327/552 |
| 8,766,834 B2* | 7/2014 | Shiozaki | H03H 15/00 |
| | | | 341/122 |
| 2010/0156560 A1 | 6/2010 | Iida et al. | |
| 2010/0156561 A1 | 6/2010 | Iida et al. | |
| 2010/0156564 A1 | 6/2010 | Iida et al. | |
| 2013/0222164 A1* | 8/2013 | Shiozaki | H03H 15/00 |
| | | | 341/122 |

OTHER PUBLICATIONS

Atsushi Yoshizawa et al. "An Equalized Ultra-Wideband Channel-Select Filter with a Discrete-Time Charge-Domain Band-Pass IIR Filter", IEEE 2007(CICC), pp. 707-710.

S. Manetti et al. "Switched-capacitor lowpass filter without active components", Electronics Letters, vol. 16, No. 23. pp. 883-885, 1980.

Behzad Razavi et al. "Design of Analog CMOS Integrated Circuits", pp. 499-515, Mar. 2003 (Partial Translation).

* cited by examiner

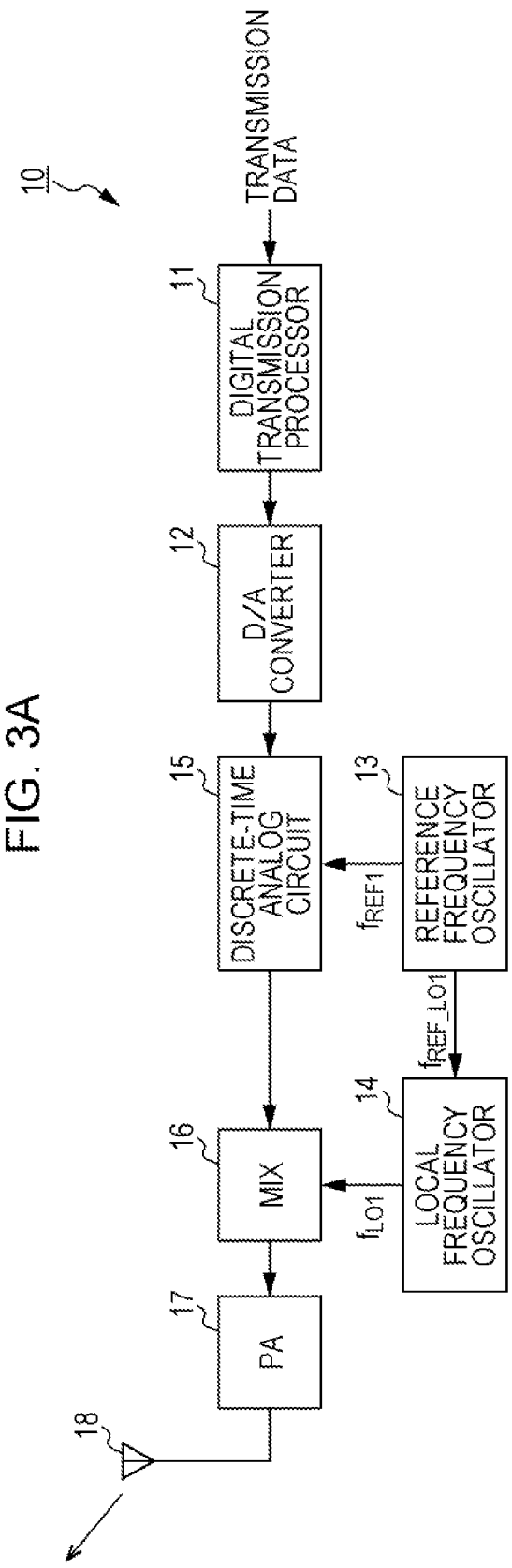

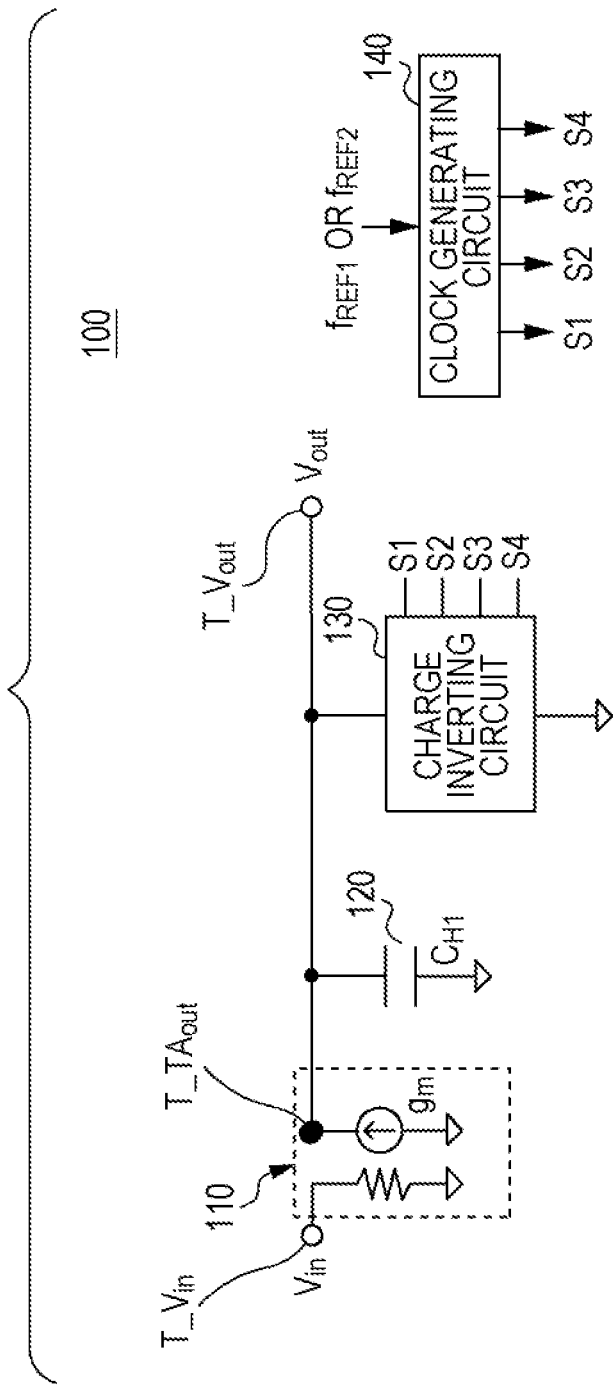

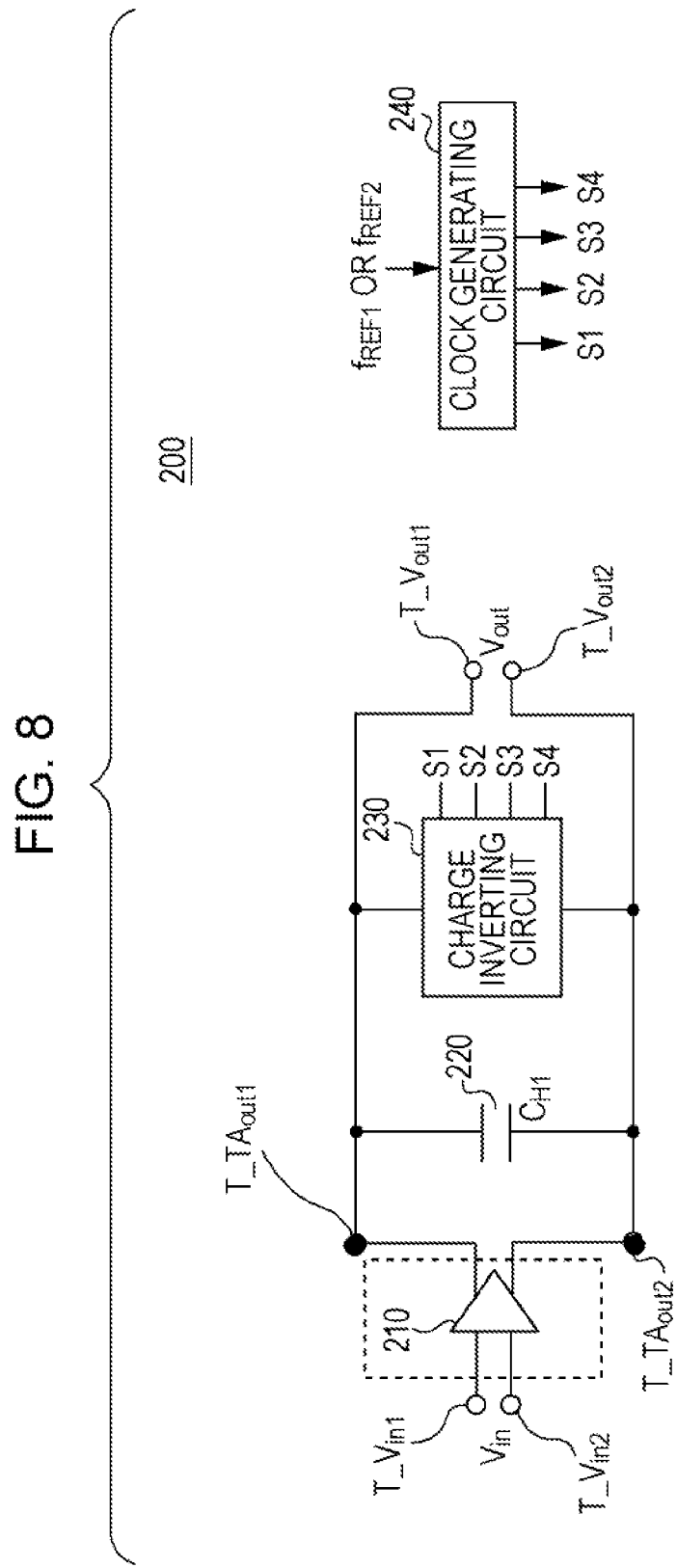

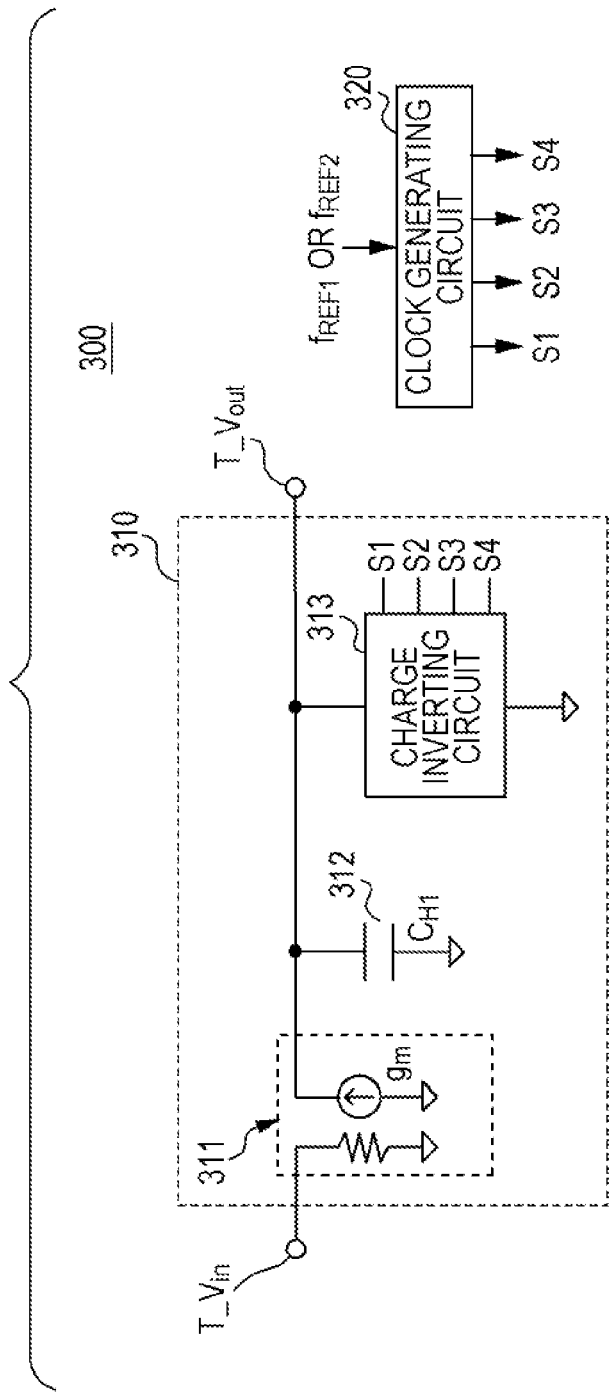

DISCRETE-TIME ANALOG CIRCUIT, TRANSMITTING DEVICE, AND RECEIVING DEVICE

BACKGROUND

1. Technical Field

The present disclosure relates to a discrete-time analog circuit and to a transmitting device and a receiving device using the circuit.

2. Description of the Related Art

Discrete-time analog circuit configurations have been known for circuits that have high variability and that are suitable for circuit design using a fine complementary metal-oxide semiconductor (CMOS) process.

For example, S. Manetti and A. Liberatore, "Switched-Capacitor Lowpass Filter without Active Components" Electronics Letters, Vol. 16, pp. 883-885, 1980 (this document is hereinafter referred to as "Non-Patent Document 1") discloses a discrete-time analog circuit that performs filtering on an input analog signal.

FIG. 1A is a diagram illustrating an overview of the operation of the discrete-time analog circuit disclosed in Non-Patent Document 1, and FIG. 1B is a diagram illustrating a specific example of implementation of the discrete-time analog circuit disclosed in Non-Patent Document 1. FIG. 1C is a time chart illustrating a plurality of control signals input to the discrete-time analog circuit disclosed in Non-Patent Document 1. FIG. 2 is a graph illustrating one example of a frequency characteristic of the discrete-time analog circuit in Non-Patent Document 1.

The discrete-time analog circuit in FIG. 1B performs filtering involving discrete-time analog signal processing on an input analog signal. A charge input and charge transfer between a plurality of capacitors included in the circuit in FIG. 1B realizes an infinite impulse response (IIR) filter characteristic with which the denominator is a second-degree polynomial.

When a voltage is input, a voltage-current conversion circuit is needed in addition to the configuration in FIG. 1B, and it is required that the order of an input and the order of an output be made to match each other in order to obtain a transfer function. Characteristics of a filter using the configuration in FIG. 1B have the frequency characteristic illustrated in FIG. 2.

However, of the known discrete-time analog circuit described in Non-Patent Document 1, circuitry used for charge transfer requires a large number of capacitors and uses a large number of clock signals (one type of control signal), and thus, the configuration is complicated. For example, in the simplest configuration in Non-Patent Document 1, the known discrete-time analog circuit also includes a voltage-current conversion circuit and a circuit used for charge transfer. The circuit (in FIG. 1B) used for charge transfer includes four capacitors and 12 switches. The circuit for charge transfer also uses eight types of clock signal, as illustrated in FIG. 1C. With the discrete-time analog circuit in Non-Patent Document 1, it is difficult to freely adjust in-band deviation (a level difference) in the passband.

SUMMARY

Accordingly, one aspect of the present disclosure has been implemented in view of the foregoing and provides a discrete-time analog circuit having a simple configuration and having a high degree of freedom in adjustment of in-band deviation.

In one general aspect, the techniques disclosed here feature a discrete-time analog circuit that comprises: a voltage-current conversion circuit including a first terminal and a second terminal, which converts a voltage signal that is input to the first terminal into a current signal, and outputs the current signal from the second terminal; and a charge inverting circuit including a third terminal connected to the second terminal, a fourth terminal, and 2M capacitors (M is an integer greater than or equal to 1) that are provided in parallel between the third terminal and the fourth terminal. In accordance with a predetermined sampling interval, each of the 2M capacitors repeats: (1) sharing input charge that is input by the current signal, (2) holding at least part of the input charge, (3) inverting a polarity of the held charge and connecting to the third terminal to share the held charge having the inverted polarity, and (4) holding remaining charge, and wherein at a time period when one of the 2M capacitors is connected to the third terminal, the other capacitor(s) of the 2M capacitors is not connected to the third terminal. These general and specific aspects may be implemented using a device, a system, a method, and a computer program, and any combination of devices, systems, methods, and computer programs.

The discrete-time analog circuit according to the present disclosure can increase the degree of freedom in adjustment of an in-band deviation by using a simple configuration.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3A is a diagram illustrating the configuration of a transmitting device according to a first embodiment of the present disclosure;

FIG. 4 is a diagram illustrating one example of the configuration of a major portion of a discrete-time analog circuit according to the first embodiment;

FIG. 8 is a diagram illustrating one example of the configuration of a major portion of a discrete-time analog circuit according to a second embodiment;

FIG. 9B is a diagram illustrating one example of the internal configuration of the multistage discrete-time analog circuit according to the third embodiment;

DETAILED DESCRIPTION

Embodiments of the present disclosure will be described in detail below with reference to the accompanying drawings. The individual embodiments described below are merely examples, and the present disclosure is not limited to the embodiments.

First Embodiment

Configurations of Transmitting Device and Receiving Device

Figure 1A:
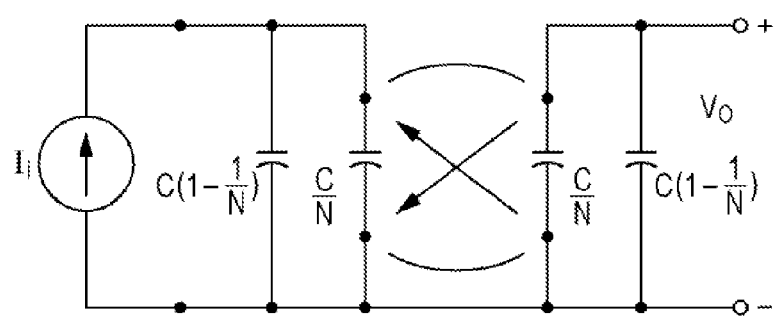
FIG. 1A is a diagram illustrating an overview of the operation of a discrete-time analog circuit disclosed in Non-Patent Document 1.
Figure 1B:
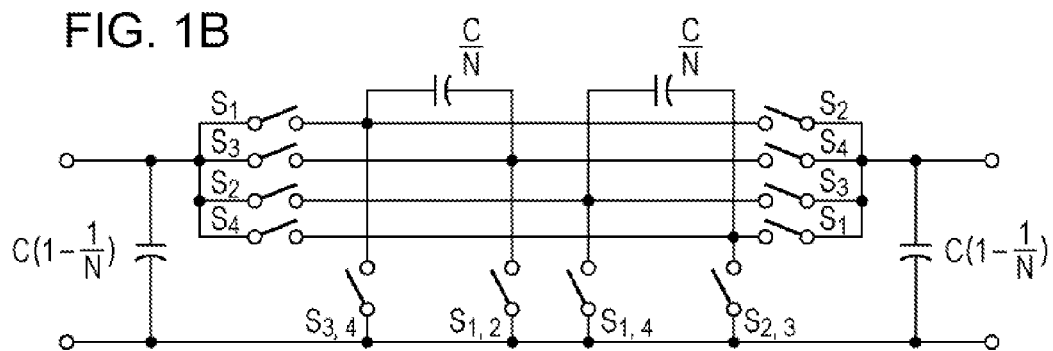
FIG. 1B is a diagram illustrating a specific example of implementation of the discrete-time analog circuit disclosed in Non-Patent Document 1.
Figure 1C:
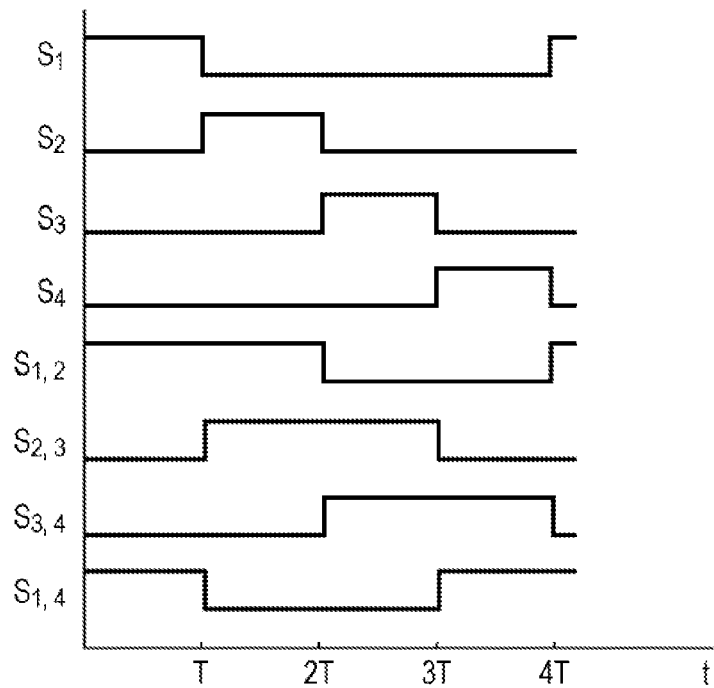
FIG. 1C is a time chart illustrating control signals input to the discrete-time analog circuit disclosed in Non-Patent Document 1.
Figure 2:
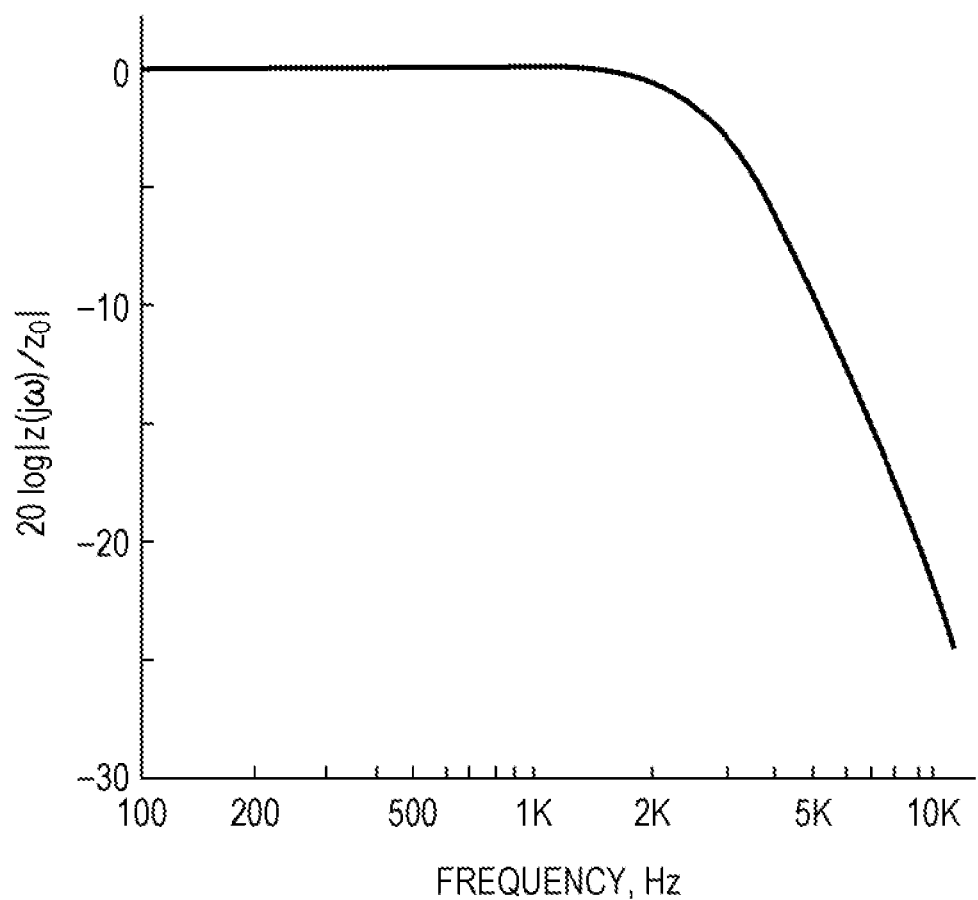
FIG. 2 is a graph illustrating one example of frequency characteristics of the discrete-time analog circuit in Non-Patent Document 1.
Figure 3B:
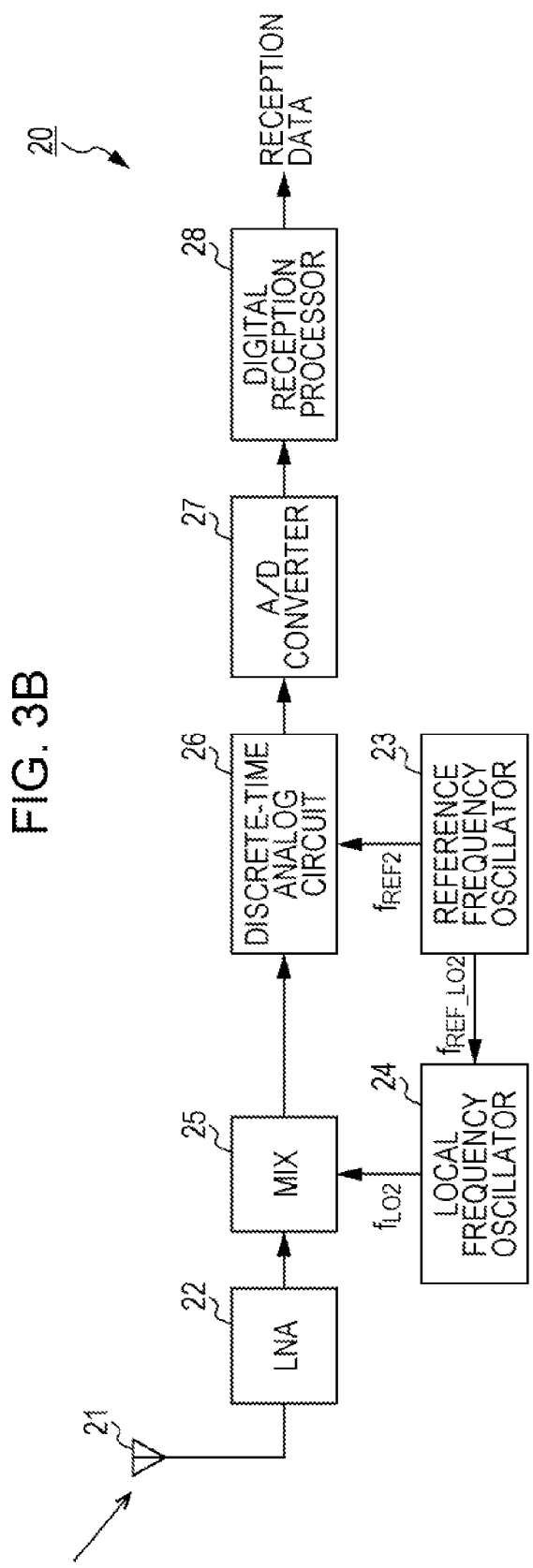
FIG. 3B is a diagram illustrating the configuration of a receiving device according to the first embodiment of the present disclosure.

FIG. 3A is a diagram illustrating the configuration of a transmitting device 10 according to a first embodiment of the present disclosure, and FIG. 3B is a diagram illustrating the configuration of a receiving device 20 according to the first embodiment of the present disclosure.

The transmitting device 10 illustrated in FIG. 3A includes a digital transmission processor 11, a digital-to-analog (D/A) converter 12, a reference frequency oscillator 13, a local frequency oscillator 14, a discrete-time analog circuit 15, a transmission mixer (MIX) 16, a power amplifier (PA) 17, and an antenna 18.

The digital transmission processor 11 performs, for example, predetermined digital transmission processing, including encoding processing and modulation processing, on transmission data to generate baseband digital transmission signals and outputs the baseband digital transmission signals to the D/A converter 12.

The D/A converter 12 performs digital-to-analog conversion on the baseband digital transmission signals to generate baseband analog transmission signals and outputs the baseband analog transmission signals to the discrete-time analog circuit 15. The baseband analog transmission signals generated by the D/A converter 12 include unwanted signals (e.g., harmonics).

The reference frequency oscillator 13 generates a reference frequency signal $f_{REF1}$ to be used for discrete-time analog signal processing and outputs the reference frequency signal $f_{REF1}$ to the discrete-time analog circuit 15. The reference frequency oscillator 13 also generates a reference frequency signal $f_{REF\_LO1}$ to be used to generate a local oscillation signal $F_{LO1}$ and outputs the reference frequency signal $f_{REF\_LO1}$ to the local frequency oscillator 14. The reference frequency signal $f_{REF1}$ for the discrete-time analog circuit 15 and the reference frequency signal $f_{REF\_LO1}$ for the local frequency oscillator 14 may have the same frequency or may have mutually different frequencies.

The local frequency oscillator 14 generates the local oscillation signal $F_{LO1}$ on the basis of the reference frequency signal $f_{REF\_LO1}$ and outputs the local oscillation signal $F_{LO1}$ to the transmission mixer 16.

On the basis of the reference frequency signal $f_{REF1}$, the discrete-time analog circuit 15 performs filtering involving discrete-time analog signal processing on the baseband analog transmission signals to thereby remove unwanted signals (e.g., harmonics). The discrete-time analog circuit 15 then outputs the filtered baseband analog transmission signals to the transmission mixer 16. The configuration and the operation of the discrete-time analog circuit 15 are described later.

The transmission mixer 16 upconverts the frequency of the filtered baseband analog transmission signals into a radio frequency (RF) on the basis of the local oscillation signal $F_{LO1}$ and outputs the upconverted analog transmission signals having the radio frequency to the power amplifier 17.

The power amplifier 17 amplifies the power of the upconverted analog transmission signals having the radio frequency and outputs the resulting analog transmission signals to the antenna 18.

The antenna 18 radiates the power-amplified analog transmission signals.

The receiving device 20 illustrated in FIG. 3B includes an antenna 21, a low-noise amplifier (LNA) 22, a reference frequency oscillator 23, a local frequency oscillator 24, a reception mixer (MIX) 25, a discrete-time analog circuit 26, an analog-to-digital (A/D) converter 27, and a digital reception processor 28.

The antenna 21 receives analog reception signals having a radio frequency from a transmitter station (not illustrated) and outputs the analog reception signals to the low-noise amplifier 22.

The low-noise amplifier 22 amplifies the received analog reception signals having the radio frequency and outputs the resulting analog reception signals to the reception mixer 25.

The reference frequency oscillator 23 generates a reference frequency signal $f_{REF2}$ to be used for discrete-time analog processing and outputs the reference frequency signal $f_{REF2}$ to the discrete-time analog circuit 26. The reference frequency oscillator 23 also outputs a reference frequency signal $f_{REF\_LO2}$ to the local frequency oscillator 24. The reference frequency signal $f_{REF2}$ for the discrete-time analog circuit 26 and the reference frequency signal $f_{REF\_LO2}$ for the local frequency oscillator 24 may have the same frequency or may have mutually different frequencies.

The local frequency oscillator 24 generates a local oscillation signal $f_{LO2}$ on the basis of the reference frequency signal $f_{REF\_LO2}$ and outputs the local oscillation signal $f_{LO2}$ to the reception mixer 25.

The reception mixer 25 converts the frequency of the analog reception signals having the radio frequency into baseband analog reception signals on the basis of the local oscillation signal $f_{LO2}$ and outputs the baseband analog reception signals to the discrete-time analog circuit 26.

On the basis of the reference frequency signal $f_{REF2}$, the discrete-time analog circuit 26 performs filtering involving discrete-time analog signal processing on the baseband analog reception signals. The discrete-time analog circuit 26 outputs the filtered baseband analog reception signals to the A/D converter 27. The configuration and the operation of the discrete-time analog circuit 26 are described later.

The A/D converter 27 converts the filtered baseband analog reception signals into baseband digital reception signals and outputs the baseband digital reception signals to the digital reception processor 28.

The digital reception processor 28 performs, for example, predetermined digital reception processing, including demodulation processing, decoding processing, and so on, on the baseband digital signals to generate reception data and outputs the reception data.

The transmitting device 10 illustrated in FIG. 3A and the receiving device 20 illustrated in FIG. 3B have been described above as having configurations for direct conversion. The present disclosure, however, is not limited to those configurations and may employ a system using an intermediate frequency (IF) by further adding one or more mixers to the transmitting device 10 or the receiving device 20.

One signal may be used for both the reference frequency signal $f_{REF1}$ used in FIG. 3A and the reference frequency signal $f_{REF2}$ used in FIG. 3B. The reference frequency oscillator 13 used in FIG. 3A and the reference frequency oscillator 23 used in FIG. 3B may also have the same configuration. The local frequency oscillator 14 used in FIG. 3A and the local frequency oscillator 24 used in FIG. 3B may have the same configuration. Another embodiment may also employ a configuration that is the same as or similar to that in the present embodiment.

[Configuration of Discrete-Time Analog Circuit 100]

Next, a description will be given of the configuration of a major portion of a discrete-time analog circuit 100 according to the present embodiment.

FIG. 4 is a diagram illustrating one example of the configuration of a major portion of the discrete-time analog circuit 100 according to the first embodiment. The discrete-time analog circuit 100 illustrated in FIG. 4 corresponds to the discrete-time analog circuit 15 included in the transmitting device 10 illustrated in FIG. 3A and to the discrete-time analog circuit 26 included in the receiving device 20 illustrated in FIG. 3B and performs, for example, filtering processing.

The discrete-time analog circuit 100 illustrated in FIG. 4 includes a transconductance amplifier (TA) 110, a history capacitor 120, a charge inverting circuit 130, and a clock generating circuit 140. Baseband analog signals are input via an input terminal $T\_V_{in}$. The charge inverting circuit 130 in the discrete-time analog circuit 100 performs filtering on the input analog signals. Output voltage signals $V_{out}$ are output from an output terminal $T\_V_{out}$ via the history capacitor 120 and the charge inverting circuit 130.

The TA 110 is a voltage-current conversion circuit and converts input voltage signals $V_{in}$, which are input analog signals, into current signals ($g_m \times V_{in}$). In this case, $g_m$ represents the value of transconductance (mutual conductance) of the TA 110.

One terminal of the history capacitor 120 is connected to an output terminal $T\_TA_{out}$ of the TA 110 and another terminal of the history capacitor 120 is connected to ground. The capacitance value of the history capacitor 120 is $C_{H1}$.

One terminal of the charge inverting circuit 130 is connected to the output terminal $T\_TA_{out}$ of the TA 110 and another terminal of the charge inverting circuit 130 is connected to ground. The charge inverting circuit 130 is a circuit for performing an operation for holding charge and an operation for establishing connection through inversion of the charge. The charge inverting circuit 130 performs charge sharing on the basis of a plurality of control signals supplied from the clock generating circuit 140 and performs filtering processing on the input analog signals. A specific configuration of the charge inverting circuit 130 is described later.

The clock generating circuit 140 generates control signals S1 to S4 (clock signals) on the basis of the reference frequency signal $f_{REF1}$ or $f_{REF2}$ output from the reference frequency oscillator 13 or 23 (see FIGS. 3A and 3B) and supplies the control signals S1 to S4 to the charge inverting circuit 130. The control signals S1 to S4 generated by the clock generating circuit 140 are described later.

[Configuration of Charge Inverting Circuit 130]

Figure 5A:
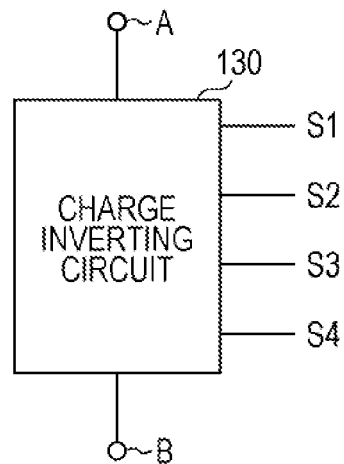
FIG. 5A is a diagram illustrating one example of the configuration of a charge inverting circuit according to the first embodiment.
Figure 5B:
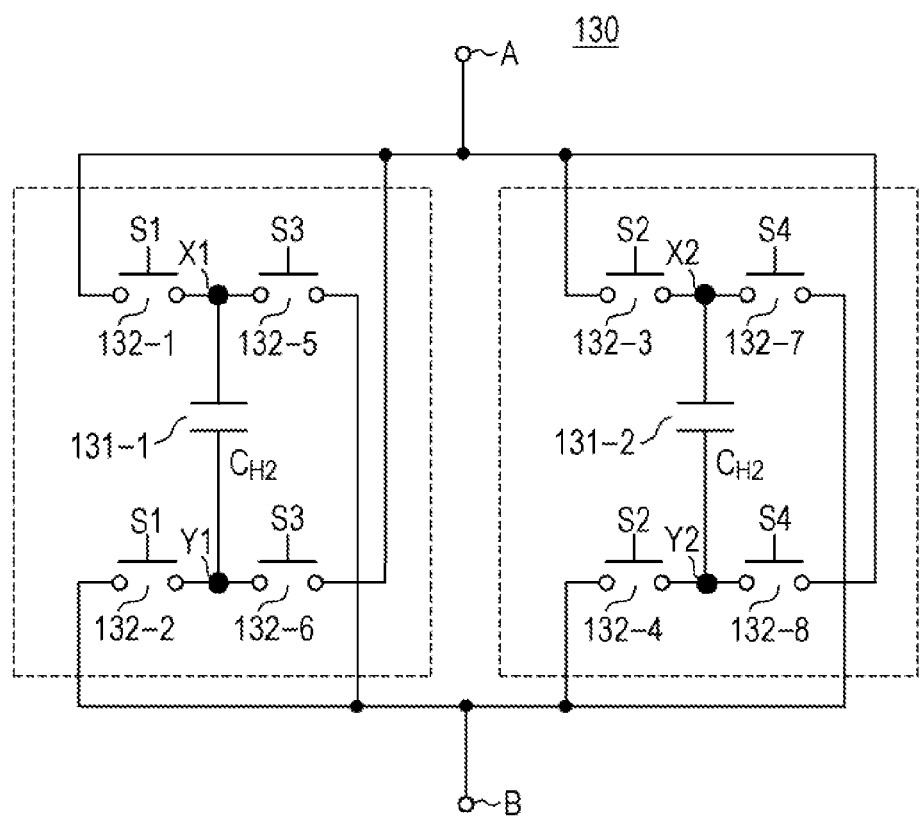
FIG. 5B is a diagram illustrating one example of the internal configuration of the charge inverting circuit according to the first embodiment.

A description will be given of a specific configuration of the charge inverting circuit 130. FIG. 5A illustrates one example of the configuration of the charge inverting circuit 130 according to the first embodiment. FIG. 5B illustrates one example of the internal configuration of the charge inverting circuit 130 according to the first embodiment. The charge inverting circuit 130 illustrated in FIG. 5B includes two capacitors 131-1 and 131-2 and eight switches 132-1 to 132-8, which control connections of the capacitors 131-1 and 131-2 to terminals A and B.

The charge inverting circuit 130 illustrated in FIG. 5A has the terminals A and B at its two opposite ends. In the discrete-time analog circuit 100 illustrated in FIG. 4, one of the terminals A and B of the charge inverting circuit 130 is connected to the output terminal $T\_TA_{out}$ of the TA 110 and the other terminal A or B is connected to ground. The following description will be given of one example of the charge inverting circuit 130 in which the terminal A thereof is connected to the output terminal $T\_TA_{out}$ of the TA 110 and the terminal B is connected to ground.

The capacitor 131-1 has terminals X1 and Y1, and the capacitor 131-2 has terminals X2 and Y2. The capacitors 131-1 and 131-2 are provided parallel to each other. The capacitance value of each of the capacitors 131-1 and 131-2 is $C_{H2}$.

The switch 132-1 controls a connection between the terminal X1 and the terminal A in accordance with the control signal S1. The switch 132-1 connects the terminal X1 and the terminal A in a period in which the control signal S1 is high and breaks the connection in a period in which the control signal S1 is low. The switch 132-2 controls a connection between the terminal Y1 and the terminal B in accordance with the control signal S1. The switch 132-2 connects the terminal Y1 and the terminal B in a period in which the control signal S1 is high and breaks the connection in a period in which the control signal S1 is low. The switch 132-3 controls a connection between the terminal X2 and the terminal A in accordance with the control signal S2. The switch 132-3 connects the terminal X2 and the terminal A in a period in which the control signal S2 is high and breaks the connection in a period in which the control signal S2 is low. The switch 132-4 controls a connection between the terminal Y2 and the terminal B in accordance with the control signal S2. The switch 132-4 connects the terminal Y2 and the terminal B in a period in which the control signal S2 is high and breaks the connection in a period in which the control signal S2 is low. The switch 132-5 controls a connection between the terminal X1 and the terminal B in accordance with the control signal S3. The switch 132-5 connects the terminal X1 and the terminal B in a period in which the control signal S3 is high and breaks the connection in a period in which the control signal S3 is low. The switch 132-6 controls a connection between the terminal Y1 and the terminal A in accordance with the control signal S3. The switch 132-6 connects the terminal Y1 and the terminal A in a period in which the control signal S3 is high and breaks the connection in a period in which the control signal S3 is low. The switch 132-7 controls a connection between the terminal X2 and the terminal B in accordance with the control signal S4. The switch 132-7 connects the terminal X2 and the terminal B in a period in which the control signal S4 is high and breaks the connection in a period in which the control signal S4 is low. The switch 132-8 controls a connection between the terminal Y2 and the terminal A in accordance with the control signal S4. The switch 132-8 connects the terminal Y2 and the terminal A in a period in which the control signal S4 is high and breaks the connection in a period in which the control signal S4 is low.

[Control Signals Generated by Clock Generating Circuit 140]

Figure 6:
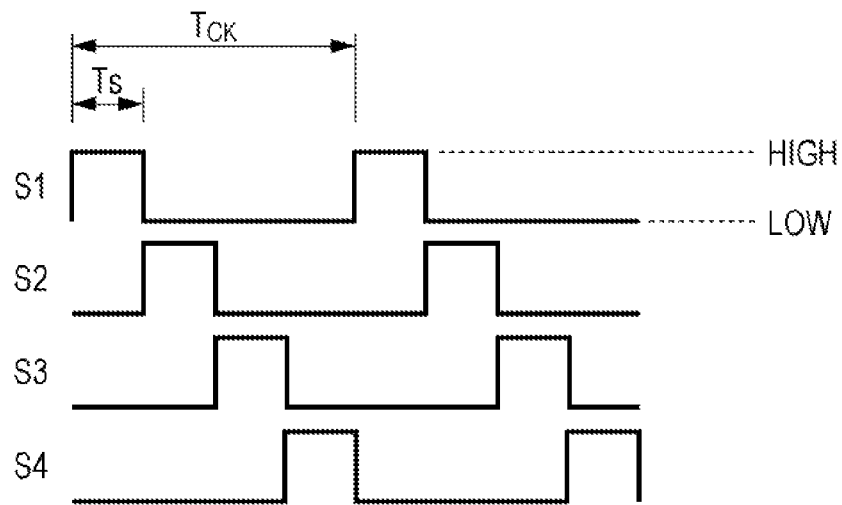
FIG. 6 is a timing chart of control signals.

A description will be given of the control signals (clock signals) generated by the clock generating circuit 140 illustrated in FIG. 4. FIG. 6 is a timing chart of the control signals. The control signals S1 to S4 have pulses with a pulse width Ts and a cycle $T_{CK}$. The pulse width Ts is the same as the interval of sampling charge. Although FIG. 6 illustrates square-wave clock signals as examples of the control signal S1 to S4, the charge inverting circuit 130 also operates with clock signals having rounded waveforms.

As illustrated in FIG. 6, the clock generating circuit 140 supplies, to the charge inverting circuit 130, the control signals S1, S2, S3, and S4 having a duty ratio (="pulse width Ts"/"control-signal cycle $T_{CK}$") of 0.25 (25%) and having four phases that are 90 degrees out of phase with each other.

[Operation of Discrete-Time Analog Circuit 100]

A description will be given of the operation of the discrete-time analog circuit 100 illustrated in FIG. 4.

The discrete-time analog circuit 100 repeatedly performs charge sharing in each sampling interval Ts to generate a sample value. The discrete-time analog circuit 100 shares the following three types of charge:

(1-a) Charge when the TA 110 converts the input voltage signal $V_{in}$ into current, that is, charge output to the output terminal T_TA$_{out}$ of the TA 110 (this charge is hereinafter referred to as "input charge")

(1-b) Charge obtained one sampling interval (Ts) earlier and held in the history capacitor 120

(1-c) Charge obtained two sampling intervals (2Ts) earlier and held by the charge inverting circuit 130

In the sharing of the above-described three types of charge, the charge inverting circuit 130 performs charge sharing through inverting the polarity of the charge obtained two sampling intervals earlier and held thereby.

Through on/off control on the switches 132-1 to 132-8 on the basis of the control signals S1 to S4 illustrated in FIG. 6, the charge inverting circuit 130 performs the following four operations in one cycle ($1T_{CK}$) and repeats the operations in each cycle $T_{CK}$.

First operation: In a period in which the control signal S1 is high, the terminal X1 of the capacitor 131-1 is connected to the terminal A, and the terminal Y1 is connected to the terminal B (this connection is hereinafter referred to as "normal-phase connection of the capacitor 131-1").

Second operation: In a period in which the control signal S2 is high, the terminal X2 of the capacitor 131-2 is connected to the terminal A, and the terminal Y2 is connected to the terminal B (this connection is hereinafter referred to as "normal-phase connection of the capacitor 131-2").

Third operation: In a period in which the control signal S3 is high, the terminal Y1 of the capacitor 131-1 is connected to the terminal A, and the terminal X1 is connected to the terminal B (this connection is hereinafter referred to as "reverse-phase connection of the capacitor 131-1").

Fourth operation: In a period in which the control signal S4 is high, the terminal Y2 of the capacitor 131-2 is connected to the terminal A, and the terminal X2 is connected to the terminal B (this connection is hereinafter referred to as "reverse-phase connection of the capacitor 131-2").

That is, in the first operation, the capacitor 131-1 has the normal-phase connection, and the capacitor 131-2 holds the charge shared by the reverse-phase connection in an immediately preceding operation. In the second operation, the capacitor 131-2 has the normal-phase connection, and the capacitor 131-1 holds the charge shared by the normal-phase connection in the first operation. In the third operation, the capacitor 131-1 has the reverse-phase connection, and the capacitor 131-2 holds the charge shared by the normal-phase connection in the second operation. In the fourth operation, the capacitor 131-2 has the reverse-phase connection, and the capacitor 131-1 holds the charge shared by the reverse-phase connection in the third operation. The above-described four operations are sequentially performed in each interval Ts.

The capacitors 131-1 and 131-2 perform an operation for inverting the polarity of held charge by reverse-phase-connecting (or normal-phase-connecting) the charge shared by the normal-phase connection (or the reverse-phase connection) and outputting the resulting charge.

That is, the charge inverting circuit 130 repeats the following operations. The capacitor 131-1 performs charge sharing by the normal-phase connection (the first operation), and inverts the polarity of the held charge and connects to the terminal A to perform charge sharing (the third operation). During the first operation and the third operation, the connections of the capacitor 131-2 to the terminals A and B are released, so that the capacitor 131-2 holds the charge shared in the immediately preceding operation. On the other hand, the capacitor 131-2 performs charge sharing by the normal-phase connection (the second operation), and inverts the polarity of the held charge and connects to the terminal B to perform charge sharing (the fourth operation). During the second operation and the fourth operation, the connections of the capacitor 131-1 to the terminals A and B are released, so that the capacitor 131-1 holds the charge shared in the immediately preceding operation.

The first to fourth operations will be mathematically described below.

Charge (input charge) $q_{in}(n)$ at time n (n is an integer) when the TA 110 converts the input voltage signal $V_{in}$ into current can be written as:

$$q_{in}(n) = g_m \int_{nT_S}^{(n+1)T_S} v_{in} e^{j\omega_{in}t} dt \quad (1)$$

$$= g_m T_S \mathrm{sinc}\left(\frac{\omega_{in}T_S}{2}\right) e^{j\omega_{in}\frac{T_S}{2}} e^{jn\omega_{in}T_S} v_{in}$$

where $\omega_{in}$ is an angular frequency of the input voltage signal.

Also, the charge sharing in the discrete-time analog circuit 100 at time n can be generally written as difference equation (2):

$$q_{in}(n) + C_{H1}v_{out}(n-1) - C_{H2}v_{out}(n-2) = (C_{H1}+C_{H2})v_{out}(n) \quad (2)$$

In equation (2), the first term on the left-hand side corresponds to the input charge, the second term is charge obtained one sampling interval earlier and held in the history capacitor 120, and the third term on the left-hand side is charge obtained two sampling intervals earlier and held in the capacitor 131-1 or 131-2. $V_{out}(n)$ is held according to a duty ratio of 1. Through a z-transform, the transfer function for the discrete-time analog circuit 100 is generally expressed by:

$$H_{LPF} = \frac{V_{out}}{V_{in}} = H_I \cdot H_H \quad (3)$$

where $H_I$, $H_H$ and z are expressed by:

$$H_I = g_m T_S \mathrm{sinc}\left(\frac{\omega_{in} T_S}{2}\right) e^{j\omega_{in}\frac{T_S}{2}} \quad (4)$$

$$H_H = \frac{\frac{1}{C_{H1} + C_{H2}}}{1 - \frac{C_{H1}}{C_{H1} + C_{H2}} z^{-1} + \frac{C_{H2}}{C_{H1} + C_{H2}} z^{-2}}$$

$$z = e^{j\omega_{in} T_S}$$

Figure 7:
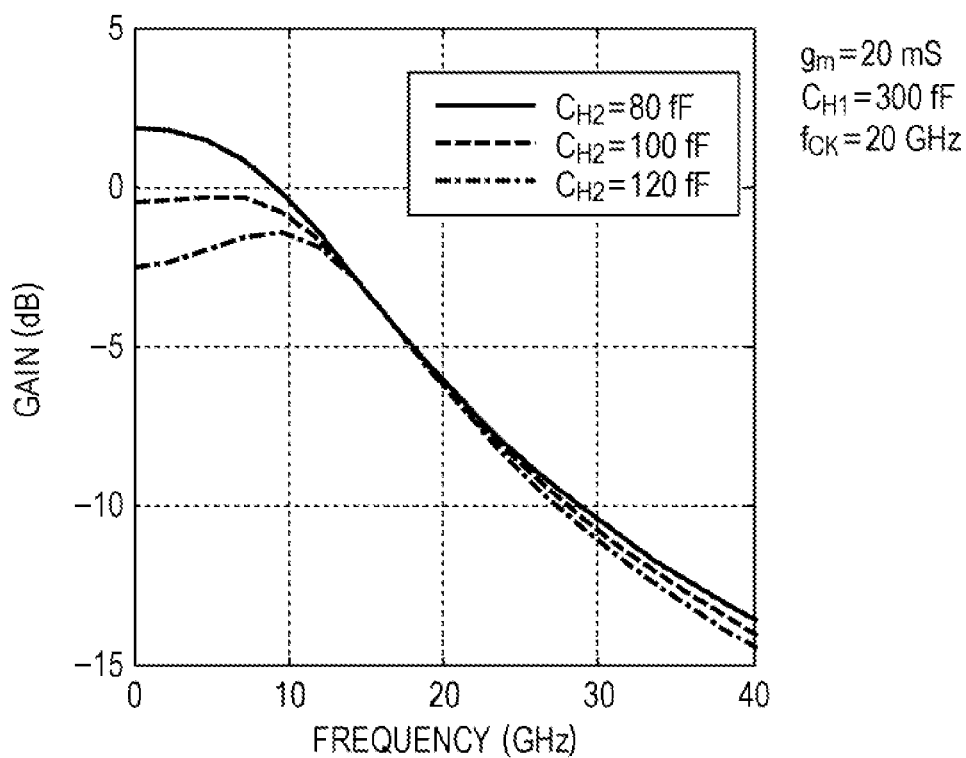
FIG. 7 is a graph illustrating a result of circuit simulation of low-frequency passing characteristics of the discrete-time analog circuit.

A description will be given of frequency characteristics of the discrete-time analog circuit 100. FIG. 7 illustrates a result of circuit simulation of low-frequency passing characteristics of the discrete-time analog circuit 100. The horizontal axis in FIG. 7 represents a frequency, and the vertical axis represents a gain. In FIG. 7, $C_{H1}$ is 300 fF, $C_{H2}$ represents low-frequency passing characteristics of the discrete-time analog circuit 100 which vary as parameters. In the discrete-time analog circuit 100, $C_{H2}$ may be fixed, and $C_{H1}$ may be variable.

As can be understood from FIG. 7, the discrete-time analog circuit 100 can pass wideband signals, and it is possible to adjust the in-band deviation (level difference) in the passband by varying $C_{H2}$ (or $C_{H1}$).

As described above, the discrete-time analog circuit in the present embodiment has the configuration illustrated in FIGS. 4 and 5B. More specifically, the TA 110, which is a voltage-current conversion circuit, includes three capacitors 120, 131-1, and 131-2 and eight switches 132-1 to 132-8, and the on/off states thereof are controlled using four kinds of clock signal (S1 to S4). Controlling the ratio of $C_{H1}$ versus $C_{H2}$ makes it possible to realize, for example, a filter that has a wideband passing characteristic as illustrated in FIG. 7 and that can adjust the in-band deviation.

That is, when an attempt is made to realize a wideband passing characteristic that exceeds a few gigahertz, the amount of influence of the parasitic capacitance of the switches increases. However, according to the present disclosure, since the number of switches can be reduced, the discrete-time analog circuit 100 allows the parasitic capacitance to be reduced. In addition, since the discrete-time analog circuit 100 allows the in-band deviation to be adjusted, the in-band deviation, including the frequency characteristics of other circuit blocks, can be reduced, and the discrete-time analog circuit 100 can also be made to function as an equalizer. Also, since gain adjustment can be performed by adjusting the values of $g_m$, $C_{H1}$, and $C_{H2}$, the discrete-time analog circuit 100 can also be used as a variable-gain amplifier (VGA). An amplifier may be connected to an input of the TA 110 to increase the gain.

The history capacitor 120 (the capacitance value $C_{H1}$) and the capacitors 131-1 and 131-2 (the capacitance values $C_{H2}$) in the discrete-time analog circuit 100 may be implemented by variable capacitors, which makes it easier to change the characteristics and makes it possible to adaptively change the characteristics with respect to influences of changes in the communication environment (e.g., the ambient temperature or the power-supply voltage) or variations in circuit elements.

Examples of the configuration of the variable capacitors include a configuration based on a method for controlling the number of capacitors connected by switches and a configuration based on a method for varying the capacitance value by controlling the value of a voltage applied to a varactor capacitor. This is also true for the embodiments described below. That is, in the known discrete-time analog circuit, when the number of capacitors that constitute variable capacitors increases, the number of switches increases, and consequently, the total amount of parasitic capacitance increases. In contrast, in the present disclosure, since the number of capacitors is smaller than that in the known discrete-time analog circuit, the total number of switches is also smaller, so that the total amount of parasitic capacitance is smaller than that in the known configuration.

The switches 132-1 to 132-8 in FIG. 5B may also be implemented by transistors. Known configurations of typical transistors when manufactured using a fine CMOS process include a configuration using an NMOS transistor, a configuration using a PMOS transistor, a configuration of a complementary switch using an NMOS and a PMOS (see, for example, Behzad Razavi, "Design of Analog CMOS Integrated Circuits, Advanced", pp. 499-515, translated by Tadahiro Kuroda).

The output terminal $T\_V_{out}$ may be monitored by a method for performing monitoring by connecting a buffer or amplifier, like a voltage-controlled voltage source (VCVS) that minimizes transfer of held charge.

The discrete-time analog circuit 100 may have a configuration in which the history capacitor 120 (the capacitance value $C_{H1}$) is omitted. In equations (4), it is possible to realize a second-order infinite impulse response (IIR) transfer function for $C_{H1}$=0. Another embodiment also has advantages that are analogous to the above-described advantages.

Second Embodiment

A description will be given of a second embodiment of the present disclosure. The second embodiment provides a circuit configuration in which the discrete-time analog circuit 100 in the first embodiment is configured to have a differential configuration.

[Configuration and Operation of Discrete-Time Analog Circuit 200]

FIG. 8 illustrates one example of the configuration of a major portion of a discrete-time analog circuit 200 according to the second embodiment. The discrete-time analog circuit 200 illustrated in FIG. 8 includes a TA 210, a history capacitor 220, a charge inverting circuit 230, and a clock generating circuit 240.

Unlike the discrete-time analog circuit 100 illustrated in FIG. 4, the discrete-time analog circuit 200 is a differential-type discrete-time analog circuit to which input voltage signals $V_{in}$ having two types of phase, that is, a normal phase and a reverse phase, are input.

The TA 210 is a voltage-current conversion circuit. Upon input of the input voltage signals $V_{in}$ having two types of phase, that is, the normal phase and the reverse phase, the TA 210 converts the input voltage signals $V_{in}$ into currents ($g_m \times V_{in}$) and outputs currents having two types of phase, that is, the normal phase and the reverse phase.

The history capacitor 220 is connected between a normal-phase output terminal T_TA$_{out1}$ of the TA 210 and a reverse-phase output terminal T_TA$_{out2}$ thereof. The capacitance value of the history capacitor 220 is C$_{H1}$.

The charge inverting circuit 230 has a configuration that is substantially the same as the charge inverting circuit 130 illustrated in FIG. 5B. A terminal A of the charge inverting circuit 230 is connected to the normal-phase output terminal T_TA$_{out1}$ of the TA 210, and a terminal B is connected to the reverse-phase output terminal T_TA$_{out2}$ of the TA 210.

The clock generating circuit 240 has a configuration that is substantially the same as the clock generating circuit 140 illustrated in FIG. 4 and supplies clock signals (control signals) that are the same as or similar to those illustrated in FIG. 6 to the charge inverting circuit 230.

The discrete-time analog circuit 200 has a configuration in which the connection to ground in the discrete-time analog circuit 100 is replaced with a connection to the reverse-phase output terminal T_TA$_{out2}$ of the TA 210. The discrete-time analog circuit 200 performs an operation that is similar to the operation of the discrete-time analog circuit 100 described above in the first embodiment.

Transfer functions for the discrete-time analog circuit 200 are analogous to the transfer functions for the discrete-time analog circuit 100 which were given in equations (3) and (4), thus making it possible to realize frequency characteristics that are similar to those illustrated in FIG. 7. In addition, since the discrete-time analog circuit 200 has the differential configuration, even-order components can be removed after differential combination.

As described above, according to the present embodiment, since the configuration in the first embodiment is transformed into the differential configuration, it is possible to realize frequency characteristics that are similar to those in the first embodiment, and it is further possible to remove even-order components after differential combination.

Although the configuration in which one capacitor 220 is connected between the normal-phase output terminal T_TA$_{out1}$ and the reverse-phase output terminal T_TA$_{out2}$ of the TA 210 has been described in the present embodiment, two capacitor may be respectively connected to the normal-phase output terminal T_TA$_{out1}$ and the reverse-phase output terminal T_TA$_{out2}$ of the TA 210. Although the value of one capacitor connected to the normal-phase output terminal T_TA$_{out1}$ of the TA 210 and the value of one capacitor connected to the reverse-phase output terminal T_TA$_{out2}$ are basically the same, they may be different from each other in order to enhance the degree of freedom of the characteristics.

Third Embodiment

Next, a description will be given of a third embodiment of the present disclosure. A discrete-time analog circuit in the third embodiment has a configuration in which the discrete-time analog circuits 100 in the first embodiment are connected in a cascade to achieve higher order filter characteristics.

[Configuration and Operation of Multistage Discrete-Time Analog Circuit 300]

Figure 9A:
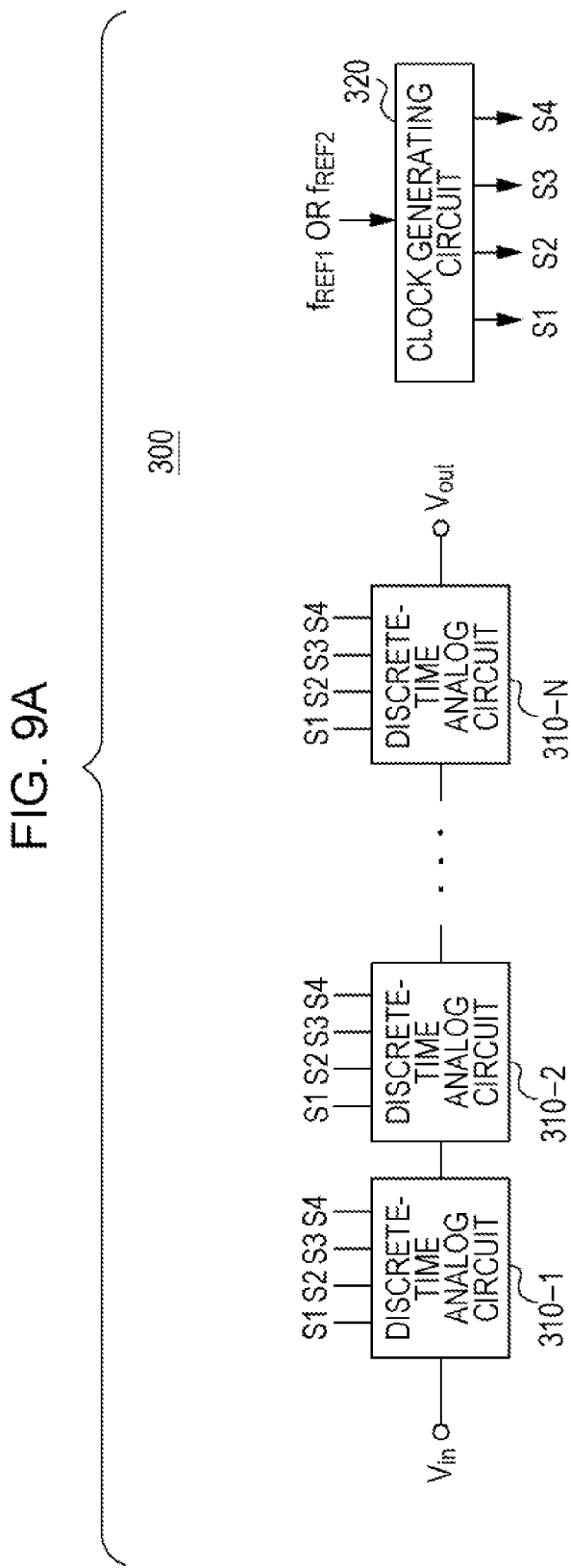
FIG. 9A is a diagram illustrating one example of the configuration of a multistage discrete-time analog circuit according to a third embodiment.

FIG. 9A is a diagram illustrating one example of the configuration of a multistage discrete-time analog circuit 300 according to the third embodiment. FIG. 9B is a diagram illustrating one example of the internal configuration of the multistage discrete-time analog circuit 300 according to the third embodiment. The multistage discrete-time analog circuit 300 illustrated in FIG. 9A has a configuration including a clock generating circuit 320 and N discrete-time analog circuits (310-1 to 310-N) connected in a cascade.

A discrete-time analog circuit 310 illustrated in FIG. 9B has a configuration that is the same as or similar to that of the discrete-time analog circuit 100 illustrated in FIG. 4, and a TA 311 and a history capacitor 312 illustrated in FIG. 9B are respectively the same as or similar to the TA 110 and the history capacitor 120 illustrated in FIG. 4.

The configuration of a charge inverting circuit 313 illustrated in FIG. 9B is the same as or similar to the configuration of the charge inverting circuit 130 illustrated in FIGS. 4 and 5B.

The clock generating circuit 320 illustrated in FIG. 9B is the same as or similar to the clock generating circuit 140 illustrated in FIG. 4 and supplies clocks (control signals) that are the same as or similar to those illustrated in FIG. 6 to the N discrete-time analog circuits 310-1 to 310-N.

Each discrete-time analog circuit 310 performs an operation that is the same as or similar to the operation of the discrete-time analog circuit 100 described above in the first embodiment. Transfer functions for the discrete-time analog circuit 310 are analogous to the transfer functions for the discrete-time analog circuit 100 which were given by equations (3) and (4).

Since the multistage discrete-time analog circuit 300 has a configuration in which the N discrete-time analog circuits 310 are connected in a cascade, the transfer functions for the multistage discrete-time analog circuit 300 are generally given as:

$$H_{LPF\_N} = \prod_{k=1}^{k=N} (H_{1k} \cdot H_{Hk}) \tag{5}$$

$$H_{1k} = g_{mk} T_S \text{sinc}\left(\frac{\omega_{in}T_S}{2}\right) e^{j\omega_{in}\frac{T_S}{2}}$$

$$H_{Hk} = \frac{\frac{1}{C_{H1k} + C_{H2k}}}{1 - \frac{C_{H1k}}{C_{H1k} + C_{H2k}}z^{-1} + \frac{C_{H2k}}{C_{H1k} + C_{H2k}}z^{-2}}$$

$$z = e^{j\omega_{in}T_S}$$

In this case, $g_{mk}$, $C_{H1k}$, and $C_{H2k}$ are $g_m$, $C_{H1}$, and $C_{H2}$ of the discrete-time analog circuit 310-$k$ at the kth stage (N is a natural number, and k is an integer of 1 to N), and $H_{Ik}$ and $H_{Hk}$ are transfer functions for the discrete-time analog circuit 310-$k$ at the kth stage. The values of $g_m$, $C_{H1}$, and $C_{H2}$ may be appropriately changed for each stage.

Equation (6) below is a result obtained by changing $g_{mk}$, $C_{H1k}$, and $C_{H2k}$ in equation (5) at the individual stages to the same values.

$$H_{LPF\_N} = (H_1 \cdot H_H)^N \tag{6}$$

Figure 10:
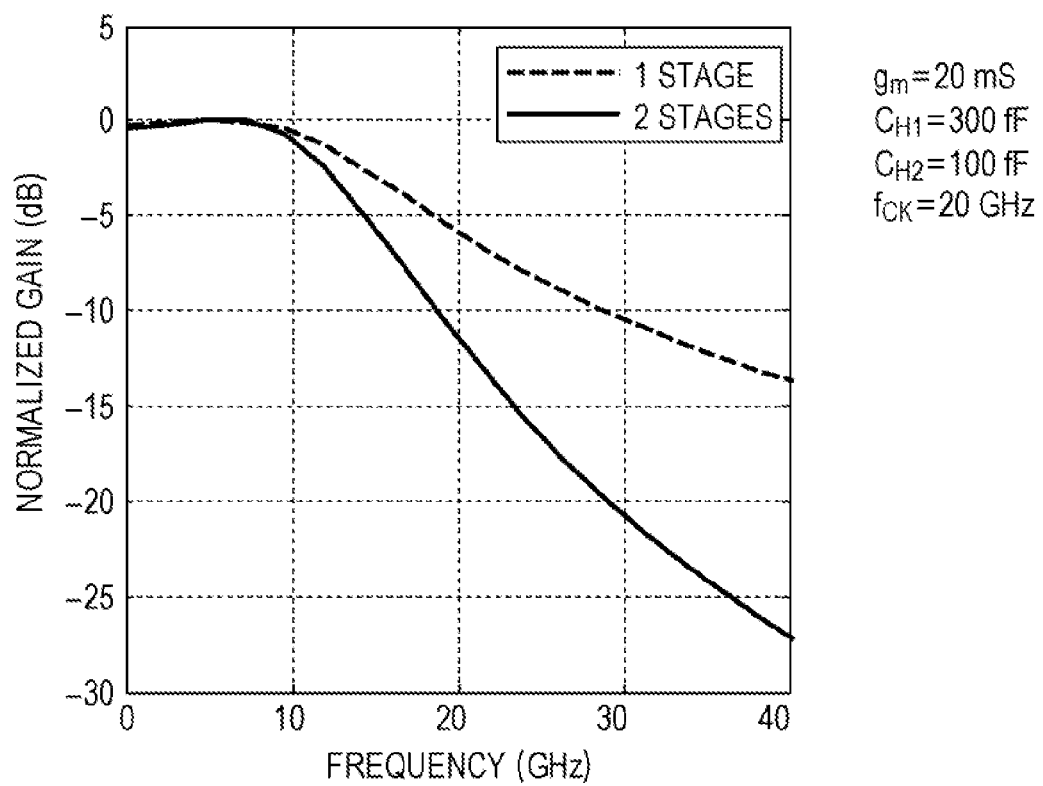
FIG. 10 is a graph illustrating a result of circuit simulation of low-frequency passing characteristics of the multistage discrete-time analog circuit.

A description will be given of frequency characteristics of the multistage discrete-time analog circuit 300. FIG. 10 is a graph illustrating a result of circuit simulation of low-frequency passing characteristics of the multistage discrete-time analog circuit 300. The horizontal axis in FIG. 10 represents a frequency, and the vertical axis represents a normalized gain. FIG. 10 illustrates a low-frequency passing characteristic when the number of stages connected in the cascade is 1 (i.e., one stage) and a low-frequency passing characteristic when the number of stages connected in the cascade is 2 (i.e., two stages).

As illustrated in FIG. 10, the multistage discrete-time analog circuit 300 can realize a steeper filter characteristic, as the number of stages connected in the cascade is increased.

As described above, according to the present embodiment, the configuration in which the discrete-time analog circuits described in the first embodiment are connected in a cascade makes it possible to realize a steep filter characteristic. As described above in the first embodiment, since each discrete-time analog circuit 310 has a small size and a simple configuration, it is possible to reduce the number of switches and the number of capacitors even when the number of stages is increased for higher-order filter characteristics.

The capacitance values of the capacitors included in the N discrete-time analog circuits 310-1 to 310-N may all be the same or may be different from each other.

Fourth Embodiment

A description will be given of a fourth embodiment of the present disclosure. The fourth embodiment provides a circuit configuration in which the multistage discrete-time analog circuit 300 in the third embodiment is configured to have a differential configuration.

[Configuration and Operation of Multistage Discrete-Time Analog Circuit 400]

Figure 11A:
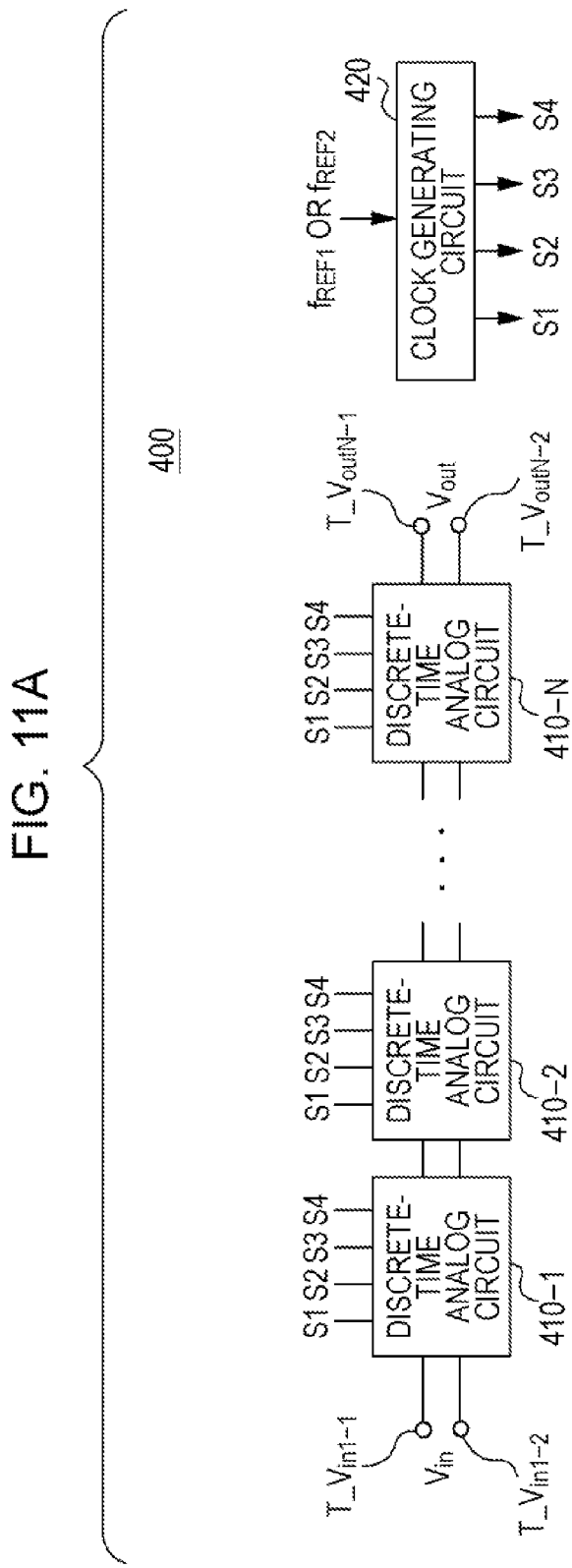
FIG. 11A is a diagram illustrating one example of the configuration of a multistage discrete-time analog circuit according to a fourth embodiment.
Figure 11B:
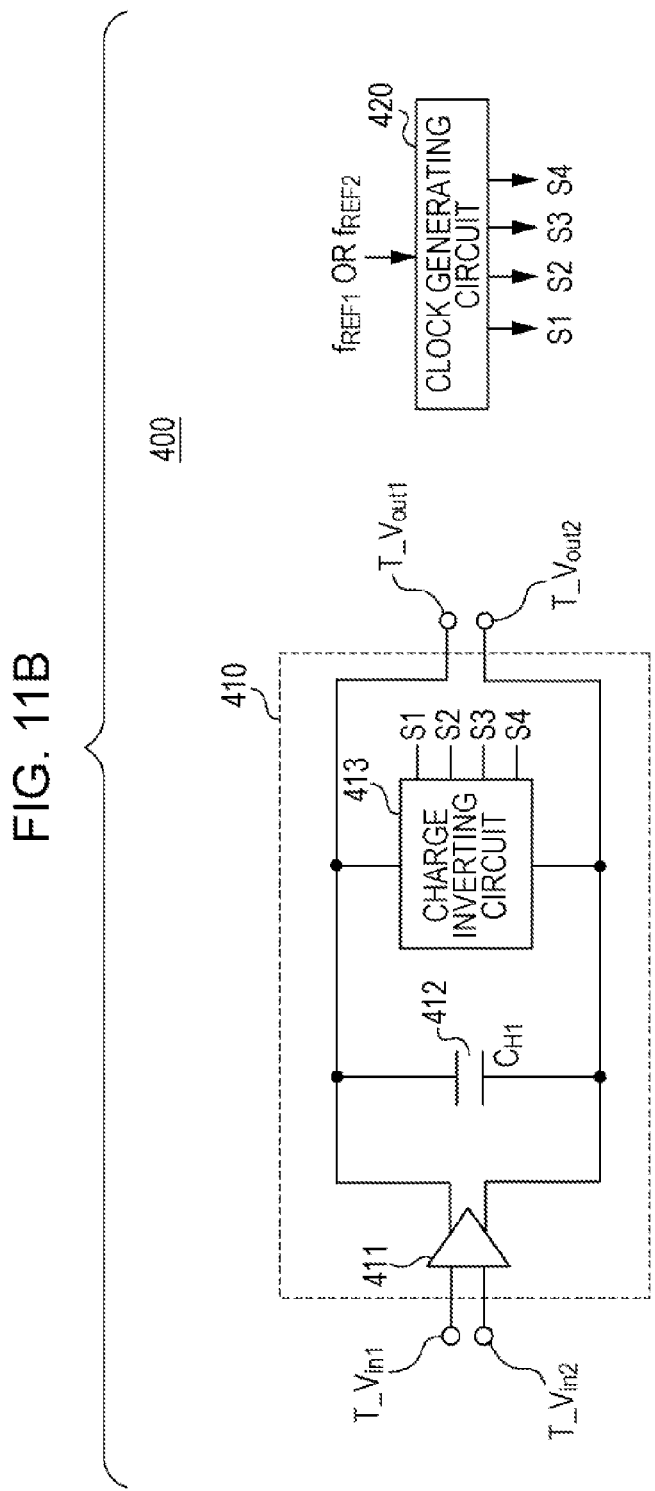
FIG. 11B is a diagram illustrating one example of the internal configuration of the multistage discrete-time analog circuit according to the fourth embodiment.

FIG. 11A is a diagram illustrating one example of the configuration of a multistage discrete-time analog circuit 400 according to the fourth embodiment. FIG. 11B is a diagram illustrating one example of the internal configuration of the multistage discrete-time analog circuit 400 according to the fourth embodiment. The multistage discrete-time analog circuit 400 illustrated in FIG. 11A has a configuration including a clock generating circuit 420 and N discrete-time analog circuits (410-1 to 410-N) connected in a cascade.

A discrete-time analog circuit 410 illustrated in FIG. 11B has a configuration that is the same as or similar to that of the discrete-time analog circuit 200 illustrated in FIG. 8, and a TA 411 and a history capacitor 412 illustrated in FIG. 11B are respectively the same as or similar to the TA 210 and the history capacitor 220 illustrated in FIG. 8.

A charge inverting circuit 413 illustrated in FIG. 11B has a configuration that is the same as or similar to that of the charge inverting circuit 130 illustrated in FIGS. 4 and 5B.

The clock generating circuit 420 illustrated in FIG. 11B is also the same as or similar to the clock generating circuit 140 illustrated in FIG. 4 and supplies clock signals (control signals) that are the same as or similar to those illustrated in FIG. 6 to the N discrete-time analog circuit 410-1 to 410-N.

The multistage discrete-time analog circuit 400 illustrated in FIG. 11B has a configuration in which the connection to ground in the multistage discrete-time analog circuit 300 in FIG. 9B is replaced with a connection to a reverse-phase output terminal T_TA$_{out2}$ of the TA 411. The multistage discrete-time analog circuit 400 performs an operation that is the same as or similar to that of the multistage discrete-time analog circuit 300 described above in the third embodiment. Transfer functions for the multistage discrete-time analog circuit 400 are analogous to the transfer functions for the multistage discrete-time analog circuit 300 which were given by equations (5) and can realize frequency characteristics that are the same as or similar to those illustrated in FIG. 10. In addition, since the multistage discrete-time analog circuit 400 has the differential configuration, even-order components can be removed after differential combination.

As described above, according to the present embodiment, the configuration in which the differential-type discrete-time analog circuits are connected in a cascade can realize a steep filter characteristic. In addition, after differential combination, it is possible to remove even-order components.

Fifth Embodiment

Next, a description will be given of a fifth embodiment of the present disclosure. In the present embodiment, a switch is added to the discrete-time analog circuit 100 described in the first embodiment and is used as a wideband mixer in a receiving device.

[Configuration of Receiving Device]

Figure 12:
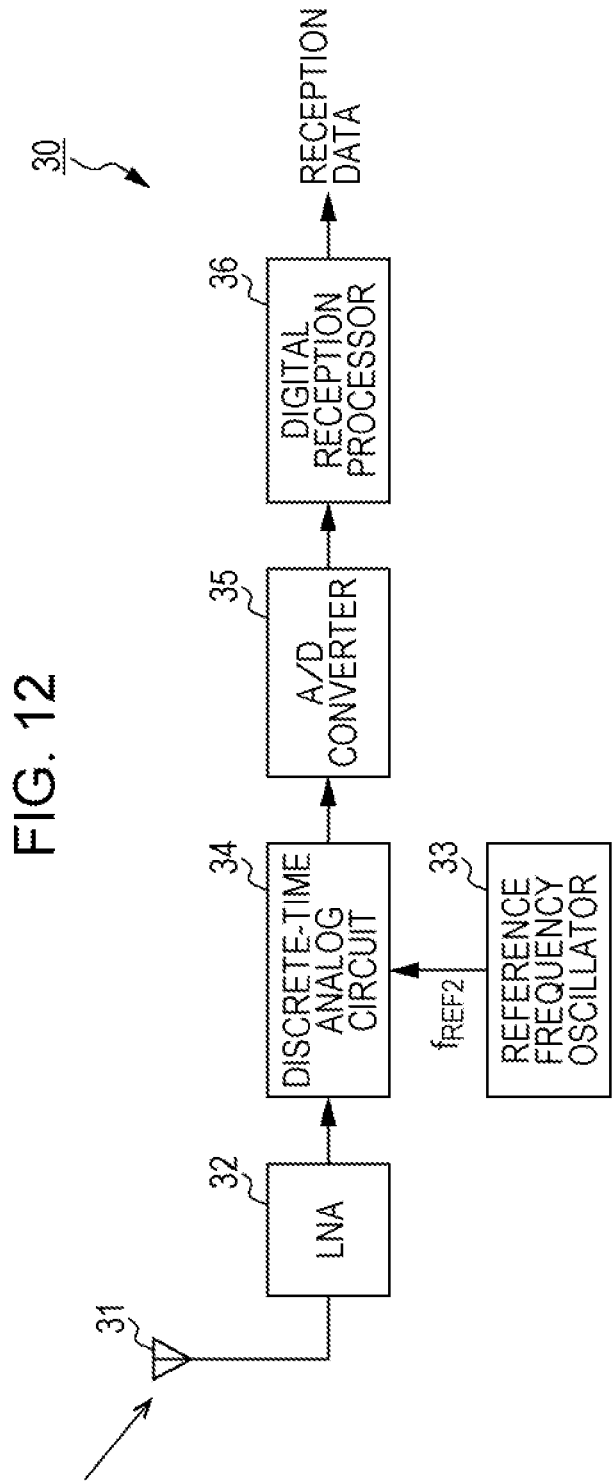
FIG. 12 is a diagram illustrating a schematic configuration of a receiving device according to a fifth embodiment.

FIG. 12 is a block diagram illustrating the configuration of a receiving device 30 according to the fifth embodiment. The receiving device 30 illustrated in FIG. 12 includes an antenna 31, a low-noise amplifier (LNA) 32, a reference frequency oscillator 33, a discrete-time analog circuit 34, an A/D converter 35, and a digital reception processor 36.

The receiving device 30 illustrated in FIG. 12 has a configuration in which the reception mixer 25 and the local frequency oscillator 24 are eliminated from the receiving device 20 illustrated in FIG. 3B. The discrete-time analog circuit 34 in the receiving device 30 has the functions of the discrete-time analog circuit 26, the reception mixer 25, and the local frequency oscillator 24 in the receiving device 20.

Since the antenna 31, the low-noise amplifier 32, the reference frequency oscillator 33, the A/D converter 35, and the digital reception processor 36 in the receiving device 30 in FIG. 12 are the same as or similar to the antenna 21, the low-noise amplifier 22, the reference frequency oscillator 23, the A/D converter 27, and the digital reception processor 28 in the receiving device 20 in FIG. 3B, descriptions thereof are not given hereinafter.

The discrete-time analog circuit 34 performs frequency conversion and filtering on analog reception signals having a radio frequency, the signals being output from the low-noise amplifier 32.

The receiving device 30 illustrated in FIG. 12 has been described above as having a direct conversion configuration. The present disclosure, however, is not limited to this configuration and may employ a configuration based on a system using an intermediate frequency (IF) by further adding one or more mixers to the receiving device 30. The discrete-time analog circuit 34 may be used as any of a mixer for an RF and an IF and a mixer for an IF and a baseband. When a plurality of IFs are used, the discrete-time analog circuit 34 may also be used as a mixer for different intermediate frequencies.

[Configuration of Discrete-Time Analog Circuit 500]

A description will be given of the configuration of a major portion of a discrete-time analog circuit 500.

Figure 13:
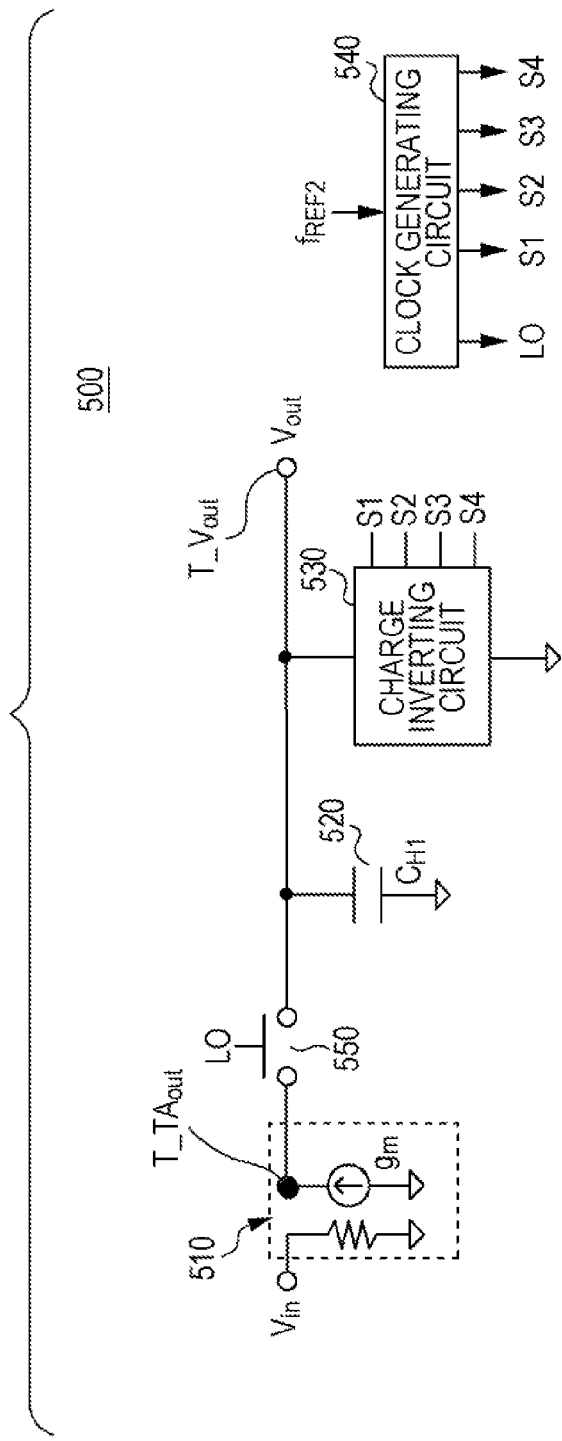
FIG. 13 is a diagram illustrating one example of the configuration of a major portion of a discrete-time analog circuit according to the fifth embodiment.

FIG. 13 is a diagram illustrating one example of the configuration of the discrete-time analog circuit 500 according to the fifth embodiment. The discrete-time analog circuit 500 illustrated in FIG. 13 corresponds to the discrete-time analog circuit 34 included in the receiving device 30 illustrated in FIG. 12. Upon input of analog signals having a radio frequency, the discrete-time analog circuit 500 performs frequency conversion processing and filtering processing on the analog reception signals having a radio frequency.

The discrete-time analog circuit 500 illustrated in FIG. 13 includes a TA 510, a history capacitor 520, a charge inverting circuit 530, a clock generating circuit 540, and a switch 550.

The discrete-time analog circuit 500 has a configuration in which the switch 550 is added to the discrete-time analog circuit 100 illustrated in FIG. 4. The clock generating circuit 540 also has a configuration in which a function for supplying a control signal LO is added to the clock generating circuit 140 in FIG. 4.

The TA 510 is the same as or similar to the TA 110 illustrated in FIG. 4, and an output terminal T_TA$_{out}$ of the TA 510 is connected to one end of the switch 550.

The history capacitor 520 is the same as or similar to the history capacitor 120 illustrated in FIG. 4 and is connected to the output terminal T_TA$_{out}$ of the TA 510 via the switch 550.

The charge inverting circuit 530 has a configuration that is the same as or similar to that of the charge inverting circuit 130 illustrated in FIGS. 4 and 5B and is connected to the output terminal T_TA$_{out}$ of the TA 510 via the switch 550.

The switch 550 connects the TA 510, the history capacitor 520, and the charge inverting circuit 530 in a period in which the control signal LO is high and breaks the connection in a period in which the control signal LO is low.

The clock generating circuit 540 generates clocks S1 to S4 (control signals) on the basis of a reference frequency signal f$_{REF2}$ output from the reference frequency oscillator 33 (see FIG. 12) and supplies the clocks S1 to S4 (control signals) to the charge inverting circuit 530. The clock generating circuit 540 also generates the clock LO (control signal) on the basis of the reference frequency signal f$_{REF2}$ and supplies the clock LO (control signal) to the switch 550. A reference frequency for the clocks S1 to S4 and a reference frequency for the clock LO may be the same, or different frequencies may be supplied from the reference frequency oscillator 33 separately from the reference frequency signal f$_{REF2}$.

[Control Signals Generated by Clock Generating Circuit 540]

Figure 14:
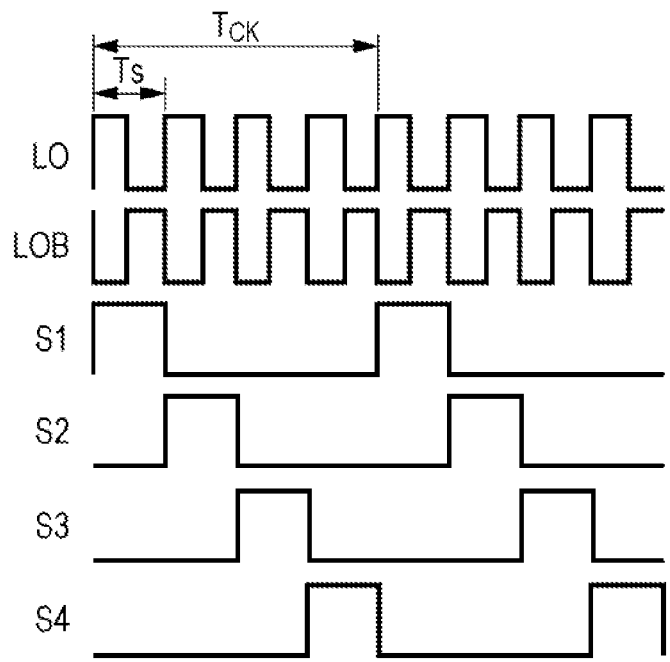
FIG. 14 is a timing chart of control signals.

A specific description will be given of control signals generated by the clock generating circuit 540. FIG. 14 is a timing chart of control signals. The control signals S1 to S4 have pulses with a pulse width Ts and a cycle T$_{CK}$. The pulse width Ts is the same as the sampling interval. Although FIG. 14 illustrates square-wave clock signals, the charge inverting circuit 530 also operates with clock signals having rounded waveforms.

As illustrated in FIG. 14, the clock generating circuit 540 supplies, to the charge inverting circuit 530, control signals S1, S2, S3, and, S4 having a duty ratio (="pulse width Ts"/"control-signal cycle T$_{CK}$") of 0.25 (25%) and having four phases that are 90 degrees out of phase with each other.

Also, the clock generating circuit 540 further supplies control signals LO and LOB having a cycle Ts and a duty ratio of 0.5 and having two phases that are 180 degrees out of phase with each other. More specifically, in the present embodiment, the clock generating circuit 540 supplies the control signal LO to the switch 550. A variation of the present embodiment which uses the control signal LOB is described later.

[Operation of Discrete-Time Analog Circuit 500]

A description will be given of the operation of the discrete-time analog circuit 500.

The discrete-time analog circuit 500 repeats charge sharing in each sampling interval Ts to generate sampling values. More specifically, the discrete-time analog circuit 500 shares the following three types of charge.

(5-a) Charge obtained when the TA 510 converts the input voltage signal V$_{in}$ into current, that is, charge output from the output terminal T_TA$_{out}$ of the TA 510 via the switch 550 (this charge is hereinafter referred to as "input charge")

(5-b) Charge obtained one sampling interval earlier and held in the history capacitor 520

(5-c) Charge obtained two sampling intervals earlier and held by the charge inverting circuit 530

In the sharing of the three types of charge, the charge inverting circuit 530 establishes connection through inversion of the polarity of the charge obtained two sampling intervals earlier and held thereby. The operation of the charge inverting circuit 530 is the same as or similar to the operation of the charge inverting circuit 130 described above in the first embodiment.

The discrete-time analog circuit 500 in FIG. 13 differs from the discrete-time analog circuit 100 in FIG. 4 in that the discrete-time analog circuit 500 has the switch 550 to which the control signal LO is input. The switch 550 is turned on in a period Ts/2 in the sampling interval Ts to generate an input charge using current integration. The switch 550 shifts the notch of one or more sinc functions using the current integration from an integer multiple m×fs of the sampling frequency to 2m×fs, so that a signal having a frequency in the vicinity of (2m'+1)×fs is frequency-converted into a signal having a frequency in the vicinity of a direct current (DC) (m is an integer other than 0, and m' is an integer). In this case, mixing of fundamentals corresponds to frequency-converting a signal in the vicinity of fs into a signal in the vicinity of DC.

Charge (input charge) at time n when the TA 510 converts the input voltage signal V$_{in}$ into current and outputs the current via the switch 550 can be written as:

$$q_{in}(n) = g_m \int_{nT_S}^{(n+\frac{1}{2})T_S} v_{in} e^{j\omega_{in}t} dt \qquad (7)$$

$$= \frac{g_m T_S}{2} \text{sinc}\left(\frac{\omega_{in} T_S}{4}\right) e^{j\omega_{in}\frac{T_S}{4}} e^{jn\omega_{in}T_S} v_{in}$$

where $\omega_{in}$ is an angular frequency of the input voltage signal. An integration portion in equation (7) differs from the integration portion in equation (1) described above in the first embodiment. This is because the switch 550 is turned on in a period Ts/2 and the input charge using the current integration is generated.

The charge sharing at time n in the discrete-time analog circuit 500 is analogous to that in the difference equation in equation (2).

On the basis of equations (7) and (2), a transfer function for the discrete-time analog circuit 500 can generally be written as:

$$H_{MIX} = H_{I\_MIX} \cdot H_H \cdot \frac{U_1(\omega_{in} - k\omega_S)}{T_S} \qquad (8)$$

where H$_{I\_MIX}$, H$_H$, z, and U$_1(\omega)$ are given by:

$$H_{I\_MIX} = \frac{g_m T_S}{2} \text{sinc}\left(\frac{\omega_{in} T_S}{4}\right) e^{j\omega_{in}\frac{T_S}{4}} \qquad (9)$$

$$H_H = \frac{\frac{1}{C_{H1} + C_{H2}}}{1 - \frac{C_{H1}}{C_{H1} + C_{H2}} z^{-1} + \frac{C_{H2}}{C_{H1} + C_{H2}} z^{-2}}$$

$$z = e^{j\omega_{in}T_S}$$

$$U_1(\omega) = T_S \text{sinc}\left(\frac{\pi\omega}{\omega_S}\right) e^{-j\omega\frac{T_S}{2}}$$

Figure 15:
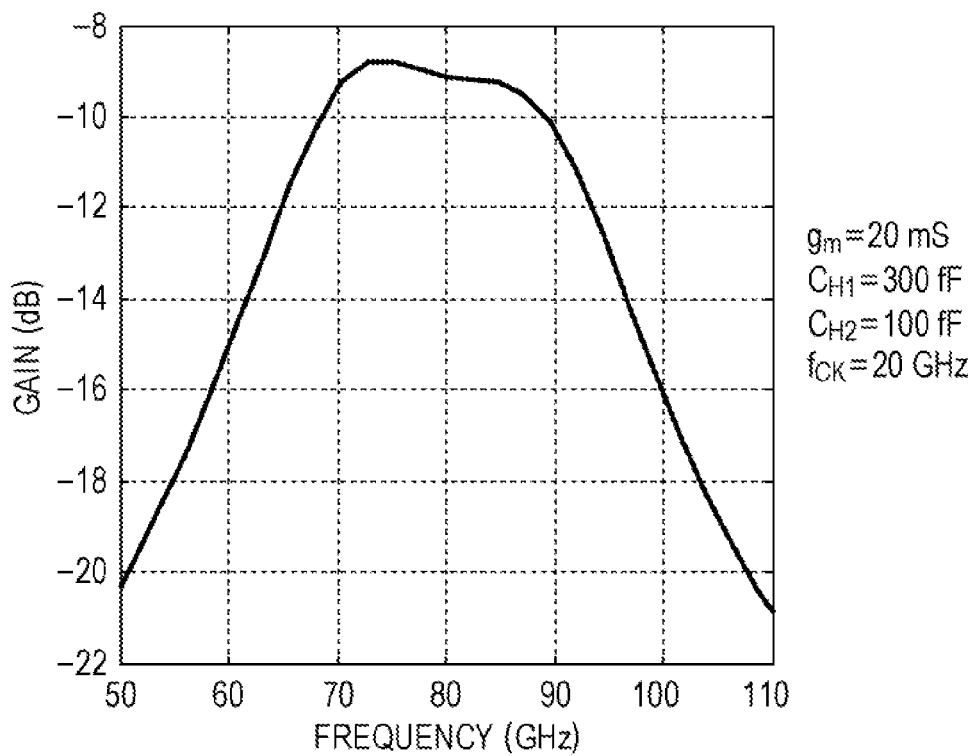
FIG. 15 is a graph illustrating a result of circuit simulation of frequency characteristics of the discrete-time analog circuit.

A description will be given of frequency characteristics of the discrete-time analog circuit 500. FIG. 15 is a graph illustrating a result of circuit simulation of frequency characteristics of the discrete-time analog circuit 500. FIG. 15 illustrates one example of frequency characteristics for sampling frequency f$_s$=80 GHz and fundamental mixing (k=−1, 1). The horizontal axis in FIG. 15 represents a frequency $f_{in}$ of the input voltage signal $V_{in}$, and the vertical axis represents a gain of conversion to $f_{in}-f_s$.

As illustrated in FIG. 15, the discrete-time analog circuit 500 can obtain a wideband passing characteristic of 20 GHz or more with respect to a gain of −10 dB.

As described above, according to the present embodiment, the discrete-time analog circuit 500 having the simple configuration illustrated in FIG. 13 can frequency-convert an analog signal having a radio frequency into a baseband signal and can obtain a wideband passing characteristic of 20 GHz or more, like that illustrated in FIG. 15.

Although the discrete-time analog circuit 500 illustrated in FIG. 13 has the single-ended mixer configuration in which one switch 550 is provided for the output terminal $T\_TA_{out}$ of the TA 510, various configurations are possible in the present embodiment.

[Configuration of Single-Balanced Mixer]

Figure 16:
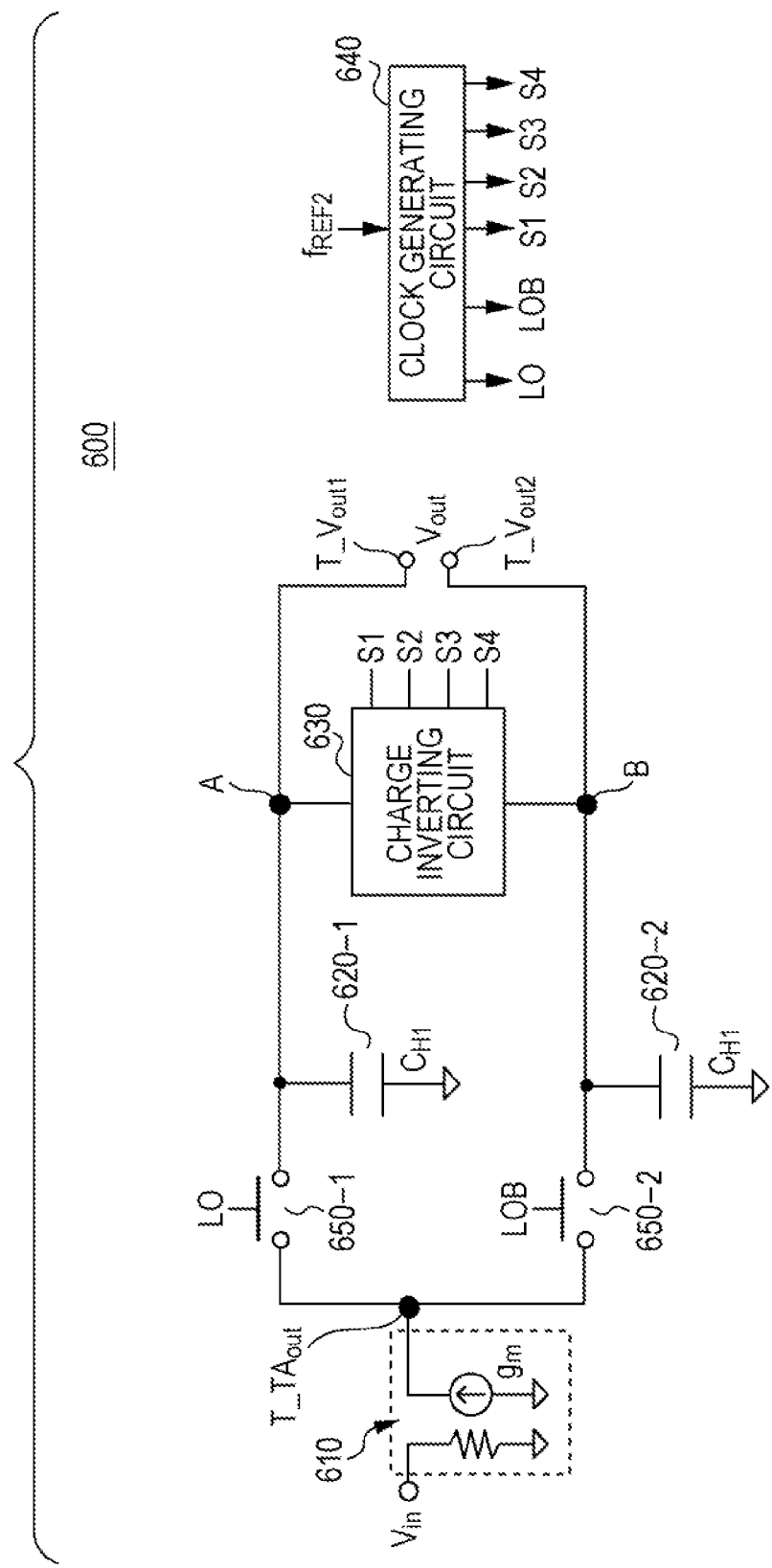
FIG. 16 is a diagram illustrating one example of the configuration of a discrete-time analog circuit using a single-balanced mixer.

FIG. 16 is a diagram illustrating one example of the configuration of a discrete-time analog circuit 600 using a single-balanced mixer. The discrete-time analog circuit 600 illustrated in FIG. 16 includes a TA 610, history capacitors 620-1 and 620-2, a charge inverting circuit 630, a clock generating circuit 640, and switches 650-1 and 650-2.

In the discrete-time analog circuit 600 illustrated in FIG. 16, an output terminal $T\_TA_{out}$ of the TA 610 is branched to two output terminals $T\_V_{out1}$, $T\_V_{out2}$, the switches 650-1 and 650-2 are connected in parallel with the output terminals $T\_V_{out1}$ and $T\_V_{out2}$, and the history capacitors 620-1 and 620-2, which are connected to ground, are connected between the switches 650-1 and 650-2 and the output terminals $T\_V_{out1}$ and $T\_V_{out2}$, respectively. In the discrete-time analog circuit 600, the switch 650-1, the output terminal $T\_V_{out1}$, and a terminal A of the charge inverting circuit 630 are connected, and the switch 650-2, the output terminal $T\_V_{out2}$, and a terminal B of the charge inverting circuit 630 are connected.

The TA 610 is the same as or similar to the TA 110 illustrated in FIG. 4, and each of the history capacitors 620-1 and 620-2 is the same as or similar to the history capacitor 120 illustrated in FIG. 4. The charge inverting circuit 630 is the same as or similar to the charge inverting circuit 130 illustrated in FIGS. 4 and 5B.

Similarly to the switch 550 illustrated in FIG. 13, the switch 650-1 connects the output terminal $T\_TA_{out}$ of the TA 610, the history capacitor 620, and the charge inverting circuit 630 in a period in which the control signal LO is high and breaks the connection in a period in which the control signal LO is low. The switch 650-2 connects the output terminal $T\_TA_{out}$ of the TA 610, the history capacitor 620, and the charge inverting circuit 630 in a period in which the control signal LOB illustrated in FIG. 14 is high and breaks the connection in a period in which the control signal LOB is low.

The clock generating circuit 640 in FIG. 16 has a configuration that is the same as or similar to that of the clock generating circuit 540 in FIG. 13 and supplies the control signals described above with reference to FIG. 14. The clock generating circuit 640 supplies the control signals S1, S2, S3, and S4 to the charge inverting circuit 630, supplies the control signal LO to the switch 650-1, and supplies the control signal LOB to the switch 650-2.

Since the control signals LO and LOB are 180 degrees out of phase with each other, each of the periods in which the switches 650-1 and 650-2 are turned on is Ts/2 in the interval Ts.

In the discrete-time analog circuit 600 illustrated in FIG. 16, on and off states of each of the switches 650-1 and 650-2 are controlled based on the corresponding control signals LO and LOB that are 180 degrees out of phase with each other, to thereby implement a single-balanced mixer.

[Configuration of Double-Balanced Mixer]

Figure 17:
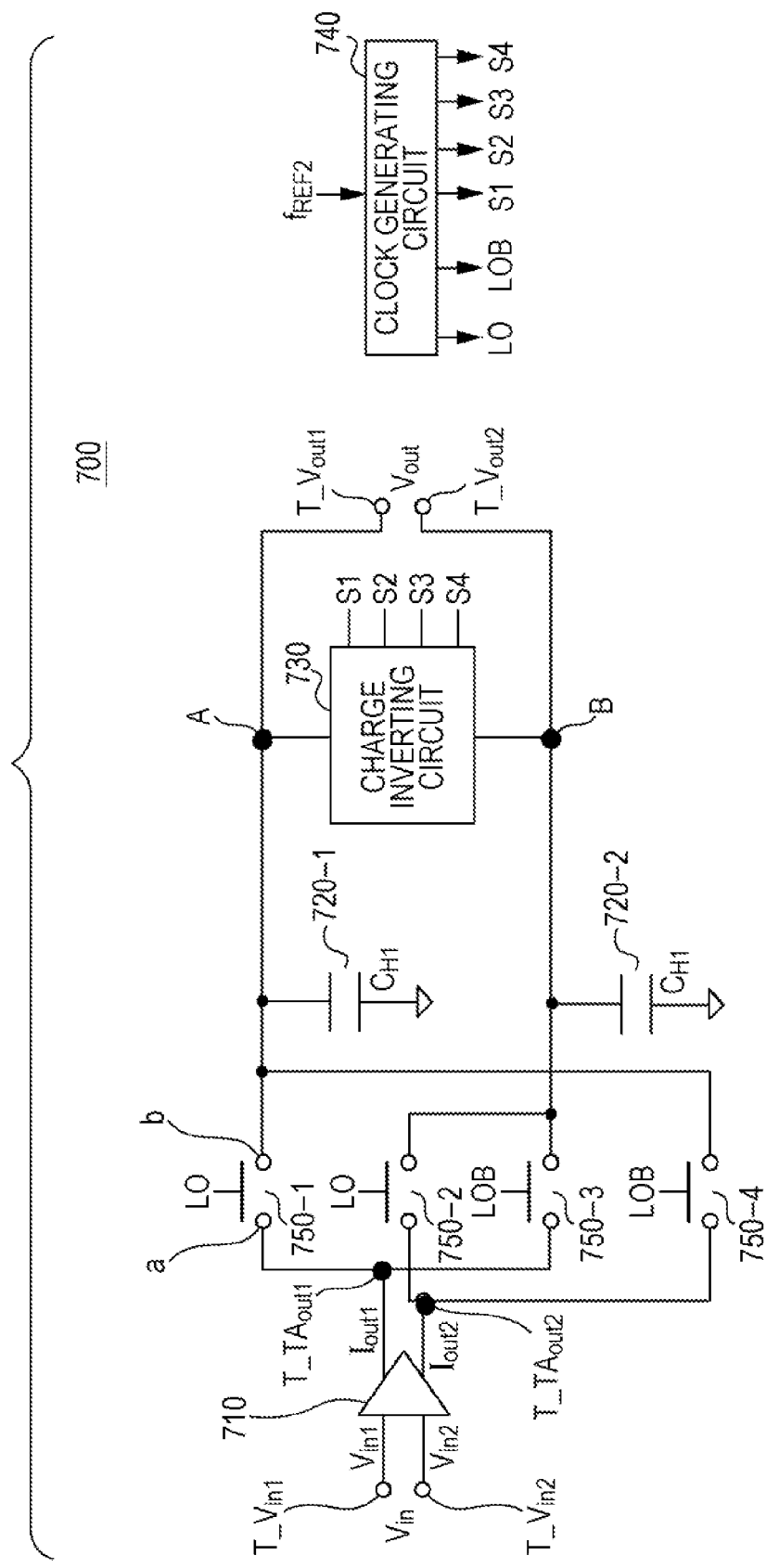
FIG. 17 is a diagram illustrating one example of the configuration of a discrete-time analog circuit using a double-balanced mixer.

FIG. 17 is a diagram illustrating one example of the configuration of a discrete-time analog circuit 700 using a double-balanced mixer. The discrete-time analog circuit 700 illustrated in FIG. 17 includes a TA 710, capacitors 720-1 and 720-2, a charge inverting circuit 730, a clock generating circuit 740, and switches 750-1 to 750-4.

Similarly to the discrete-time analog circuit 200 having the differential configuration described above in the second embodiment, input voltage signals $V_{in1}$ and $V_{in2}$ having two types of phase, that is, a normal phase and a reverse phase, and having a radio frequency are input to the discrete-time analog circuit 700 illustrated in FIG. 17.

A normal phase input voltage signal $V_{in1}$ and a reverse phase input voltage signal $V_{in2}$ are input to the TA 710, and the TA 710 converts the input voltage signals $V_{in1}$ and $V_{in2}$ into currents ($g_m \times V_{in}$) and outputs two types of current, that is, normal-phase current $I_{out1}$ and reverse-phase current $I_{out2}$.

Each of the capacitors 720-1 and 720-2 is the same as or similar to the history capacitor 120 illustrated in FIG. 4. The charge inverting circuit 730 is also the same as or similar to the charge inverting circuit 130 illustrated in FIGS. 4 and 5.

Terminals a of the switches 750-1 and 750-3 are connected in parallel with a normal-phase output terminal $T\_TA_{out1}$ of the TA 710. Terminals a of the switches 750-2 and 750-4 are connected in parallel with a reverse-phase output terminal $T\_TA_{out2}$ of the TA 710. Terminals b of the switches 750-1 and 750-4 are connected to the capacitor 720-1 and a terminal A of the charge inverting circuit 730. Terminals b of the switches 750-2 and 750-3 are connected to the capacitor 720-2 and a terminal B of the charge inverting circuit 730.

The switch 750-1 connects the normal-phase output terminal $T\_TA_{out1}$ of the TA 710, the capacitor 720-1 connected to ground, and the terminal A of the charge inverting circuit 730 in a period in which the control signal LO is high and breaks the connection in a period in which the control signal LO is low. The switch 750-2 connects the reverse-phase output terminal $T\_TA_{out2}$ of the TA 710, the capacitor 720-2 connected to ground, and the terminal B of the charge inverting circuit 730 in a period in which the control signal LO is high and breaks the connection in a period in which the control signal LO is low.

The switch 750-3 connects the normal-phase output terminal $T\_TA_{out1}$ of the TA 710, the capacitor 720-2 connected to ground, and the terminal B of the charge inverting circuit 730 in a period in which the control signal LOB is high and breaks the connection in a period in which the control signal LOB is low. The switch 750-4 connects the reverse-phase output terminal $T\_TA_{out2}$ of the TA 710, the capacitor 720-1 connected to ground, and the terminal A of the charge inverting circuit 730 in a period in which the control signal LOB is high and breaks the connection in a period in which the control signal LOB is low.

The clock generating circuit 740 has a configuration that is the same as or similar to that of the clock generating circuit 540 and supplies the control signals described above with reference to FIG. 14. The clock generating circuit 740 supplies the control signals S1, S2, S3, and S4 to the charge inverting circuit 730, supplies the control signal LO to the switches 750-1 and 750-2, and supplies the control signal LOB to the switches 750-3 and 750-4.

In the discrete-time analog circuit 700 illustrated in FIG. 17, in a period in which the control signal LO is high, the normal-phase output terminal $T\_TA_{out1}$ of the TA 710 is connected to the capacitor 720-1 and the terminal A of the charge inverting circuit 730, and the reverse-phase output terminal T_TA$_{out2}$ of the TA 710 is connected to the capacitor 720-2 and the terminal B of the charge inverting circuit 730. In addition, in the discrete-time analog circuit 700, in a period in which the control signal LOB is high, the reverse-phase output terminal T_TA$_{out2}$ of the TA 710 is connected to the capacitor 720-1 and the terminal A of the charge inverting circuit 730, and the normal-phase output terminal T_TA$_{out1}$ of the TA 710 is connected to the capacitor 720-2 and the terminal B of the charge inverting circuit 730. That is, the discrete-time analog circuit 700 has a configuration in which the normal-phase output terminal T_TA$_{out1}$ and the reverse-phase output terminal T_TA$_{out2}$ of the TA 710 are interchanged at each interval Ts/2.

The discrete-time analog circuit 700 illustrated in FIG. 17 implements a double-balanced mixer configuration in which a normal phase input V$_{in1}$ and a reverse phase input V$_{in2}$ are interchanged according to the control signals LO and LOB.

Higher order filter characteristics of the discrete-time analog circuit 500 can be realized by connecting an output terminal T_V$_{out}$ in FIG. 9B and an input terminal T_V$_{in}$ of the discrete-time analog circuit 310 in FIG. 13 in a cascade to provide a multistage configuration. Higher order filter characteristics of the discrete-time analog circuit 600 or 700 can be realized by connecting input terminals T_V$_{in1}$ and T_V$_{in2}$ of the discrete-time analog circuit 410 in FIG. 11B to the output terminals T_V$_{out1}$ and T_V$_{out2}$ in FIG. 16 or 17 to provide a multistage configuration.

Each of the discrete-time analog circuit 500, 600, and 700 can also operate as a mixer for RF and IF, for IF and IF (different IFs), or for IF and BB (baseband). Accordingly, by connecting the discrete-time analog circuits 500, 600, or 700 in a plurality of stages, it is possible to configure a mixer using one or more intermediate frequencies (IFs).

The discrete-time analog circuits 500, 600, and 700 also permit baseband signals to pass when differential combination is not performed. Thus, each of the discrete-time analog circuits 500, 600, and 700 can be used as a baseband filter. Accordingly, each of the discrete-time analog circuits 500, 600, and 700 can operate as the transmitting device 10 in FIG. 3A or the discrete-time analog circuit 15 or 26 in the receiving device 20 in FIG. 3B.

Sixth Embodiment

Next, a description will be given of a sixth embodiment of the present disclosure. The sixth embodiment provides a configuration in which, in the first embodiment, the potentials of the capacitors included in the charge inverting circuit are monitored as outputs.

[Configuration of Discrete-Time Analog Circuit 800]

Figure 18:
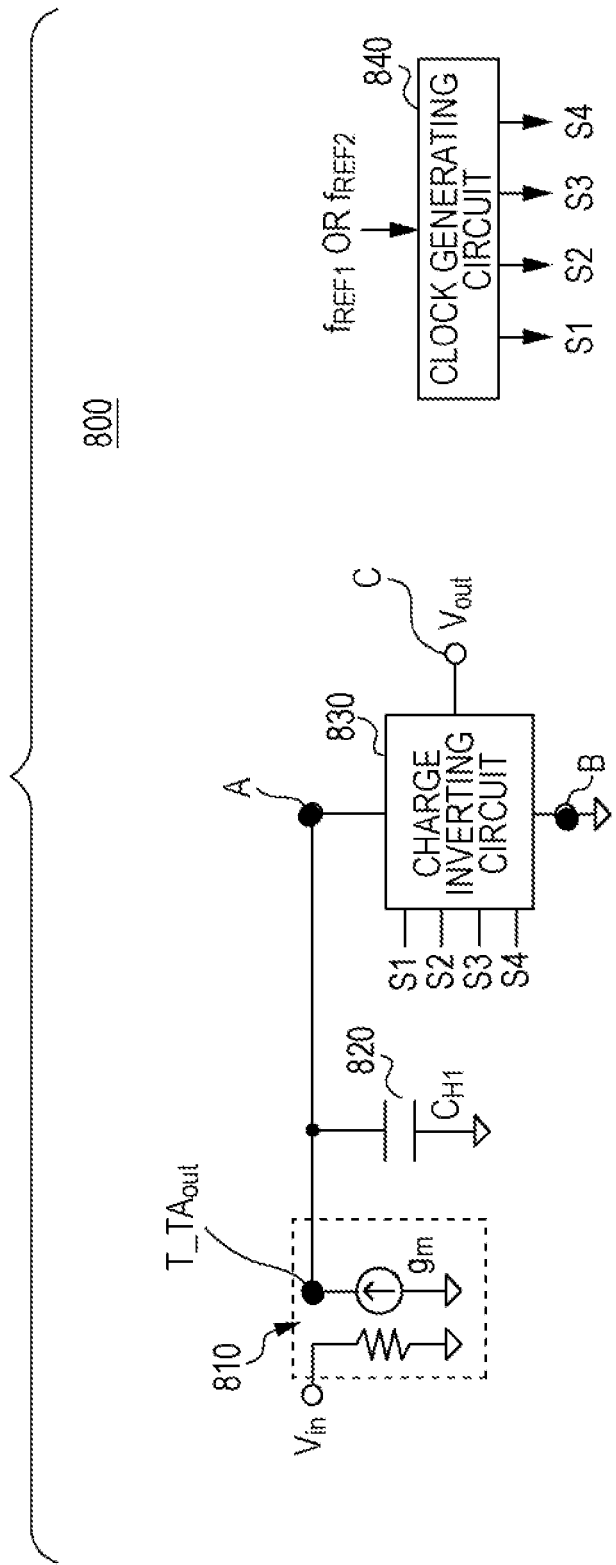
FIG. 18 is a diagram illustrating one example of the configuration of a major portion of a discrete-time analog circuit according to a sixth embodiment.

FIG. 18 is a diagram illustrating one example of the configuration of a discrete-time analog circuit 800 according to the sixth embodiment. The discrete-time analog circuit 800 illustrated in FIG. 18 includes a TA 810, a capacitor 820, a charge inverting circuit 830, and a clock generating circuit 840.

Unlike the discrete-time analog circuit 100 illustrated in FIG. 4, the discrete-time analog circuit 800 outputs (monitors), as output voltage signals V$_{out}$, the voltages of capacitors included in the charge inverting circuit 830. The configuration of the charge inverting circuit 830 is described later.

The TA 810 and the capacitor 820 illustrated in FIG. 18 are respectively the same as or similar to the TA 110 and the history capacitor 120 illustrated in FIG. 4.

The clock generating circuit 840 illustrated in FIG. 18 is also the same as or similar to the clock generating circuit 140 illustrated in FIG. 4 and supplies clocks (control signals S1, S2, S3, and S4), which are the same as or similar to the clocks (the control signals S1, S2, S3, and S4) illustrated in FIG. 6, to the charge inverting circuit 830.

Figure 19A:
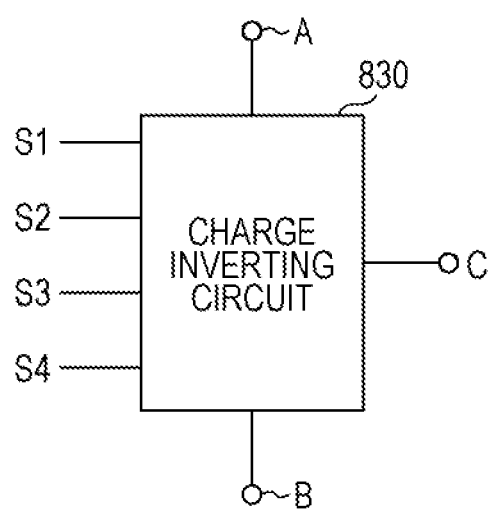
FIG. 19A is a diagram illustrating one example of the configuration of a charge inverting circuit according to the sixth embodiment.
Figure 19B:
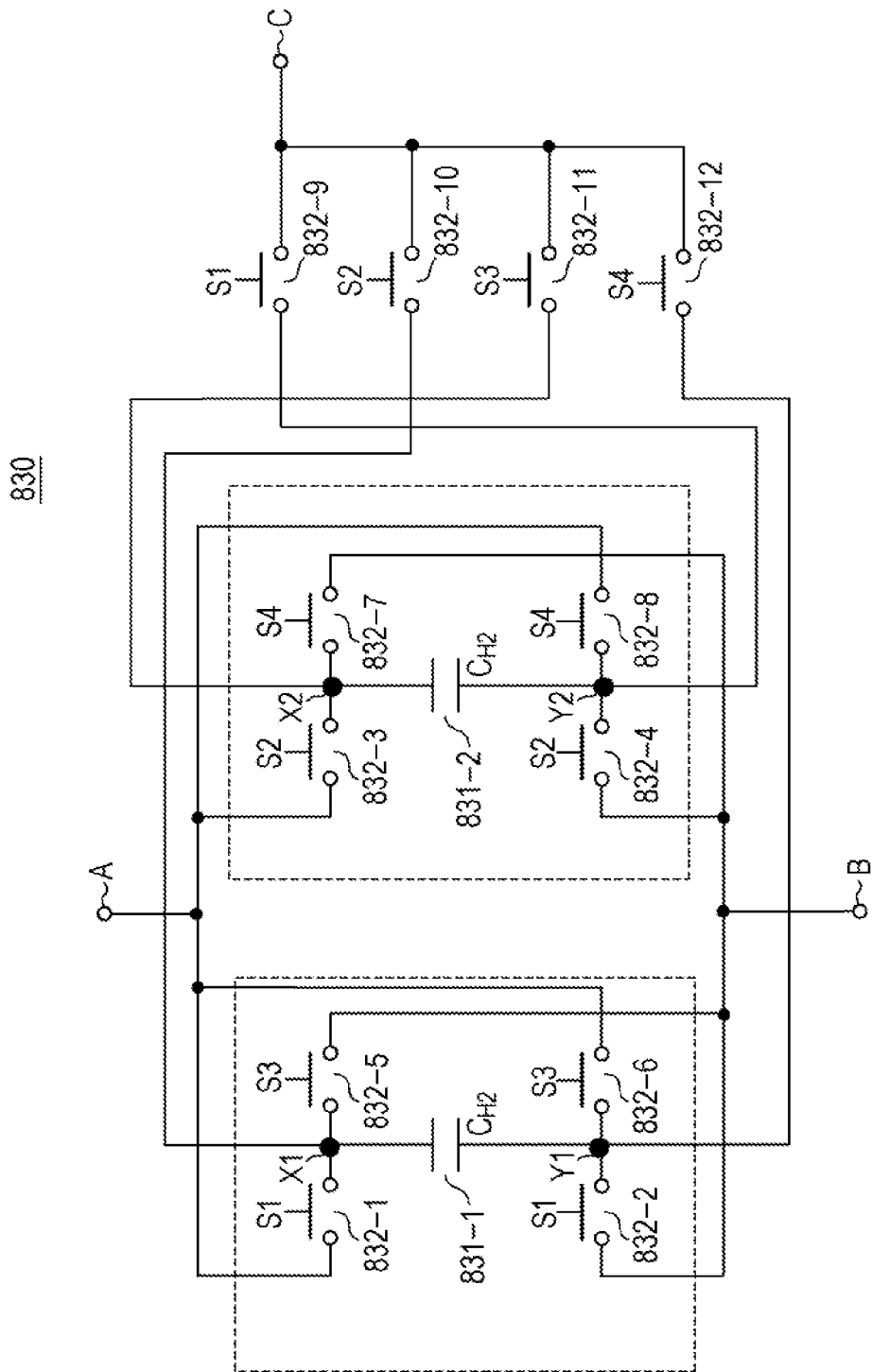
FIG. 19B is a diagram illustrating one example of the internal configuration of the charge inverting circuit according to the sixth embodiment.

Next, a description will be given of the configuration of the charge inverting circuit 830. FIG. 19A is a diagram illustrating one example of the configuration of the charge inverting circuit 830 according to the sixth embodiment. FIG. 19B is a diagram illustrating one example of the internal configuration of the charge inverting circuit 830 according to the sixth embodiment. The charge inverting circuit 830 illustrated in FIG. 19B includes two capacitors 831-1 and 831-2 and 12 switches 832-1 to 832-12, which control connections between the two capacitors 831-1 and 831-2 and three terminals A, B, and C.

The charge inverting circuit 830 illustrated in FIG. 19A has the terminals A, B, and C. In the discrete-time analog circuit 800 illustrated in FIG. 18, one of the terminals A and B of the charge inverting circuit 830 is connected to the output terminal T_TA$_{out}$ of the TA 810, and the other terminal A or B is connected to ground. The description below will be given in conjunction with a configuration in which the terminal A of the charge inverting circuit 830 is connected to the output terminal T_TA$_{out}$ of the TA 810, the terminal B of the charge inverting circuit 830 is connected to ground, and the terminal C of the charge inverting circuit 830 outputs V$_{out}$.

In the discrete-time analog circuit 800 illustrated in FIG. 18, the terminal C is a terminal for outputting (monitoring) voltages of the capacitors 831-1 and 831-2 as the output voltage signals V$_{out}$.

In FIG. 19B, the capacitor 831-1 has terminals X1 and Y1, and the capacitor 831-2 has terminals X2 and Y2. The capacitors 831-1 and 831-2 are provided parallel to each other. The capacitance values of the capacitors 831-1 and 831-2 are both C$_{H2}$.

Similarly to the switches 132-1 to 132-8 illustrated in FIG. 5B, the switches 832-1 to 832-8 control connections between each of the terminals of the capacitors 831-1 and 831-2 and the terminals A and B.

The switch 832-9 connects the terminal Y2 of the capacitor 831-2 and the terminal C in a period in which the control signal S1 is high and breaks the connection in a period in which the control signal S1 is low. The switch 832-10 connects the terminal X1 of the capacitor 831-1 and the terminal C in a period in which the control signal S2 is high and breaks the connection in a period in which the control signal S2 is low. The switch 832-11 connects the terminal X2 of the capacitor 831-2 and the terminal C in a period in which the control signal S3 is high and breaks the connection in a period in which the control signal S3 is low. The switch 832-12 connects the terminal Y1 of the capacitor 831-1 and the terminal C in a period in which the control signal S4 is high and breaks the connection in a period in which the control signal S4 is low.

[Operation of Discrete-Time Analog Circuit 800]

A description will be given of the operation of the discrete-time analog circuit 800. In the basic operation, an operation for outputting (monitoring) voltages of the capacitors 831-1 and 831-2 as the output voltage signals V$_{out}$ is added to the operation of the discrete-time analog circuit 100 described above in the first embodiment.

The discrete-time analog circuit 800 repeatedly performs charge sharing at each interval Ts to generate sampling values. The discrete-time analog circuit 800 shares the following three types of charge.

(6-a) Charge obtained when the TA 810 converts the input voltage signal $V_{in}$ into current, that is, charge output from the output terminal T_TA$_{out}$ of the TA 810 (this charge is hereinafter referred to as "input charge")

(6-b) Charge obtained one sampling interval earlier and held in the capacitor 820

(6-c) Charge obtained two sampling intervals earlier and held by the charge inverting circuit 830

In the sharing of the three types of charge, the charge inverting circuit 830 inverts the polarity of the charge obtained two sampling intervals earlier and held and establishes connection.

By turning on and off the switches 832-1 to 832-12 on the basis of the control signals S1 to S4 illustrated in FIG. 6, the charge inverting circuit 830 performs the following operations in one cycle (1T$_{CK}$) and repeats the operations in each cycle T$_{CK}$.

(6-1) In a period in which the control signal S1 is high, the terminal X1 of the capacitor 831-1 is connected to the terminal A, and the terminal Y1 is connected to the terminal B. Also, the terminal Y2 of the capacitor 831-2 is connected to the terminal C.

(6-2) In a period in which the control signal S2 is high, the terminal X2 of the capacitor 831-2 is connected to the terminal A, and the terminal Y2 is connected to the terminal B. Also, the terminal X1 of the capacitor 831-1 is connected to the terminal C.

(6-3) In a period in which the control signal S3 is high, the terminal Y1 of the capacitor 831-1 is connected to the terminal A, and the terminal X1 is connected to the terminal B. Also, the terminal X2 of the capacitor 831-2 is connected to the terminal C.

(6-4) In a period in which the control signal S4 is high, the terminal Y2 of the capacitor 831-2 is connected to the terminal A, and the terminal X2 is connected to the terminal B. Also, the terminal Y1 of the capacitor 831-1 is connected to the terminal C.

In the operations (6-1) to (6-4) described above, an operation in which the capacitor 831-1 establishes connection through inversion of the polarity of the held charge and connection of the capacitor 831-2 is released to hold the charge, an operation in which connection to the output is established so as to allow monitoring of the potential of the capacitor 831-2 or the capacitor 832-2 in which the charge is held, and an operation in which the capacitor 831-2 establishes connection through inversion of the polarity of the held charge and the connection of the capacitor 831-1 is released to hold the charge are repeated in each period Ts. For the monitoring, a buffer or an amplifier is connected like a voltage-controlled voltage source (VCVS) in which transfer of held charge is minimized.

A transfer function for the discrete-time analog circuit 800 is generally expressed by equation (10) below. In the transfer function, a filter characteristic of the baseband when frequency conversion is not performed corresponds to k=0.

$$H_{LPFm} = H_1 \cdot H_H \cdot \frac{U_1(\omega_{in} - k\omega_S)}{T_S} \tag{10}$$

where $H_I$, $H_H$, z, and $U_1(\omega)$ are expressed by:

$$H_1 = g_m T_S \mathrm{sinc}\left(\frac{\omega_{in} T_S}{2}\right) e^{j\omega_{in}\frac{T_S}{2}} \tag{11}$$

$$H_H = \frac{\frac{1}{C_{H1} + C_{H2}}}{1 - \frac{C_{H1}}{C_{H1} + C_{H2}} z^{-1} + \frac{C_{H2}}{C_{H1} + C_{H2}} z^{-2}}$$

$$z = e^{j\omega_{in} T_S}$$

$$U_1(\omega) = T_S \mathrm{sinc}\left(\frac{\pi\omega}{\omega_S}\right) e^{-j\omega\frac{T_S}{2}}$$

The discrete-time analog circuit 800 differs from the discrete-time analog circuit 100 in the first embodiment in that the discrete-time analog circuit 800 includes the switches 832-9 to 832-12 and monitors potentials of the capacitors 831-1 and 831-2 when charges are held in the sampling interval Ts in (6-1) to (6-4) described above.

That is, in the discrete-time analog circuit 800, while one of the two capacitors 831-1 and 831-2 holds the shared charge in the sampling interval Ts, the connections of the capacitors 831-1 and 831-2 with the terminal C are switched at each interval Ts in order to monitor the shared charge.

For example, in a period in which the control signal S1 is high, the terminal X1 of the capacitor 831-1 is connected to the terminal A and the terminal Y1 of the capacitor 831-1 is connected to the terminal B to perform charge sharing, and then charge is held in a period in which the control signal S2 is high. In the discrete-time analog circuit 800, in a period in which the control signal S2 is high, the terminal X1 of the capacitor 831-1 is connected to the terminal C, and the charge held in the capacitor 831-1 is monitored.

The configuration in which the output voltage signal $V_{out}$ is monitored at the output terminal T_TA$_{out}$ of the TA 110 to which the history capacitor 120 and the charge inverting circuit 130 are connected is simpler, as in the first embodiment. When the potentials of the capacitors 831-1 and 831-2 are monitored as in the present embodiment, the amount of attenuation at high frequencies can be increased through zero-order hold.

Although the configuration in which the potentials of the capacitors included in the charge inverting circuit in the first embodiment are monitored as outputs has been described above in the present embodiment, the present embodiment is also applicable to other embodiments.

Figure 20:
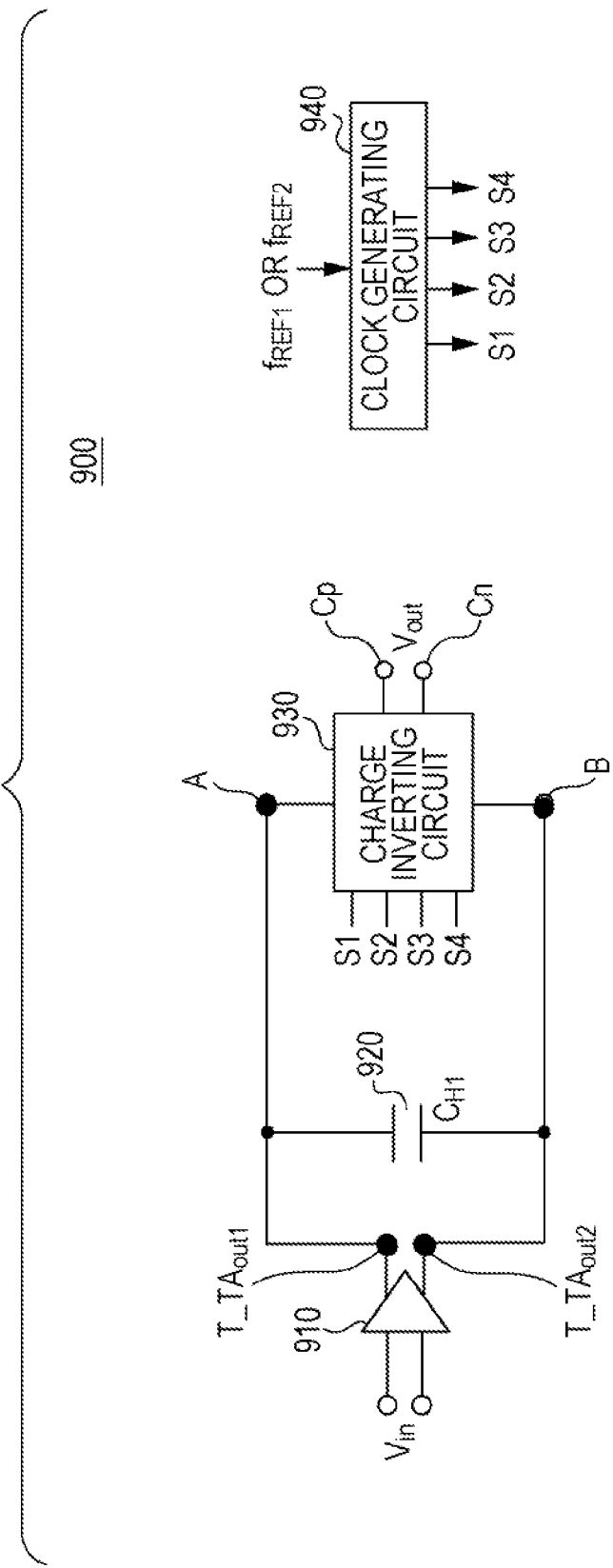
FIG. 20 is a diagram illustrating another example of the configuration of the discrete-time analog circuit according to the sixth embodiment.

First, a description will be given of a case in which the present embodiment is applied to the differential configuration described above in the second embodiment. FIG. 20 is a diagram illustrating another example of the configuration of a discrete-time analog circuit 900 according to the sixth embodiment. The discrete-time analog circuit 900 illustrated in FIG. 20 includes a TA 910, a history capacitor 920, a charge inverting circuit 930, and a clock generating circuit 940.

The TA 910, the history capacitor 920, and the clock generating circuit 940 are respectively the same as or similar to the TA 210, the history capacitor 220, and the clock generating circuit 240 illustrated in FIG. 8.

Figure 21A:
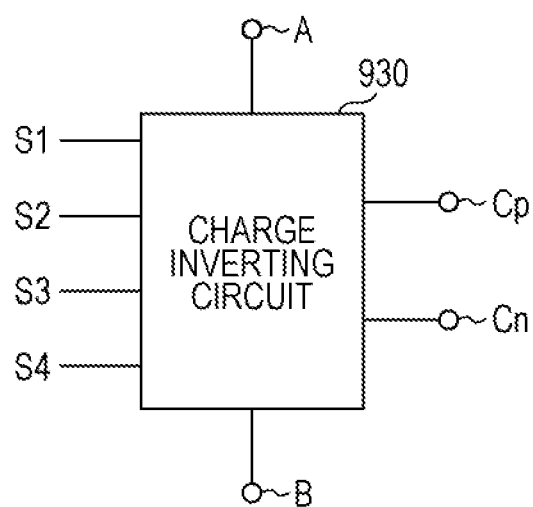
FIG. 21A is a diagram illustrating another example of the configuration of the charge inverting circuit according to the sixth embodiment.
Figure 21B:
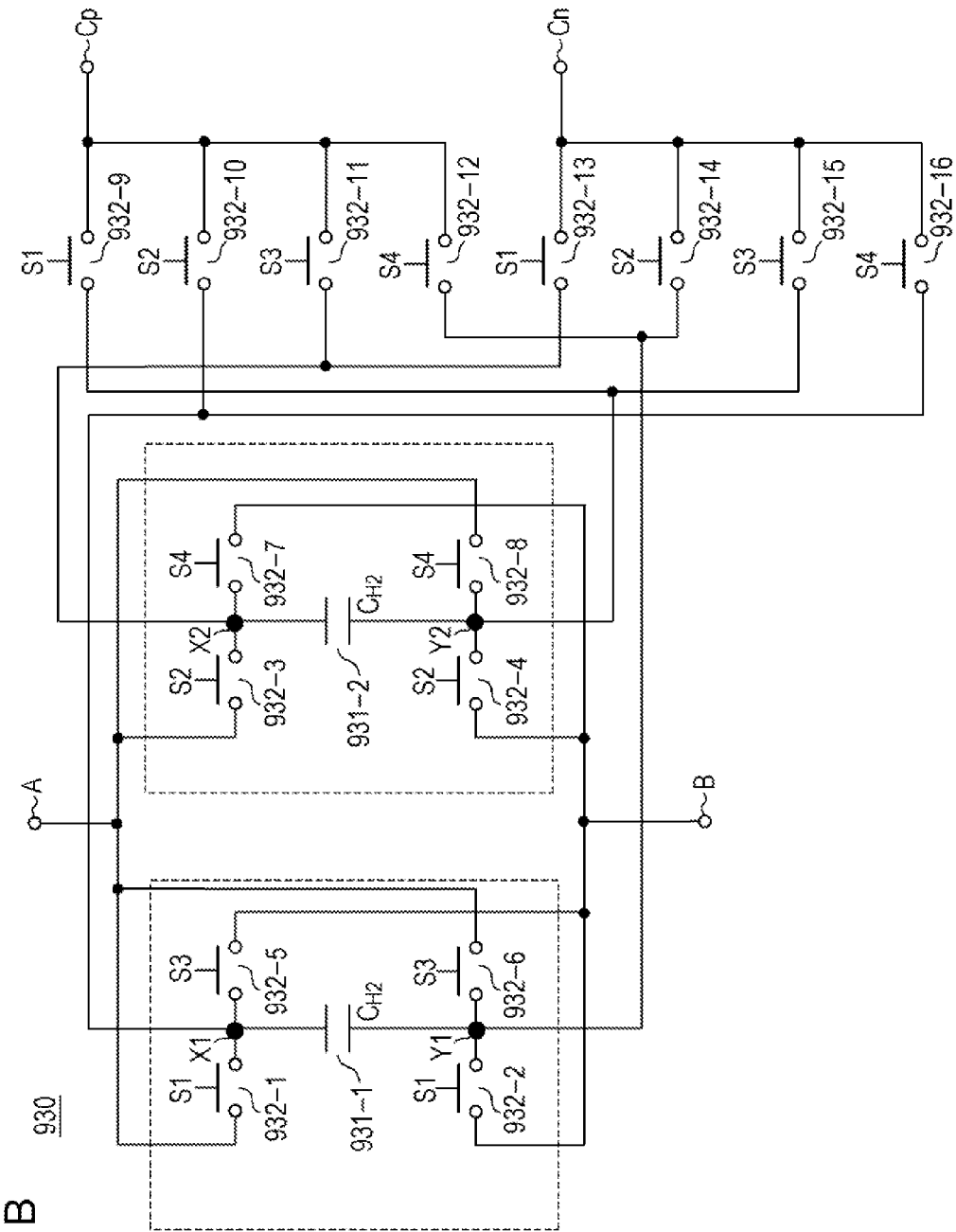
FIG. 21B is a diagram illustrating another example of the internal configuration of the charge inverting circuit according to the sixth embodiment.

Next, a description will be given of the configuration of the charge inverting circuit 930. FIG. 21A is a diagram illustrating another example of the configuration of the charge inverting circuit 930 according to the sixth embodiment. FIG. 21B is a diagram illustrating another example of the internal configuration of the charge inverting circuit 930 according to the sixth embodiment. The charge inverting circuit 930 illustrated in FIG. 21B includes two capacitors 931-1 and 931-2 and 16 switches 932-1 to 932-16, which control connections of the two capacitors 931-1 and 931-2.

The charge inverting circuit 930 illustrated in FIG. 21A has terminals A, B, Cp, and Cn. In the discrete-time analog circuit 900 illustrated in FIG. 20, the terminal A of the charge inverting circuit 930 is connected to a normal-phase output terminal T_TA$_{out1}$ of the TA 910, and the terminal B is connected to a reverse-phase output terminal T_TA$_{out2}$ of the TA 910.

The terminals Cp and Cn are terminals for outputting (monitoring), as the output voltage signals V$_{out}$, the voltages of the capacitors 931-1 and 931-2 in the discrete-time analog circuit 900 illustrated in FIG. 20.

The operations of the capacitors 931-1 and 931-2 and the switches 932-1 to 932-8 included in the charge inverting circuit 930 are the same as or similar to the operations of those in the charge inverting circuit 130 described above in the first embodiment.

Differences from the differential-type discrete-time analog circuit 200 in the second embodiment are that the discrete-time analog circuit 900 includes the switches 932-9 to 932-16 and monitors the potentials of the capacitors 931-1 and 931-2 as differential outputs while charges are held in the period Ts.

Figure 22:
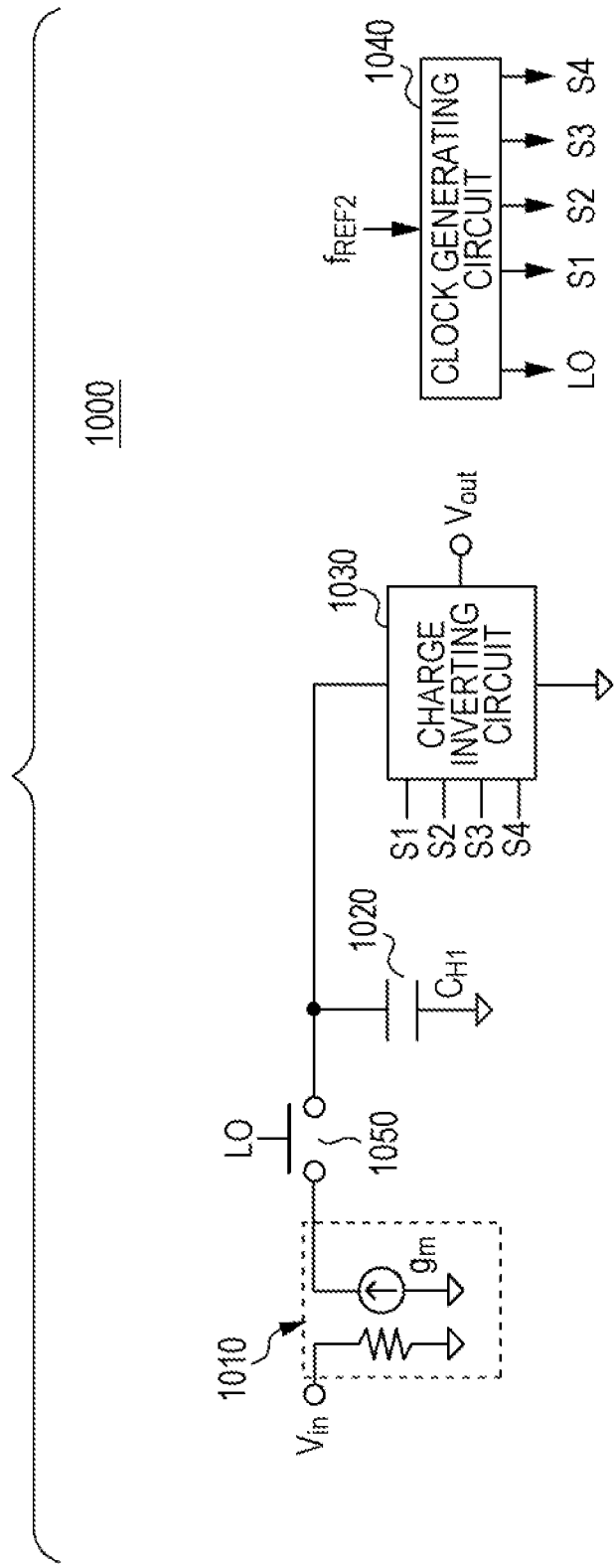
FIG. 22 is a diagram illustrating another example of the configuration of the discrete-time analog circuit according to the sixth embodiment.

A description will be given of a case in which the present embodiment is applied to the single-ended mixer described above in the fifth embodiment. FIG. 22 is a diagram illustrating an example of the configuration of a discrete-time analog circuit 1000 according to the sixth embodiment.

A TA 1010, a history capacitor 1020, a clock generating circuit 1040, and a switch 1050 illustrated in FIG. 22 are respectively the same as or similar to the TA 510, the history capacitor 520, the clock generating circuit 540, and the switch 550 illustrated in FIG. 13. A charge inverting circuit 1030 is also the same as or similar to the charge inverting circuit 830 illustrated in FIG. 19B.

Through use of the configuration illustrated in FIG. 22, in the discrete-time analog circuit using the single-ended mixer described above in the fifth embodiment, the potentials of the capacitors included in the charge inverting circuit can be monitored while the charge inverting circuit holds charges in the sample interval Ts.

Figure 23:
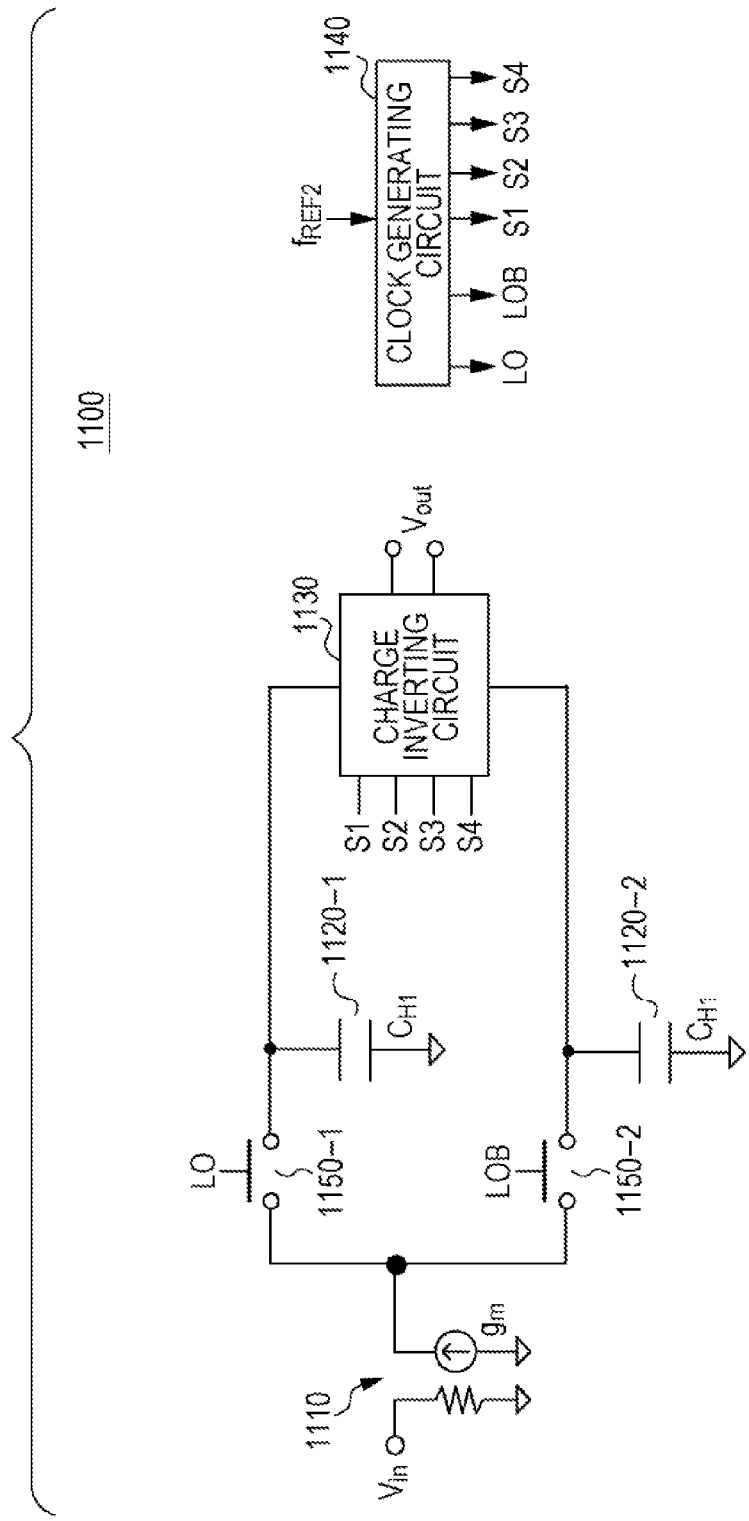
FIG. 23 is a diagram illustrating another example of the configuration of the discrete-time analog circuit according to the sixth embodiment.

A description will be given of a case in which the present embodiment is applied to the single-balanced mixer described above in the fifth embodiment. FIG. 23 is a diagram illustrating an example of the configuration of a discrete-time analog circuit 1100 according to the sixth embodiment.

A TA 1110, history capacitors 1120-1 and 1120-2, a clock generating circuit 1140, and switches 1150-1 and 1150-2 illustrated in FIG. 23 are respectively the same as or similar to the TA 610, the history capacitors 620-1 and 620-2, the clock generating circuit 640, and the switches 650-1 and 650-2 illustrated in FIG. 16. A charge inverting circuit 1130 is the same as or similar to the charge inverting circuit 930 illustrated in FIG. 21B.

Through use of the configuration illustrated in FIG. 23, in the discrete-time analog circuit using the single-balanced mixer described above in the fifth embodiment, the potentials of the capacitors included in the charge inverting circuit can be monitored as differential outputs while the charge inverting circuit holds charges in the sample interval Ts.

Figure 24:
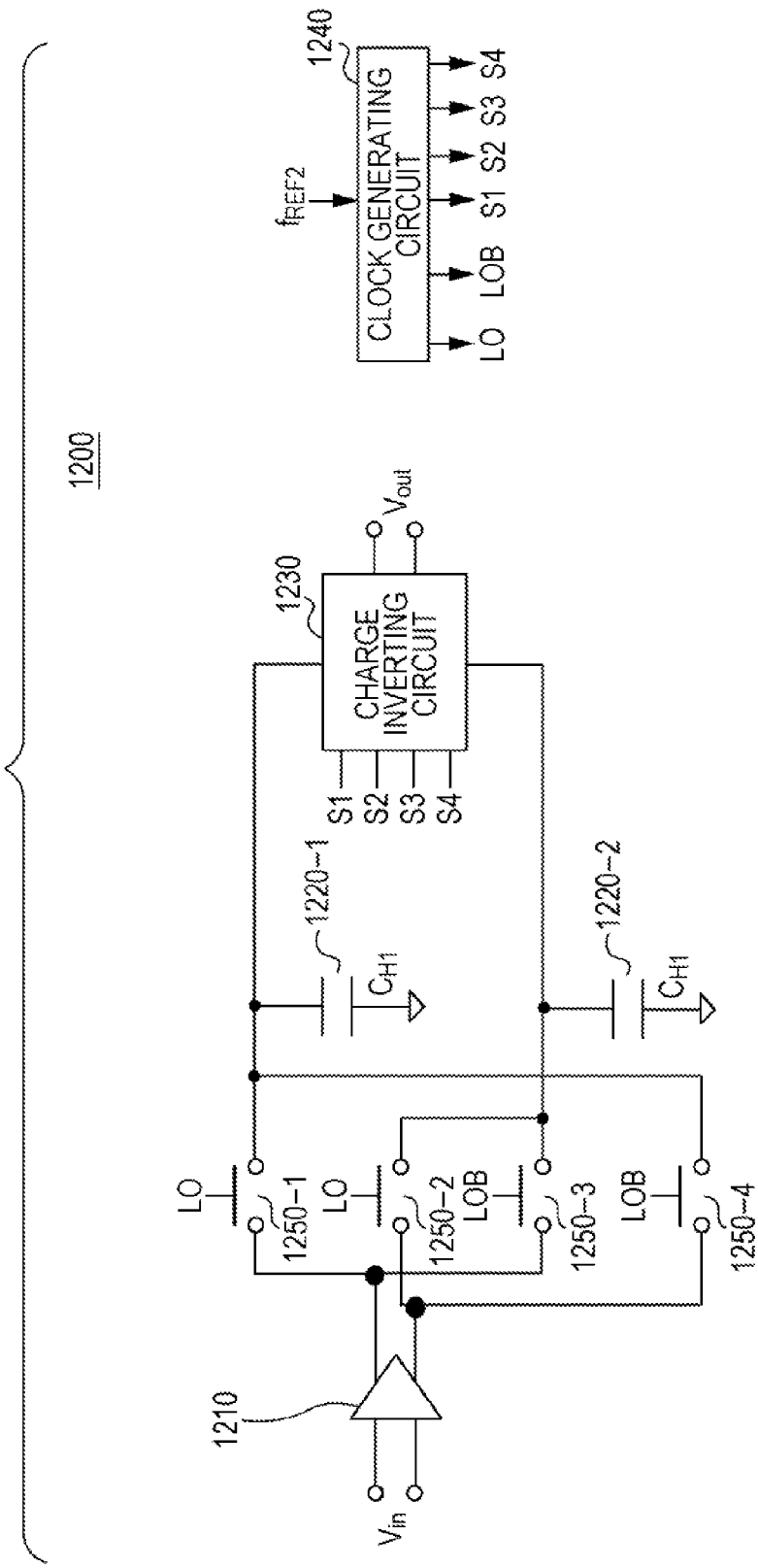
FIG. 24 is a diagram illustrating another example of the configuration of the discrete-time analog circuit according to the sixth embodiment.

A description will be given of a case in which the present embodiment is applied to the double-balanced mixer described above in the fifth embodiment. FIG. 24 is a diagram illustrating an example of the configuration of a discrete-time analog circuit 1200 according to the sixth embodiment.

A TA 1210, history capacitors 1220-1 and 1220-2, a clock generating circuit 1240, and switches 1250-1 to 1250-4 illustrated in FIG. 24 are respectively the same as or similar to the TA 710, the capacitors 720-1 and 720-2, the clock generating circuit 740, and the switches 750-1 to 750-4 illustrated in FIG. 17. A charge inverting circuit 1230 is also the same as or similar to the charge inverting circuit 930 illustrated in FIG. 21B.

Through use of the configuration illustrated in FIG. 24, in the discrete-time analog circuit using the double-balanced mixer described above in the fifth embodiment, the potentials of the capacitors included in the charge inverting circuit can be monitored as differential outputs while the charge inverting circuit holds charges in the sample interval Ts.

Seventh Embodiment

In the first embodiment, the description has been given of a configuration in which the capacitors 131-1 and 130-2 in the charge inverting circuit 130 illustrated in FIGS. 4 and 5B each hold the shared charge in the sample interval Ts. In the seventh embodiment, a description will be given of a configuration for the capacitors in the charge inverting circuit to hold shared charge in a longer period of time than Ts.

[Configuration of Discrete-Time Analog Circuit 1300]

Figure 25:
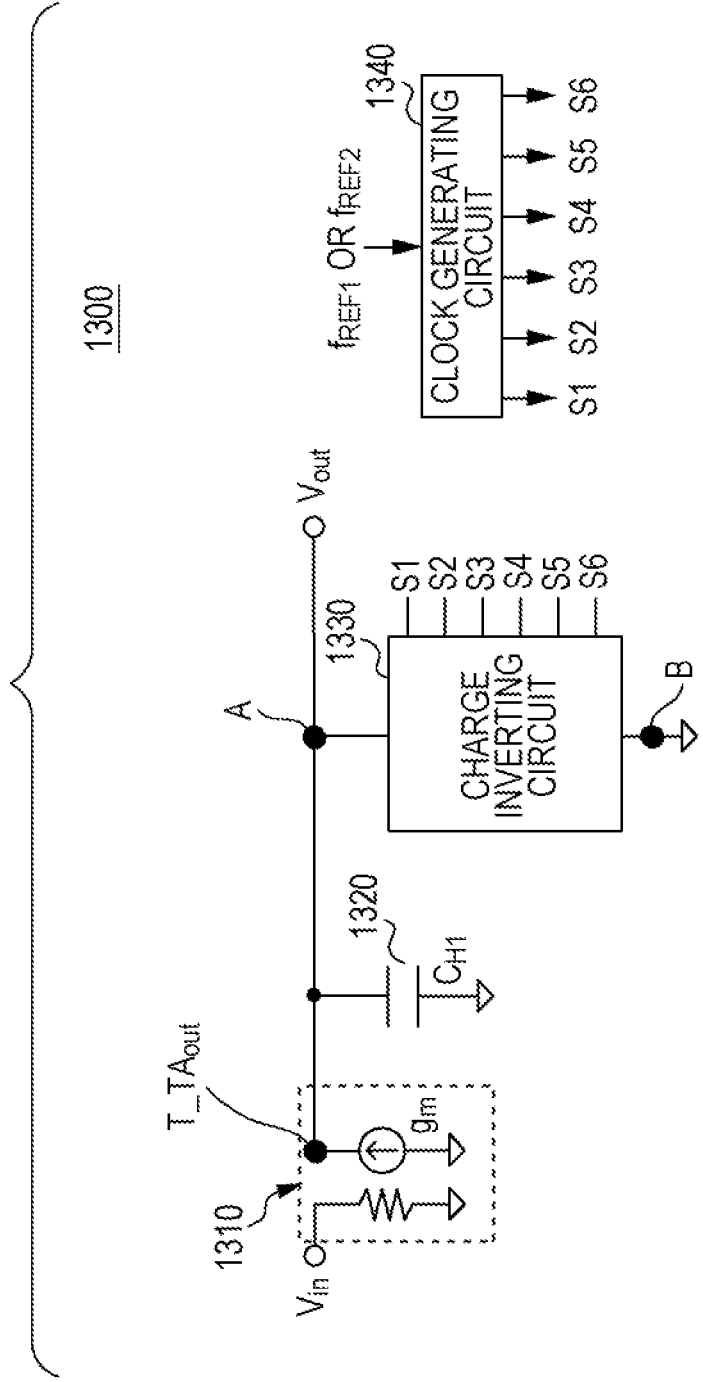
FIG. 25 is a diagram illustrating one example of the configuration of a discrete-time analog circuit according to a seventh embodiment.

FIG. 25 is a diagram illustrating one example of the configuration of a discrete-time analog circuit 1300 according to a seventh embodiment. The discrete-time analog circuit 1300 illustrated in FIG. 25 includes a TA 1310, a history capacitor 1320, a charge inverting circuit 1330, and a clock generating circuit 1340.

The TA 1310 and the history capacitor 1320 illustrated in FIG. 25 are respectively the same as or similar to the TA 110 and the history capacitor 120 illustrated in FIG. 4.

A terminal A of the charge inverting circuit 1330 is connected to an output terminal T_TA$_{out}$ of the TA 1310, and a terminal B of the charge inverting circuit 1330 is connected to ground. The charge inverting circuit 1330 is a circuit for holding charge and establishing connection through inversion of the charge. The charge inverting circuit 1330 performs charge sharing on the basis of control signals S1 to S6 supplied from the clock generating circuit 1340 and performs filtering processing on an input analog signal V$_{in}$. The configuration of the charge inverting circuit 1330 is described later.

The clock generating circuit 1340 generates the clocks (the control signals S1 to S6) on the basis of a reference frequency signal f$_{REF1}$ or f$_{REF2}$ generated by the reference frequency oscillator (see FIG. 3A and FIG. 3B) and supplies the clocks (the control signals S1 to S6) to the charge inverting circuit 1330. The control signals S1 to S6 generated by the clock generating circuit 1340 are described later.

Figure 26A:
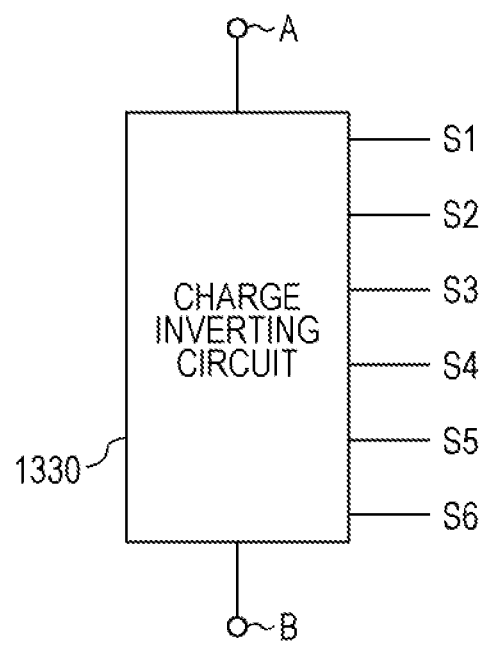
FIG. 26A is a diagram illustrating one example of the configuration of a charge inverting circuit according to the seventh embodiment.
Figure 26B:
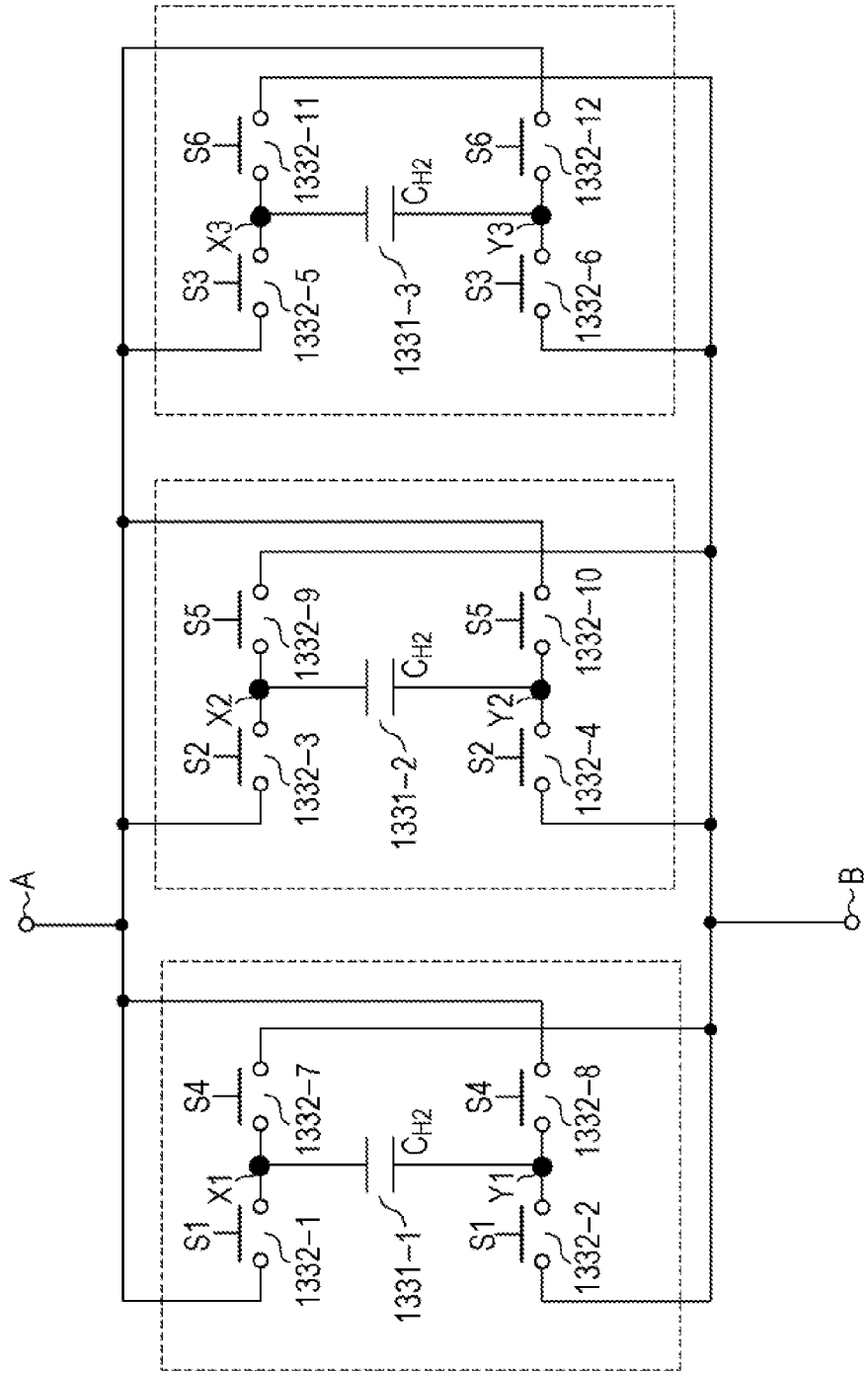
FIG. 26B is a diagram illustrating one example of the internal configuration of the charge inverting circuit according to the seventh embodiment.

Now, a description will be given of the configuration of the charge inverting circuit 1330. FIG. 26A is a diagram illustrating one example of the configuration of the charge inverting circuit 1330 according to the seventh embodiment. FIG. 26B is a diagram illustrating one example of the internal configuration of the charge inverting circuit 1330 according to the seventh embodiment. The charge inverting circuit 1330 illustrated in FIG. 26B includes three capacitors 1331-1 to 1331-3 and 12 switches 1332-1 to 1332-12, which control connections of the three capacitors 1331-1 to 1331-3.

The charge inverting circuit 1330 illustrated in FIG. 26A has terminals A and B. In the discrete-time analog circuit 1300 illustrated in FIG. 25, one of the terminals A and B of the charge inverting circuit 1330 is connected to an output terminal T_TA$_{out}$ of the TA 1310, and the other terminal A or B is connected to ground. The following description will be given of a configuration in which the terminal A of the charge inverting circuit 1330 is connected to the output terminal T_TA$_{out}$ of the TA 1310 and the terminal B is connected to ground.

The capacitor 1331-1 has terminals X1 and Y1, the capacitor 1331-2 has terminals X2 and Y2, and the capacitor 1331-3 has terminals X3 and Y3. The capacitors 1331-1 to 1331-3 are provided parallel to each other. The capacitance values of the capacitors 1331-1 to 1331-3 are each $C_{H2}$.

In accordance with the control signal S1, the switch 1332-1 controls a connection between the terminal X1 and the terminal A, and the switch 1332-2 controls a connection between the terminal Y1 and the terminal B. In accordance with the control signal S2, the switch 1332-3 controls a connection between the terminal X2 and the terminal A, and the switch 1332-4 controls a connection between the terminal Y2 and the terminal B. In accordance with the control signal S3, the switch 1332-5 controls a connection between the terminal X3 and the terminal A, and the switch 1332-6 controls a connection between the terminal Y3 and the terminal B. In accordance with the control signal S4, the switch 1332-7 controls a connection between the terminal X1 and the terminal B, and the switch 1332-8 controls a connection between the terminal Y1 and the terminal A. In accordance with the control signal S5, the switch 1332-9 controls a connection between the terminal X2 and the terminal B, and the switch 1332-10 controls a connection between the terminal Y2 and the terminal A. In accordance with the control signal S6, the switch 1332-11 controls a connection between the terminal X3 and the terminal B, and the switch 1332-12 controls a connection between the terminal Y3 and the terminal A.

The switches 1332-1 to 1332-12 are turned on in a period in which the corresponding control signals that are supplied are high. The operations of the switches 1332-1 to 1332-12 are described later.

Figure 27:
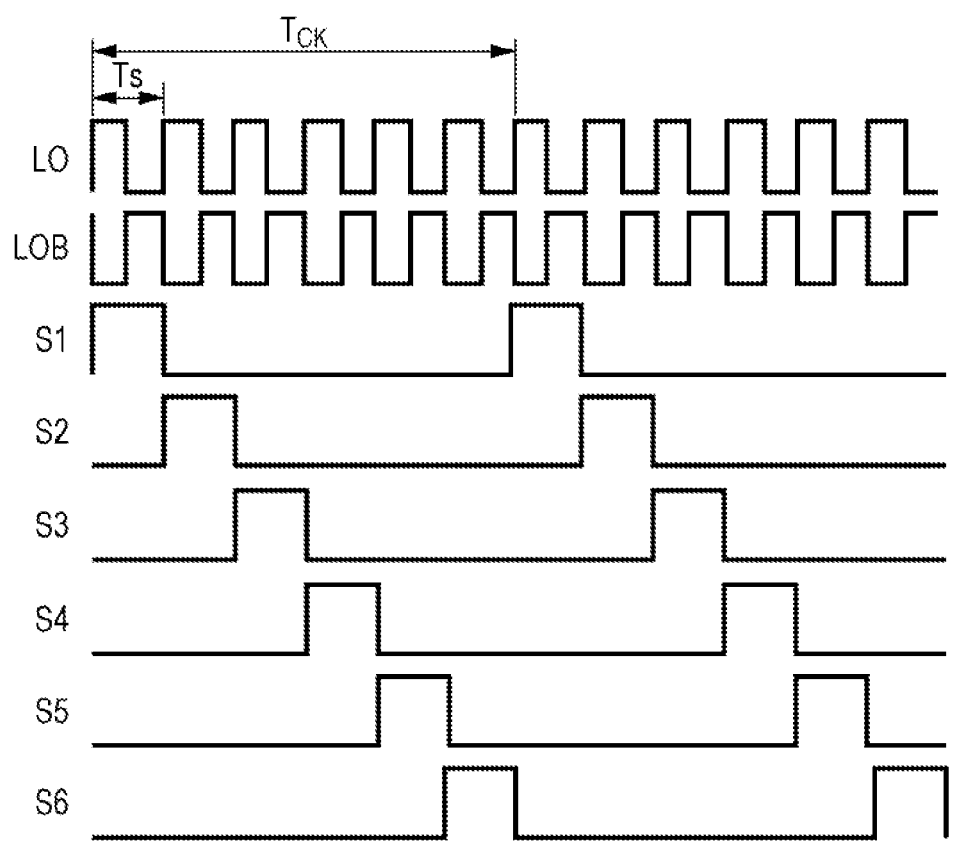
FIG. 27 is a timing chart of control signals generated by a clock generating circuit.

Now, a description will be given of the control signals generated by the clock generating circuit 1340. FIG. 27 is a timing chart of the control signals. The control signals have pulses with a pulse width Ts and a cycle $T_{CK}$. The pulse width Ts is the same as the sampling interval. Although FIG. 27 illustrates square-wave clock signals, the charge inverting circuit 1330 also operates with clock signals having rounded waveforms.

As illustrated in FIG. 27, the clock generating circuit 1340 supplies, to the charge inverting circuit 1330, the control signals S1 to S6 having a duty ratio (="pulse width Ts"/"control-signal cycle $T_{CK}$") of ⅙ and having six phases that are 60 degrees out of phase with each other.

[Operation of Discrete-Time Analog Circuit 1300]

Next, a description will be given of the operation of the discrete-time analog circuit 1300.

The discrete-time analog circuit 1300 repeatedly performs charge sharing at each interval Ts to generate sampling values. More specifically, the discrete-time analog circuit 1300 shares the following three types of charge.

(7-a) Charge obtained when the TA 1310 converts the input voltage signal $V_{in}$ into current, that is, charge output from the output terminal $T\_TA_{out}$ of the TA 1310 (this charge is hereinafter referred to as "input charge")

(7-b) Charge obtained one sampling interval earlier and held in the history capacitor 1320

(7-c) Charge obtained three sampling intervals earlier and held by the charge inverting circuit 1330

In the sharing of the charges (7-a) to (7-c), the charge inverting circuit 1330 establishes connection through inversion of the polarity of the charge obtained three sampling and held thereby.

By turning on and off the switches 1332-1 to 1332-12 on the basis of the control signals S1 to S6, the charge inverting circuit 1330 performs the following operations in one cycle ($1T_{CK}$) and repeats the operations in each cycle $T_{CK}$.

(7-1) In a period in which the control signal S1 is high, the terminal X1 of the capacitor 1331-1 is connected to the terminal A, and the terminal Y1 is connected to the terminal B.

(7-2) In a period in which the control signal S2 is high, the terminal X2 of the capacitor 1331-2 is connected to the terminal A, and the terminal Y2 is connected to the terminal B.

(7-3) In a period in which the control signal S3 is high, the terminal X3 of the capacitor 1331-3 is connected to the terminal A, and the terminal Y3 is connected to the terminal B.

(7-4) In a period in which the control signal S4 is high, the terminal Y1 of the capacitor 1331-1 is connected to the terminal A, and the terminal X1 is connected to the terminal B.

(7-5) In a period in which the control signal S5 is high, the terminal Y2 of the capacitor 1331-2 is connected to the terminal A, and the terminal X2 is connected to the terminal B.

(7-6) In a period in which the control signal S6 is high, the terminal Y3 of the capacitor 1331-3 is connected to the terminal A, and the terminal X3 is connected to the terminal B.

As in the case in the first embodiment in which two capacitors are provided, in the operations (7-1) to (7-6) described above, an operation in which the capacitor 1331-1 establishes connection through inversion of the polarity of the held charge and connections of the capacitors 1331-2 and 1331-3 are released to hold the charge, an operation in which the capacitor 1331-2 establishes connection through inversion of the polarity of the held charge and the connections of the capacitors 1331-1 and 1331-3 are released to hold the charge, and an operation in which the capacitor 1331-3 establishes connection through inversion of the polarity of the held charge and the connections of the capacitors 1331-1 and 1331-2 are released to hold the charge are cyclically repeated in each period Ts.

That is, the capacitor 1331-1 in FIG. 26B holds charge, shared in a period in which the control signal S1 is high, in a period 2Ts in which the control signals S2 and S3 are high, performs charge sharing through inversion of the polarity in a period in which the control signal S4 is high, and holds the inverted charge in a period 2Ts in which the control signals S5 and S6 are high.

Now, the above-described operations will be described mathematically.

Charge (input charge) at time n when the TA 1310 converts the input voltage signal $V_{in}$ into current is analogous to that given by equation (1) noted above.

Charge sharing in the discrete-time analog circuit 1300 at time n can be written as a difference equation:

$$q_{in}(n)+C_{H1}v_{out}(n-1)-C_{H2}v_{out}(n-3)=(C_{H1}+C_{H2})v_{out}(n) \qquad (12)$$

In equation (12), the first term on the left-hand side corresponds to the input charge, the second term represents the charge obtained one sampling interval earlier and held in the history capacitor 1320, and the third term on the left-hand side represents the charges obtained three sampling intervals earlier and held in the capacitors 1331-1 to 1331-3. In the discrete-time analog circuit 1300, $v_{out}(n)$ is held in accordance with a duty ratio of 1. Through a z-transform, the infinite impulse response (IIR) portion (corresponding to $H_H$ in equations (3) and (4)) in a transfer function for the discrete-time analog circuit 1300 is expressed by:

$$H_{H\_3} = \frac{\frac{1}{C_{H1}+C_{H2}}}{1 - \frac{C_{H1}}{C_{H1}+C_{H2}}z^{-1} + \frac{C_{H2}}{C_{H1}+C_{H2}}z^{-2}} \qquad (13)$$

As described above, according to the present embodiment, each of the capacitors 1331-1 to 1331-3 in the charge inverting circuit 1330 performs an operation for holding the shared charge in a period 2Ts to thereby make it possible to realize a high-degree transfer function having a cubic equation in the denominator of the IIR portion in the transfer function for the discrete-time analog circuit 1300.

Eighth Embodiment

In each embodiment described above, by increasing the period in which the charge inverting circuit holds the charge, it is possible to realize a higher-degree transfer function for the denominator of the IIR portion in the transfer function for the discrete-time analog circuit (this denominator is hereinafter referred to as an "IIR function"). In addition, in each embodiment described above, the polarity of the coefficient of each term of the IIR function can be changed by changing the configuration of each charge inverting circuit. Additionally, in each embodiment described above, the number of terms in the IIR function can be changed by changing the number of charge inverting circuits. One example of such variations will be described below.

[Configuration of Discrete-Time Analog Circuit 1400]

Figure 28A:
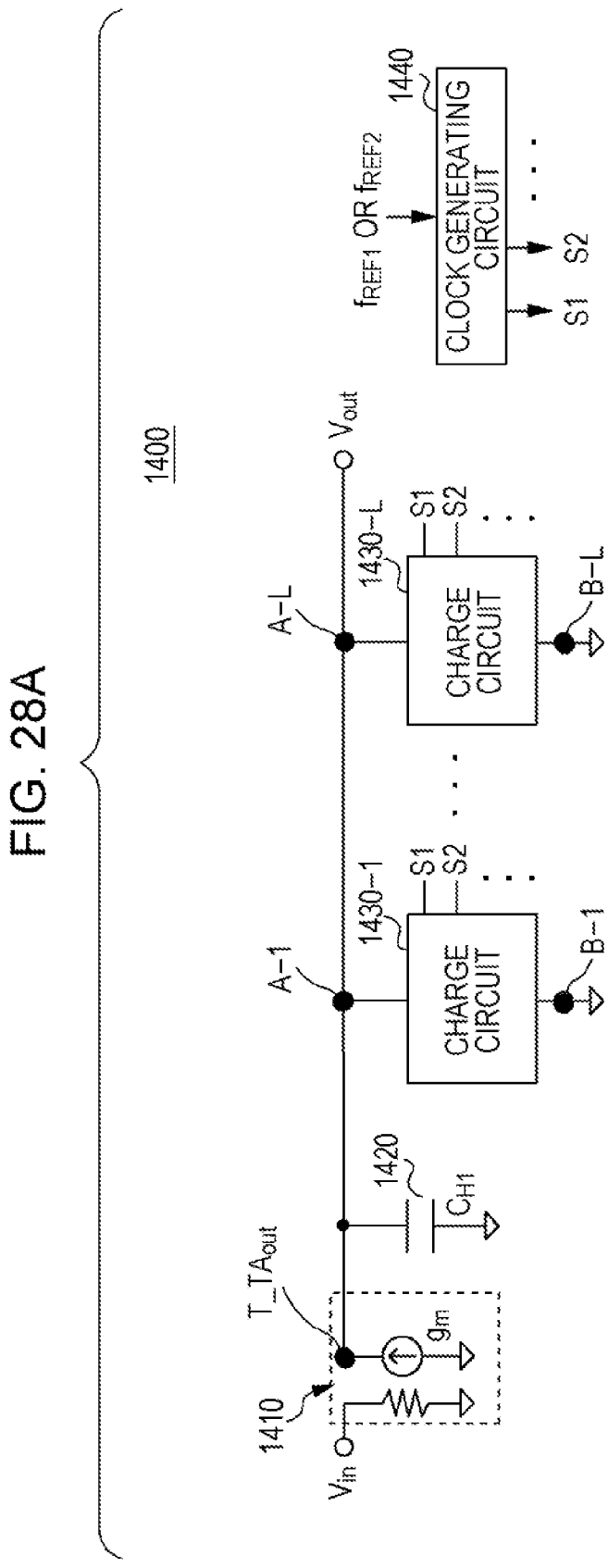
FIG. 28A is a diagram illustrating one example of the configuration of a major portion of a discrete-time analog circuit having a capacitor according to an eighth embodiment.
Figure 28B:
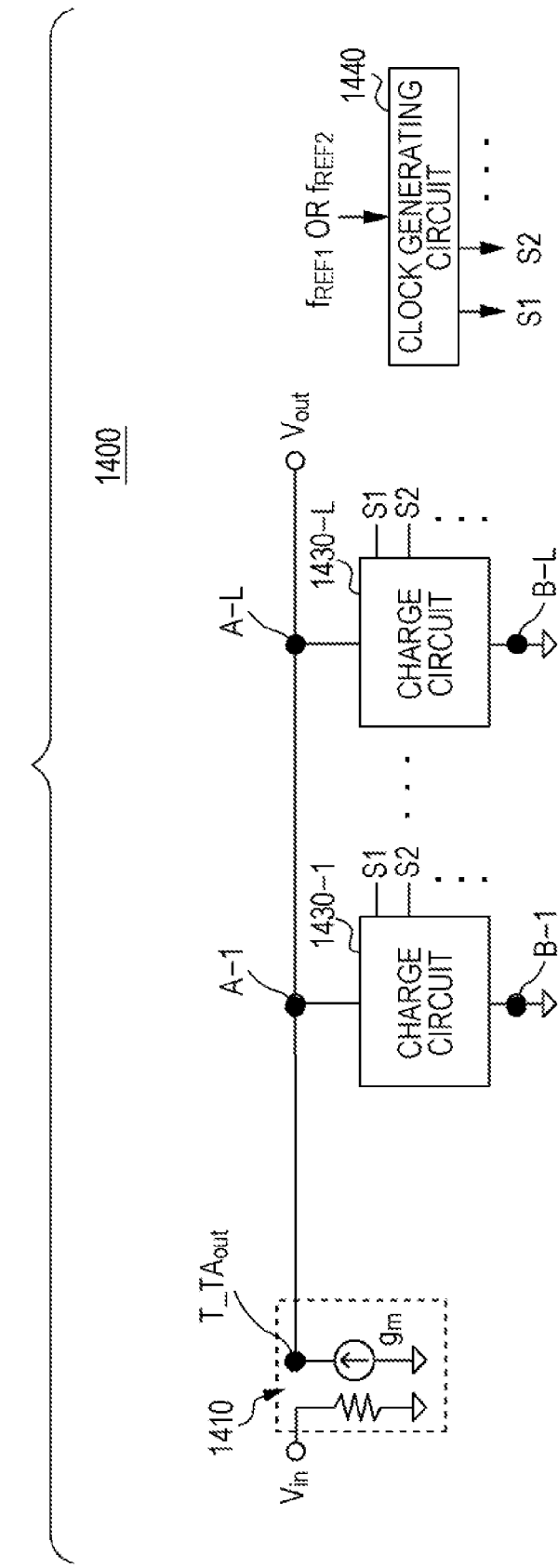
FIG. 28B is a diagram illustrating one example of the configuration of a major portion of a discrete-time analog circuit in which a capacitor is omitted according to the eighth embodiment.

FIG. 28A is a diagram illustrating one example of the configuration of a discrete-time analog circuit 1400 having a history capacitor 1420 according to an eighth embodiment. FIG. 28B is a diagram illustrating one example of the configuration of the discrete-time analog circuit 1400 in which the history capacitor 1420 according to the eighth embodiment is omitted.

In the configuration illustrated in FIG. 28A, since the discrete-time analog circuit 1400 has the history capacitor 1420, for example, the IIR function has a first-degree term in which the coefficient due to the history capacitor 1420 is negative, as in equation (4). On the other hand, in the configuration illustrated in FIG. 28B, since the discrete-time analog circuit 1400 does not have the history capacitor 1420, L charge circuits 1430 can select a positive or negative coefficient for the first-degree term in the IIR function.

The discrete-time analog circuit 1400 illustrated in FIG. 28A includes a TA 1410, the history capacitor 1420, L charge circuits 1430 (1430-1 to 1430-L), and a clock generating circuit 1440.

The TA 1410 and the history capacitor 1420 illustrated in FIG. 28A are respectively the same as or similar to the TA 110 and the history capacitor 120 illustrated in FIG. 4. The charge circuits 1430 may operate as either charge holding connection circuits or charge inverting circuits or as both charge holding connection circuits and charge inverting circuits in accordance with a frequency characteristic to be corrected.

Terminals A-1 to A-L of the L charge circuits 1430-1 to 1430-L are connected to an output terminal T_TA$_{out}$ of the TA 1410, and terminals B-1 to B-L of the L charge circuits 1430-1 to 1430-L are connected to ground. Each of the L charge circuits 1430-1 to 1430-L has the configuration of the charge holding connection circuit 1430B illustrated in FIG. 31B or the charge inverting circuit 1430A illustrated in FIG. 29B and performs an operation for holding charge and then establishing connection without inverting the polarity of the charge or an operation for holding charge and then establishing connection through inversion of the polarity of the charge. The numbers of capacitors included in the charge circuits 1430-1 to 1430-L (i.e., periods in which charges are held) may be the same or may be different from each other. The values of the capacitors in the charge circuits 1430-1 to 1430-L may be the same or may be different from each other.

The clock generating circuit 1440 generates clock signals (control signals) on the basis of a reference frequency signal f$_{REF1}$ or f$_{REF2}$ generated by the reference frequency oscillator (FIGS. 3A and 3B) and supplies the clock signals (control signals) to the charge circuits 1430-1 to 1430-L. The control signals generated by the clock generating circuit 1440 are described later.

Figure 29A:
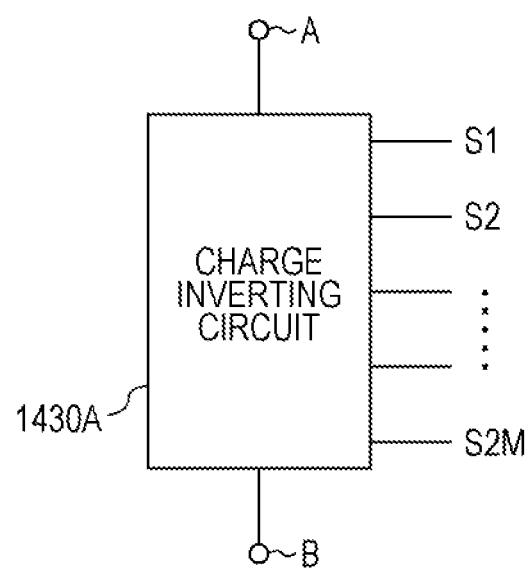
FIG. 29A is a diagram illustrating one example of the configuration of a charge inverting circuit according to the eighth embodiment.
Figure 29B:
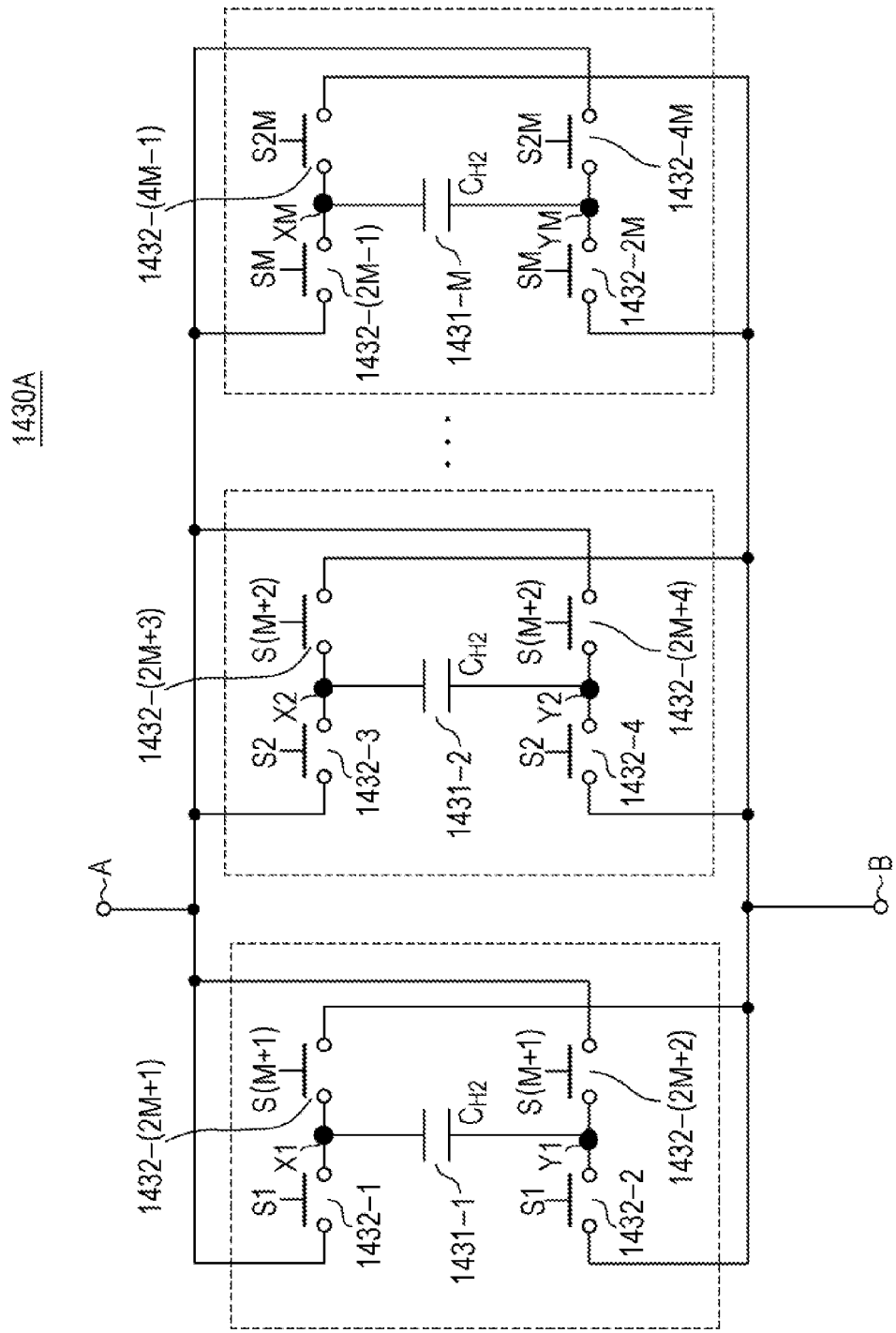
FIG. 29B is a diagram illustrating one example of the internal configuration of the charge inverting circuit according to the eighth embodiment.

Now, a description will be given of a configuration in which the charge circuits 1430 are used as a charge inverting circuit 1430A having M capacitors. FIG. 29A is a diagram illustrating one example of the configuration of the charge inverting circuit 1430A according to the eighth embodiment. FIG. 29B is a diagram illustrating one example of the internal configuration of the charge inverting circuit 1430A according to the eighth embodiment. The charge inverting circuit 1430A illustrated in FIG. 29B includes M capacitors 1431-1 to 1431-M and 4M switches 1432-1 to 1432-4M, which control connections of the M capacitors 1431-1 to 1431-M.

Since the configuration of the charge inverting circuit 1430A is an extended configuration of the configuration of the charge inverting circuit 130 having two capacitors which was described above in the first embodiment and the configuration of the charge inverting circuit 1330 having three capacitors which was described above in the seventh embodiment, a detailed description thereof is not given hereinafter.

Figure 30:
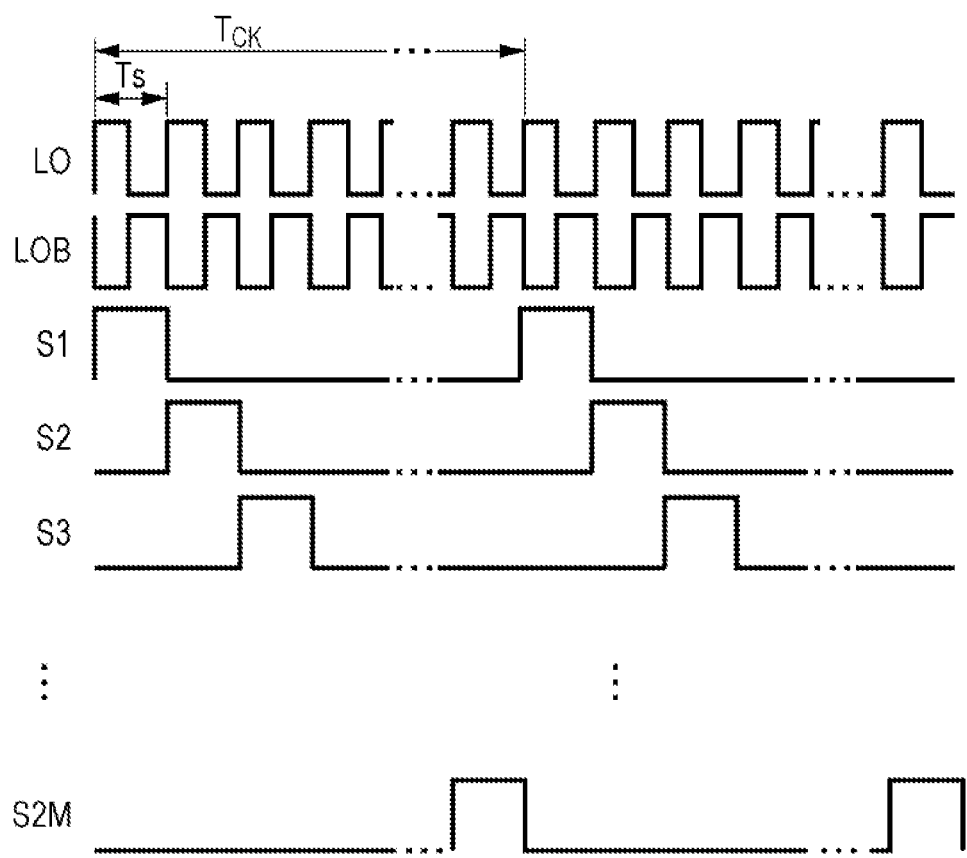
FIG. 30 is a timing chart of control signals for the charge inverting circuit illustrated in FIG. 29B.

A description will be given of control signals generated by the clock generating circuit 1440 for the configuration of the charge inverting circuit 1430A illustrated in FIG. 29B. FIG. 30 is a timing chart of control signals for the charge inverting circuit 1430A illustrated in FIG. 29B. The control signals have pulses with a pulse width Ts and a cycle T$_{CK}$. The pulse width Ts is the same as the sampling interval. Although FIG. 30 illustrates square-wave clock signals, the charge inverting circuit 1430A also operates even when the waveform signals are rounded.

As illustrated in FIG. 30, the clock generating circuit 1440 supplies, to the charge inverting circuit 1430A illustrated in FIG. 29B, control signals S1 to S2M having a duty ratio (="pulse width Ts"/"control-signal cycle T$_{CK}$") of ½M and having 2M phases that are 360/2M degrees out of phase with each other.

Since the operation of the charge inverting circuit 1430A in FIG. 29B is the same as or similar to the operation of the charge inverting circuit 130 having two capacitors which was described above in the first embodiment and the operation of the charge inverting circuit 1330 having three capacitors which was described in the seventh embodiment, a detailed description thereof is not given hereinafter.

The M capacitors included in the charge inverting circuit 1430A alternately perform an operation for holding the shared charge in a period (M−1)Ts and an operation for establishing connection through inversion of the polarity of the held charge.

That is, in the charge sharing in the discrete-time analog circuit 1400, the charge inverting circuit 1430A establishes connection through inversion of the polarity of the charge obtained M sampling intervals earlier and held thereby.

When the charge inverting circuit 1430A illustrated in FIG. 29B is connected as any of the charge inverting circuits 1430-1 to 1430-L illustrated in FIGS. 28A and 28B, the IIR function for the discrete-time analog circuit 1400 illustrated in FIGS. 28A and 28B has an Mth-degree term for a positive coefficient.

Figure 31A:
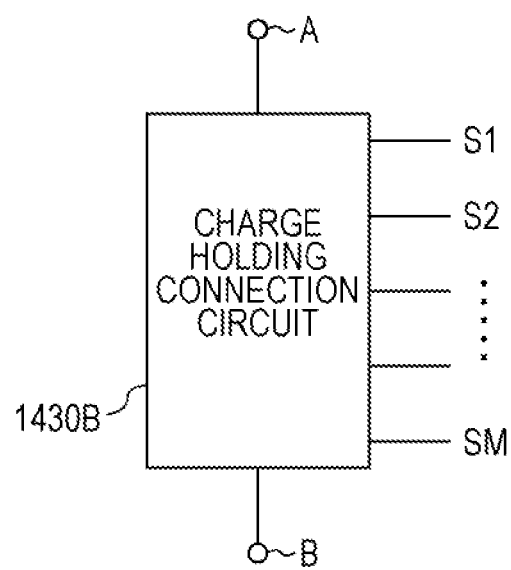
FIG. 31A is a diagram illustrating one example of the configuration a charge holding connection circuit according to the eighth embodiment.
Figure 31B:
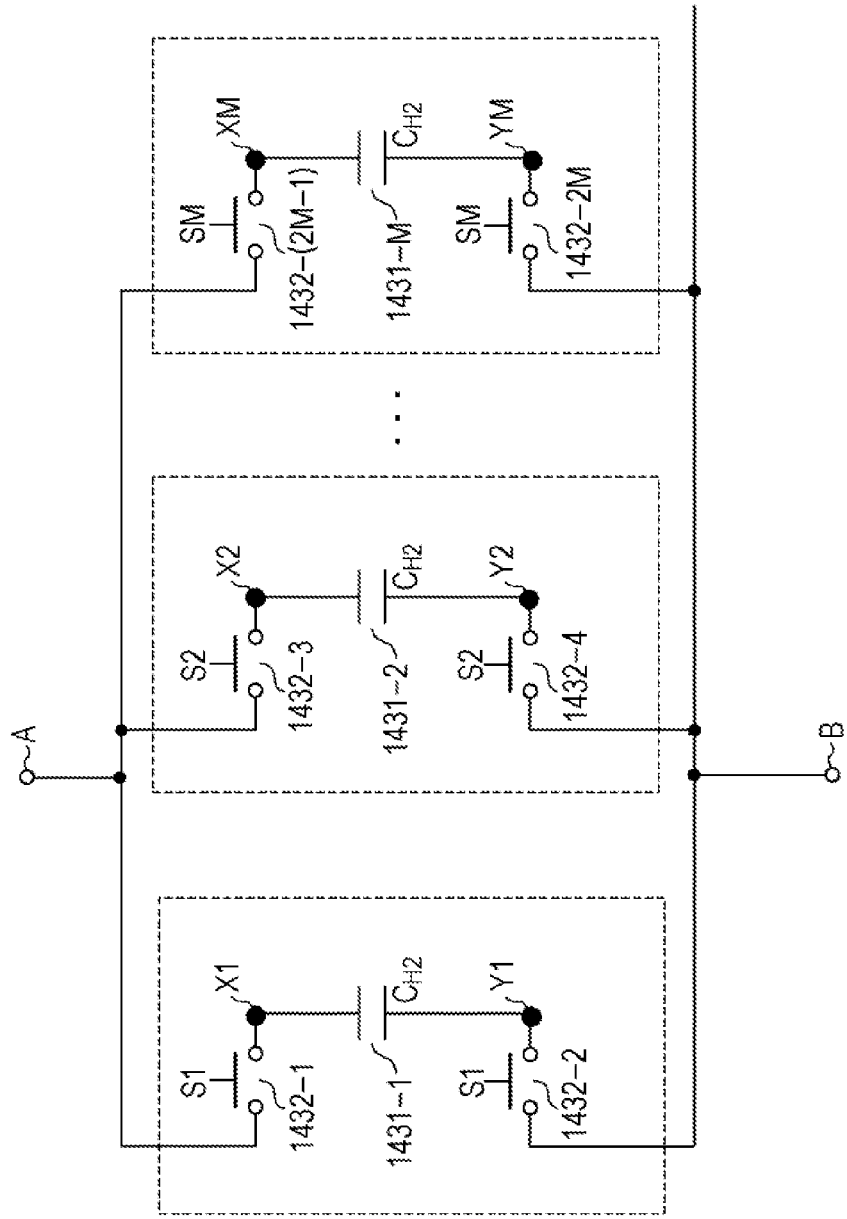
FIG. 31B is a diagram illustrating one example of the internal configuration of the charge holding connection circuit according to the eighth embodiment.

Use of the charge holding connection circuit 1430B illustrated in FIG. 31B as each of the charge circuits 1430-1 to 1430-L illustrated in FIGS. 28A and 28B allows the Mth-degree term for a negative coefficient to be formulated in the IIR function.

FIG. 31A is a diagram illustrating one example of the configuration of the charge holding connection circuit 1430B according to the eighth embodiment. FIG. 31B is a diagram illustrating one example of the internal configuration of the charge holding connection circuit 1430B according to the eighth embodiment. The charge holding connection circuit 1430B illustrated in FIG. 31B has terminals A and B, M capacitors 1431-1 to 1431-M, and 2M switches 1432-1 to 1432-2M, which control connections of the M capacitors 1431-1 to 1431-M.

The configuration and the operation of the charge holding connection circuit 1430B illustrated in FIG. 31B will be described in conjunction with an example of the capacitor 1431-1.

The capacitor 1431-1 has terminals X1 and Y1, which are connected to the switches 1432-1 and 1432-2. The switch 1432-1 connects the terminal X1 and a terminal A in a period in which the control signal S1 is high and breaks the connection in a period in which the control signal S1 is low. The switch 1432-2 connects the terminal Y1 and a terminal B in a period in which the control signal S1 is high and breaks the connection in a period in which the control signal S1 is low.

Each of the capacitors 1432-2 to 1432-M is also similar to the capacitor 1431-1. The connections of the capacitors 1432-2 to 1432-M are controlled using control signals that are 360/M degrees out of phase with each other.

Figure 32:
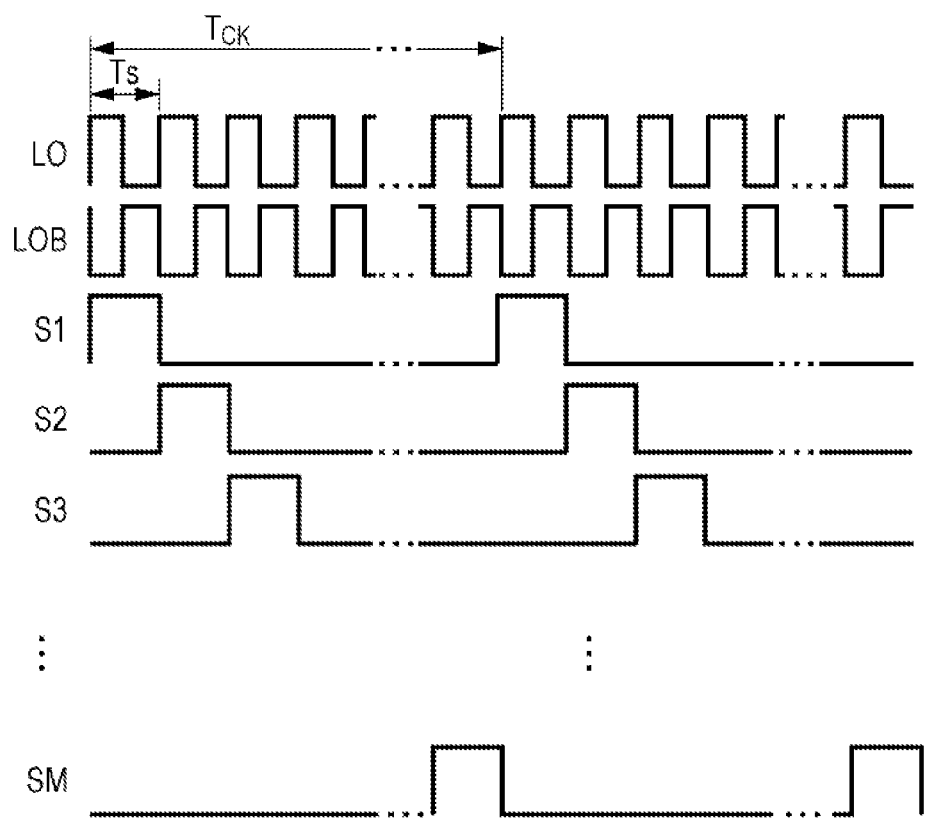
FIG. 32 is a timing chart of control signals for the charge holding connection circuit illustrated in FIG. 31B.

FIG. 32 is a timing chart of control signals for the charge holding connection circuit 1430B illustrated in FIG. 31B. The control signals have pulses with a pulse width Ts and a cycle $T_{CK}$. The pulse width Ts is the same as the sampling interval. Although FIG. 32 illustrates square-wave clock signals, the charge holding connection circuit 1430B operates even when the waveforms are rounded.

As illustrated in FIG. 32, the clock generating circuit 1440 supplies, to the charge holding connection circuit 1430B illustrated in FIG. 31B, control signals S1 to SM having a duty ratio (="pulse width Ts"/"control-signal cycle $T_{CK}$") of 1/M and having M phases that are 360/M degrees out of phase with each other.

In accordance with the corresponding control signals illustrated in FIG. 32, the M capacitors included in the charge holding connection circuit 1430B illustrated in FIG. 31B alternately repeat an operation for holding shared charge for a period (M−1)Ts and an operation for connecting the held charge to outside by using the same phase.

That is, in the charge sharing in the discrete-time analog circuit 1400, the charge holding connection circuit 1430B illustrated in FIG. 31B uses the same phase to connect charge obtained M sampling intervals earlier and held thereby.

When the charge holding connection circuit 1430B illustrated in FIG. 31B is connected as any of the charge circuits 1430-1 to 1430-L illustrated in FIGS. 28A and 28B, the IIR function in the discrete-time analog circuit 1400 illustrated in FIGS. 28A and 28B has the Mth-degree term for a negative coefficient.

The history capacitor 1420 is equivalent to the charge holding connection circuit 1430B for M=1.

When any of the charge inverting circuit 1430A illustrated in FIG. 29B and the charge holding connection circuit 1430B illustrated in FIG. 31B is connected as each of the charge circuits 1430-1 to 1430-L illustrated in FIG. 28A or 28B, the number of terms, coefficient signs, and the degree of each term in the IIR function for the discrete-time analog circuit 1400 illustrated in FIG. 28A or 28B can be freely designed as given by:

$$H_{H\_M} = \frac{\frac{1}{C_{H1} + C_{H2}}}{1 \pm \frac{C_{H1}}{C_{H1} + C_{H2}} z^{-1} \pm \ldots \pm \frac{C_{H2}}{C_{H1} + C_{H2}} z^{-M} \pm \ldots \pm \frac{C_{H2}}{C_{H1} + C_{H2}} z^{-M'}} \quad (14)$$

where M and M' are arbitrary integers.

When the charge inverting circuits 1430A illustrated in FIG. 29B or the charge holding connection circuits 1430B illustrated in FIG. 31B are combined with their orders being changed, it is possible to enhance the degree of freedom of filter characteristics that can be realized.

The embodiments described above may be combined as appropriate. For example, the discrete-time analog circuit that is described in the eighth embodiment and that can realize an arbitrary transfer function may be configured to have the differential configuration described above in the second embodiment. Alternatively, the discrete-time analog circuit that is described in the eighth embodiment and that can realize an arbitrary transfer function may be configured to have the multistage configuration described in the third embodiment. Also, the discrete-time analog circuit that is described in the eighth embodiment and that can realize an arbitrary transfer function may be used as a wideband mixer in a receiving device by adding a switch to the discrete-time analog circuit.

In addition, although a case in which the history capacitor 120 has the capacitance value $C_{H1}$ and all of the capacitors included in each charge inverting circuit have the capacitance value $C_{H2}$ has been described in each embodiment described above, the capacitance values of the capacitors may be changed. When the capacitance values of the capacitors are changed, a desired transfer function can be obtained for the discrete-time analog circuit.

Also, a switch (e.g., the switch 550 in FIG. 13) when the discrete-time analog circuit is used as a mixer, a mixer needed when the discrete-time analog circuit is used as a baseband filter, or a mixer additionally needed when an intermediate frequency is used can be configured as a passive mixer. In a passive mixer, the linearity changes depending on the bias potential of a switch. In order to obtain high linearity, the passive mixer requires appropriate setting of a bias potential therefor.

Figure 33A:
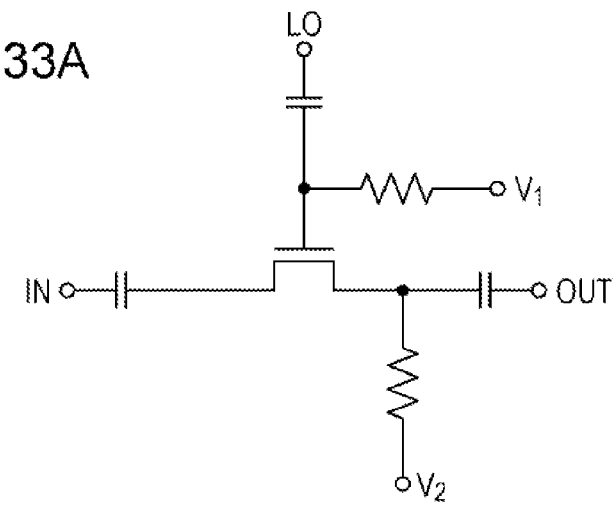
FIG. 33A is a diagram illustrating an example of a first configuration of a single-ended mixer using a bias supply method.
Figure 33B:
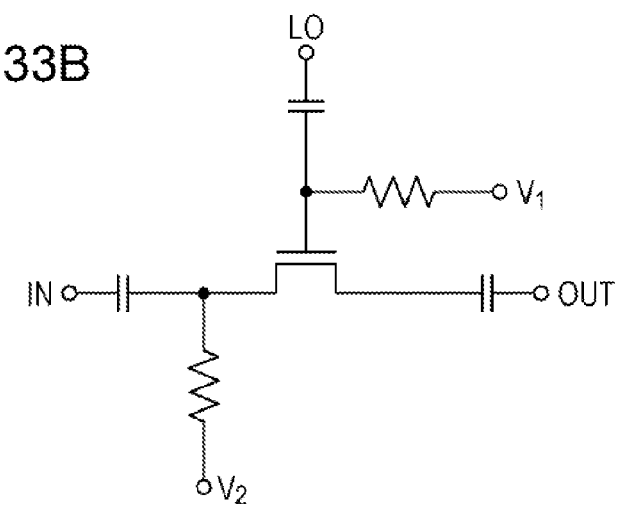
FIG. 33B is a diagram illustrating an example of a second configuration of the single-ended mixer using the bias supply method.
Figure 33C:
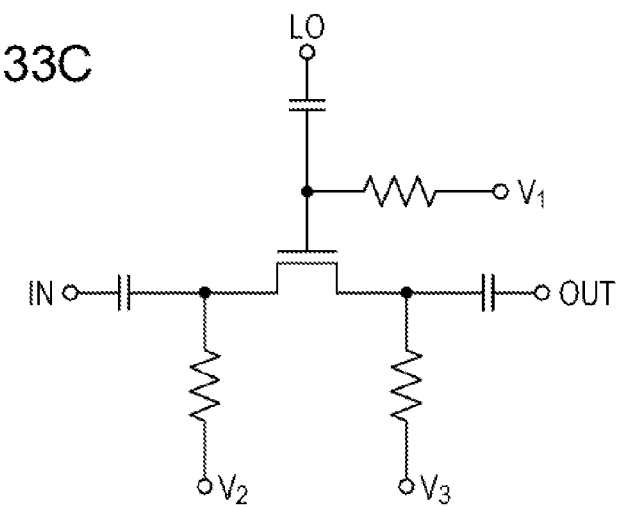
FIG. 33C is a diagram illustrating an example of a third configuration of the single-ended mixer using the bias supply method.

FIG. 33A illustrates an example of a first configuration of a single-ended mixer using a bias supply method. FIG. 33B illustrates an example of a second configuration of the single-ended mixer using the bias supply method. FIG. 33C illustrates an example of a third configuration of the single-ended mixer using the bias supply method.

In each of the configurations illustrated in FIGS. 33A to 33C, an input terminal IN or an output terminal OUT is connected to a source or a drain of a switch (transistor). In the configuration illustrated in FIG. 33A, a bias potential $V_1$ is supplied to the gate of the switch (transistor), and a bias potential $V_2$ is supplied to the source or the drain thereof. In the configuration illustrated in FIG. 33B, a bias potential $V_1$ is supplied to the gate of a switch (transistor), and a bias potential $V_2$ is supplied to the source or the drain thereof. in the configuration illustrated in FIG. 33C, a bias potential $V_1$ is supplied to the gate of a switch (transistor), a bias potential $V_2$ is supplied to the source or the drain thereof, and a bias potential $V_3$ is supplied to the source or the drain.

In a passive mixer, in order to determine each bias potential of the mixer (MOS switch) without depending on another circuit that is connected, a high-pass filter (HPF) is used to eliminate a DC potential and a bias potential desired to be set is supplied. A basic method for supplying the bias potentials may be the method illustrated in FIG. 33A or 33B or may be the method illustrated in FIG. 33C ($V_2=V_3$).

In a passive mixer, when the switch (transistor) is in an on state, the potentials of the drain and the source of the transistor become equal to each other, and thus it is sufficient to supply a DC potential to either the drain or the source, as in FIG. 33A or 33B. However, since the gain of the passive mixer depends on the on-resistance of the switch, it is effective to employ a configuration in which current is made to flow with a potential difference being given between the drain and the source by setting $V_2 \neq V_3$ in FIG. 33C.

Since the passive mixer allows the gain, linearity, and matching to be adjusted through bias control, the bias potentials may also be appropriately adjusted depending on the operation situation of a circuit (e.g., a wireless device, a low-pass filter (LPF), or a mixer). In the passive mixer, the input terminal IN and the output terminal OUT may be used as the source and the drain, respectively, or the input terminal IN and the output terminal OUT may be used as the drain and the source, respectively.

Figure 34A:
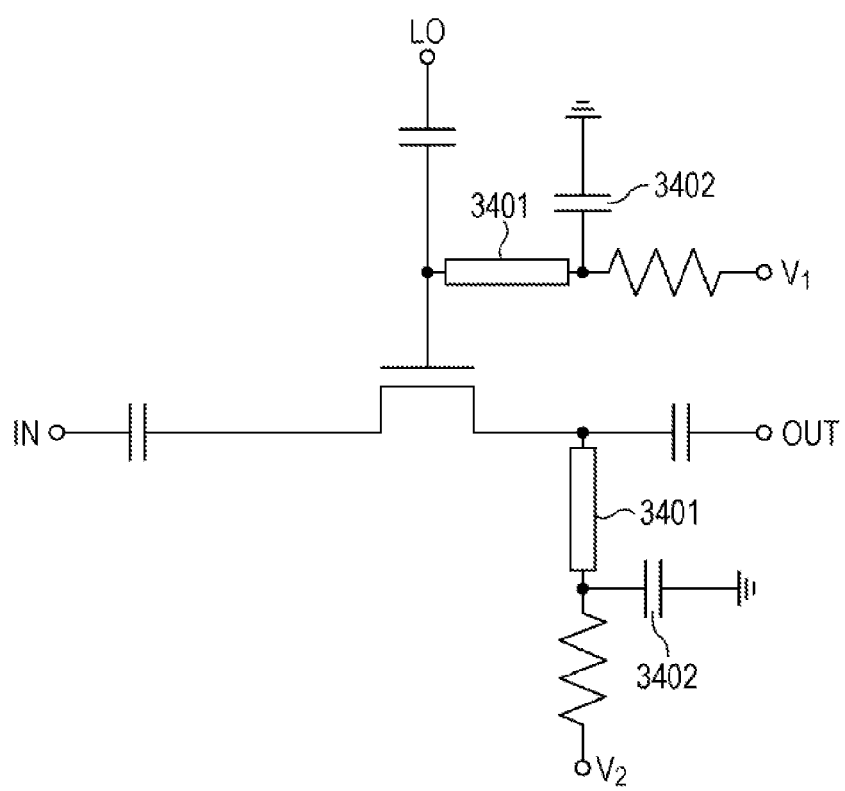
FIG. 34A is a diagram illustrating an example of a first configuration of a single-ended mixer for a high-frequency circuit, the mixer using the bias supply method.
Figure 34B:
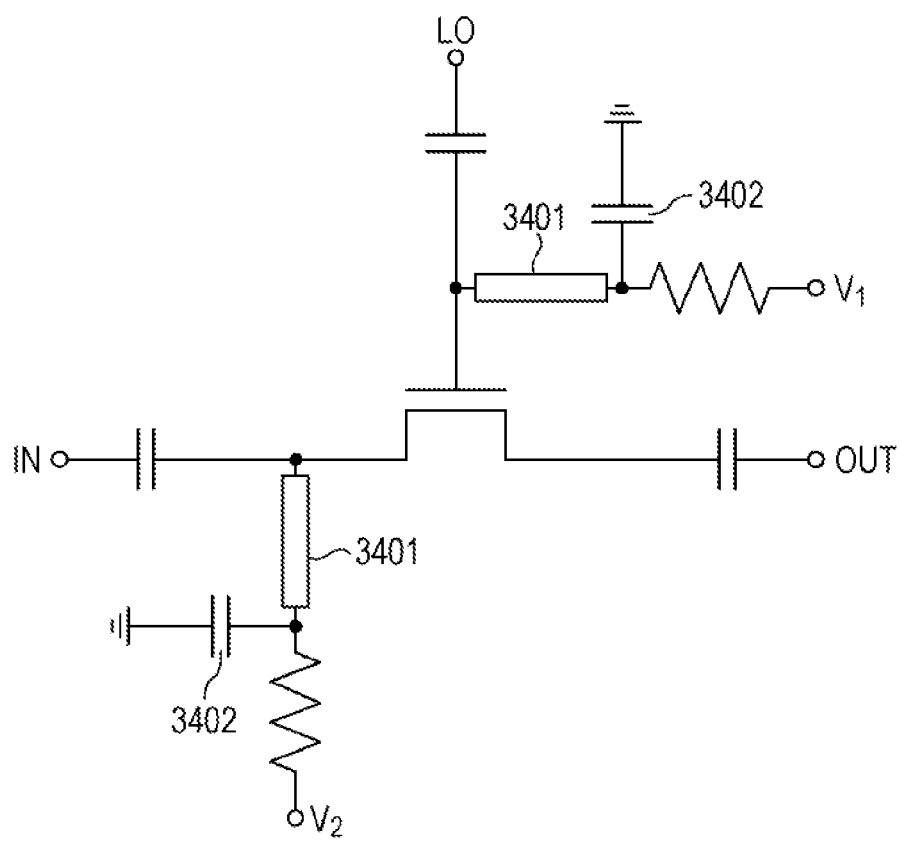
FIG. 34B is a diagram illustrating an example of a second configuration of the single-ended mixer for a high-frequency circuit, the mixer using the bias supply method.
Figure 34C:
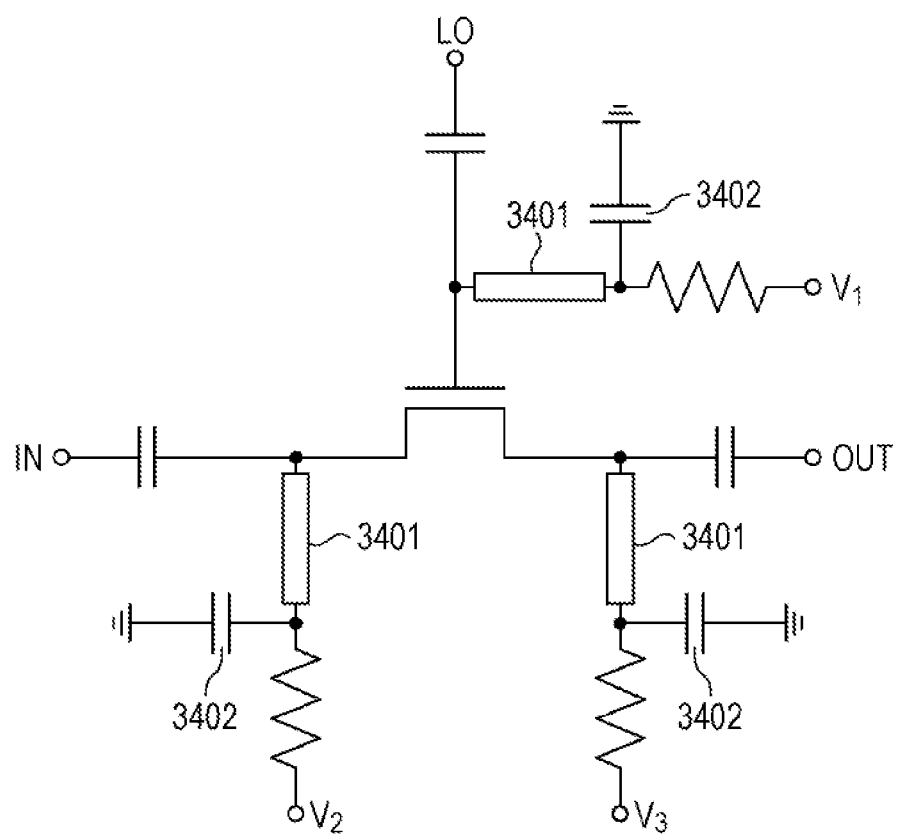
FIG. 34C is a diagram illustrating an example of a third configuration of the single-ended mixer for a high-frequency circuit, the mixer using the bias supply method.

FIG. 34A is a diagram illustrating an example of a first configuration of a single-ended mixer for a high-frequency circuit, the mixer using the bias supply method, FIG. 34B is a diagram illustrating an example of a second configuration of the single-ended mixer for a high-frequency circuit, the mixer using the bias supply method, and FIG. 34C is a diagram illustrating an example of a third configuration of the single-ended mixer for a high-frequency circuit, the mixer using the bias supply method.

FIG. 34A illustrates a configuration for applying the switch (transistor) in FIG. 33A to a high-frequency circuit, FIG. 34B illustrates a configuration for applying the switch (transistor) in FIG. 33B to a high-frequency circuit, and FIG. 34C illustrates a configuration for applying the switch (transistor) in FIG. 33C to a high-frequency circuit. When the configurations in FIGS. 33A to 33C are applied to a high-frequency circuit, lines through which bias potentials are supplied need to be regarded as transmission lines 3401 having predetermined impedances, as illustrated in FIGS. 34A to 34C.

Each transmission line 3401 (which may be an inductor) through which the bias potential is supplied to the switch can be used for a matching circuit. In each of FIGS. 34A, 34B, and 34C, when a decoupling capacitor 3402 is connected to an end of each transmission line 3401, this structure serves as a short stub.

Figure 35A:
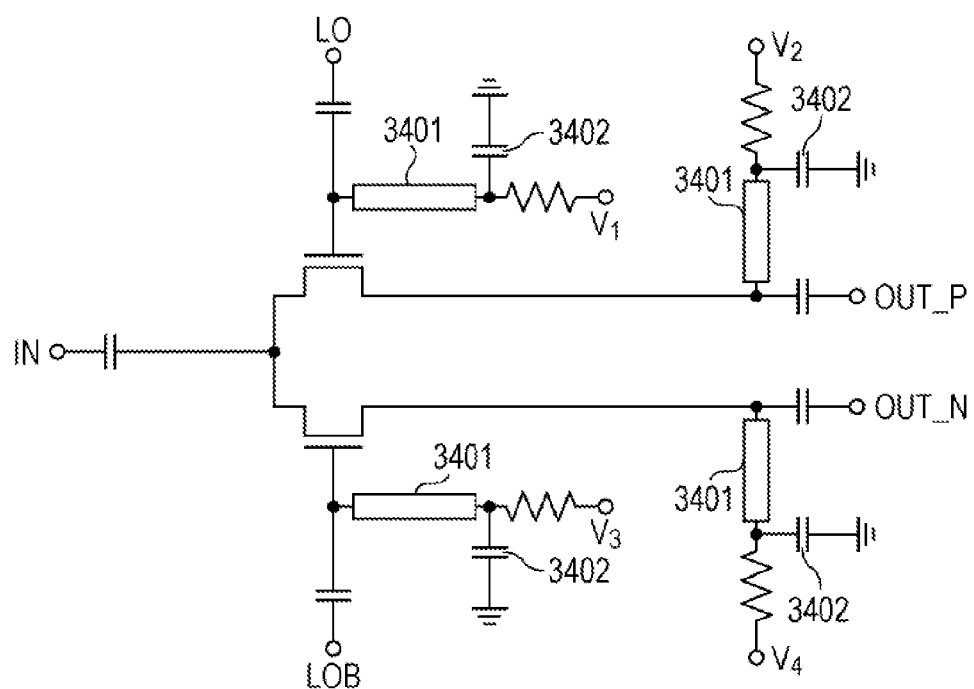
FIG. 35A is a diagram illustrating one example of a first configuration of a single-balanced mixer using the bias supply method.
Figure 35B:
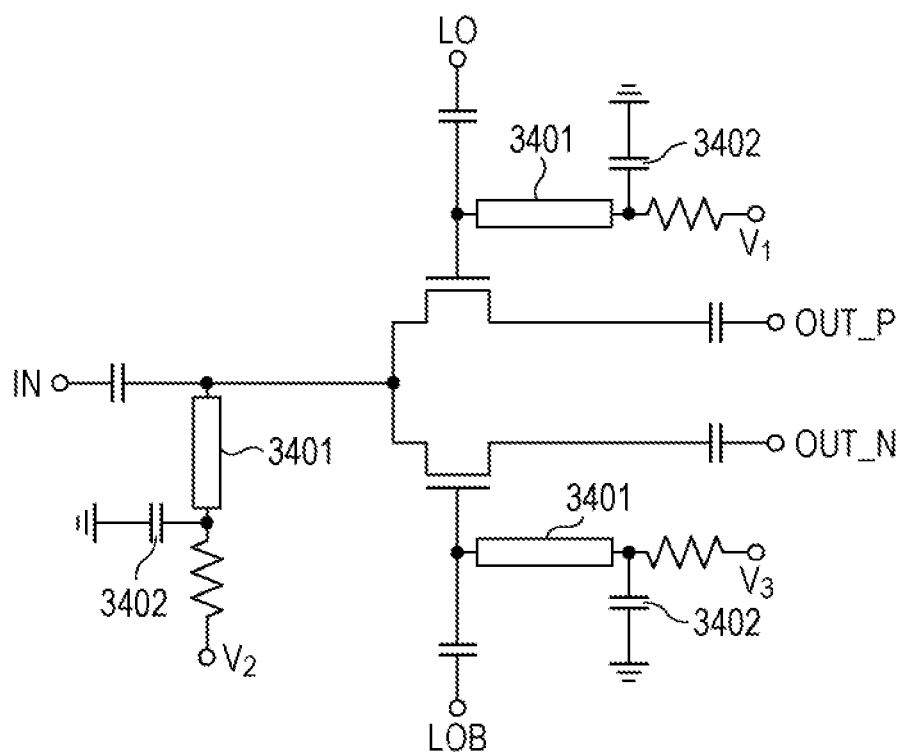
FIG. 35B is a diagram illustrating one example of a second configuration of the single-balanced mixer using the bias supply method.
Figure 35C:
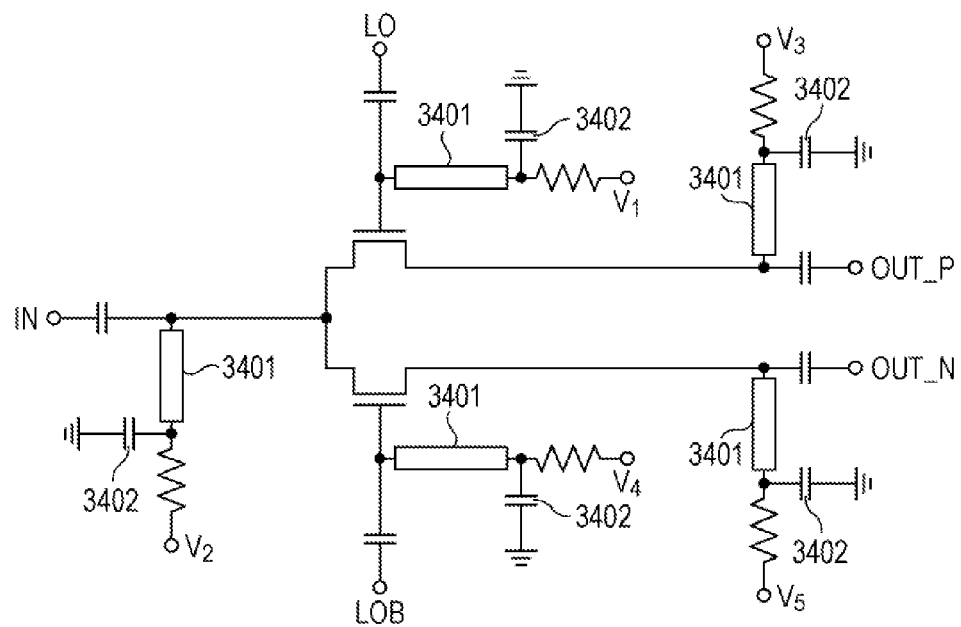
FIG. 35C is a diagram illustrating one example of a third configuration of the single-balanced mixer using the bias supply method.

FIG. 35A is a diagram illustrating one example of a first configuration of a single-balanced mixer using the bias supply method, FIG. 35B is a diagram illustrating one example of a second configuration of the single-balanced mixer using the bias supply method, and FIG. 35C is a diagram illustrating one example of a third configuration of the single-balanced mixer using the bias supply method.

Although the configurations in FIGS. 35A, 35B, and 35C include the transmission lines 3401, as in FIGS. 34A, 34B, and 34C, the transmission lines 3401 and the decoupling capacitors 3402 may be omitted. In the single-balanced mixer in each of FIGS. 35A, 35B, and 35C, the DC potential between the drain and the source of the mixer (MOS switch) is biased to the same potential, as in the single-ended mixer in each of FIGS. 34A, 34B, and 34C. However, the single-balanced mixer may be designed with a potential difference being given between the drain and the source.

Figure 36A:
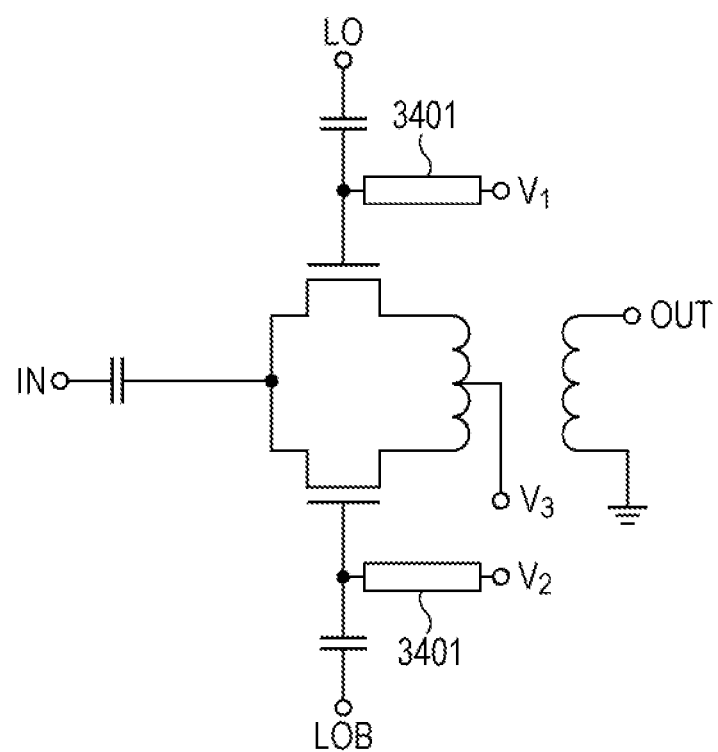
FIG. 36A is a diagram illustrating a first configuration of a single-balanced mixer using a balun.
Figure 36B:
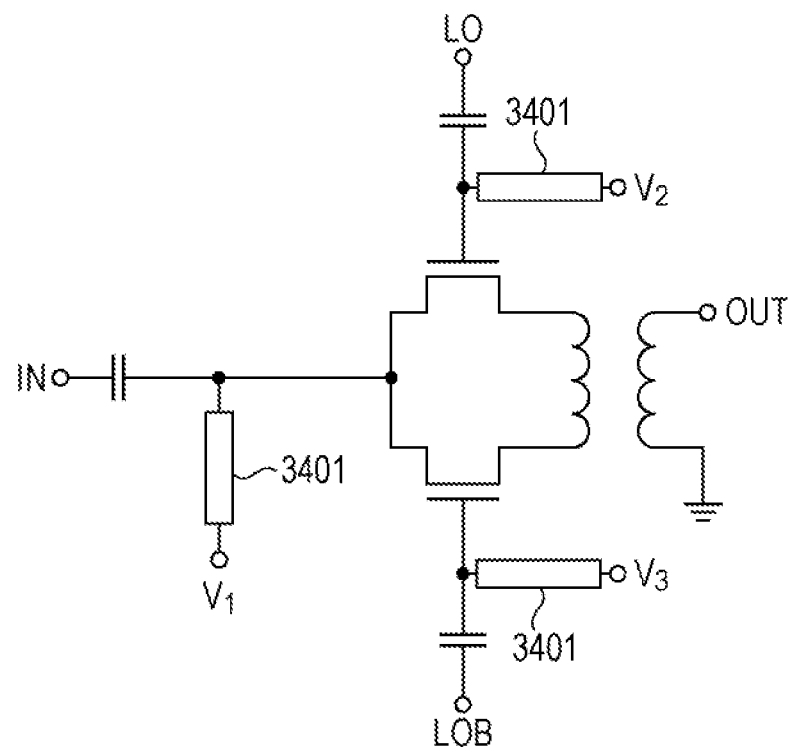
FIG. 36B is a diagram illustrating a second configuration of the single-balanced mixer using a balun.
Figure 36C:
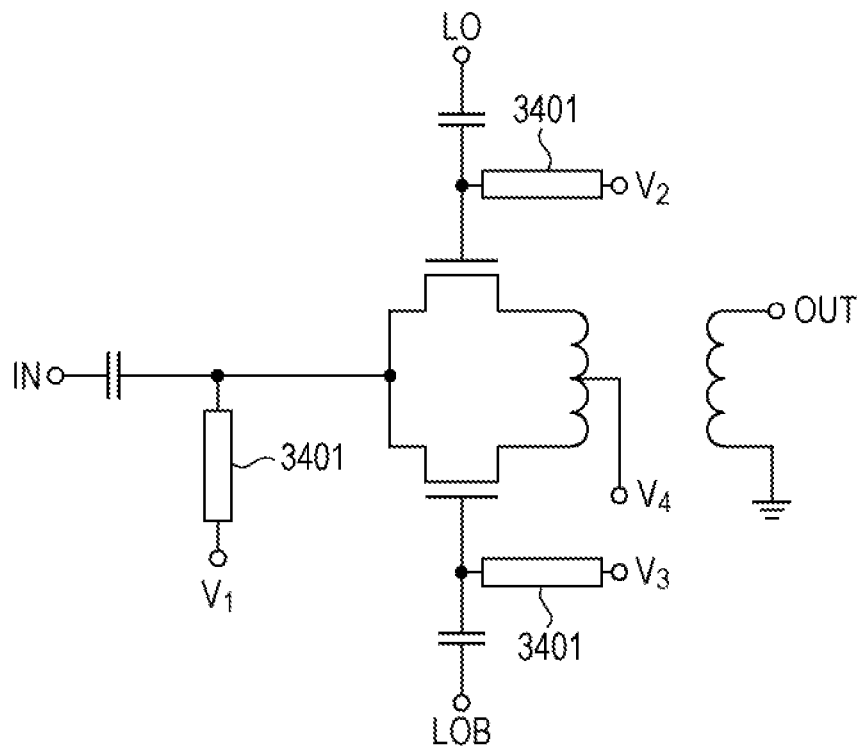
FIG. 36C is a diagram illustrating a third configuration of the single-balanced mixer using a balun.
Figure 36D:
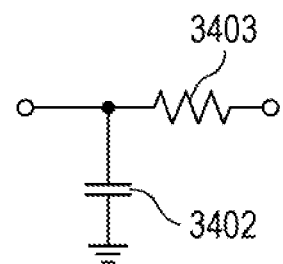
FIG. 36D is a diagram illustrating a bias supply method using a decoupling capacitor and a resistor.

FIG. 36A is a diagram illustrating a first configuration of a single-balanced mixer using a balun, FIG. 36B is a diagram illustrating a second configuration of the single-balanced mixer using a balun, FIG. 36C is a diagram illustrating a third configuration of the single-balanced mixer using a balun, and FIG. 36D is a diagram illustrating a bias supply method using a decoupling capacitor 3402 and a resistor 3403.

In each of FIGS. 36A, 36B, and 36C, a balun is added to an output terminal of the single-balanced mixer to perform single output. The decoupling capacitor 3402 and the resistor 3403 in FIG. 36D are connected to supply a bias.

In the configuration of each of FIGS. 36A, 36B, and 36C, the balun can also be used for a matching circuit. A bias potential can be supplied from a midpoint at the input side of the balun. When a transformer is provided at the output terminal of the single-balanced mixer illustrated in each of FIGS. 36A, 36B, and 36C, differential output can also be performed. The decoupling capacitor 3402 and the resistor 3403 in FIG. 36D are connected to each of subsequent stages of the transmission lines 3401 and a subsequent stage of the midpoint at the balun in each of FIGS. 36A, 36B, and 36C to supply a bias.

In the single-balanced mixer in each of FIGS. 36A, 36B, and 36C, the DC potential between the drain and source of the mixer (MOS switch) is biased to the same potential, as in the single-ended mixer in each of FIGS. 34A, 34B, and 34C. However, the single-balanced mixer may be designed with a potential difference being given between the drain and the source.

Figure 37A:
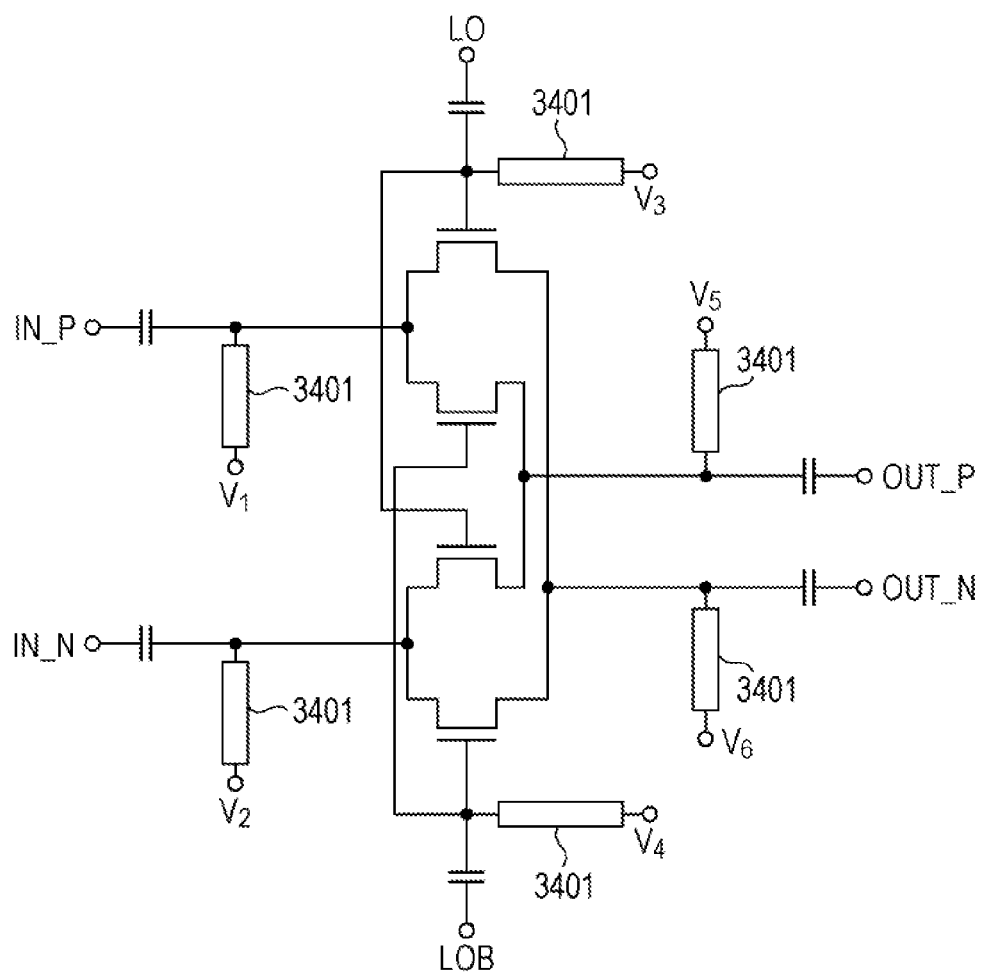
FIG. 37A is a diagram illustrating the configuration of a double-balanced mixer in which biases are supplied through transmission lines.
Figure 37B:
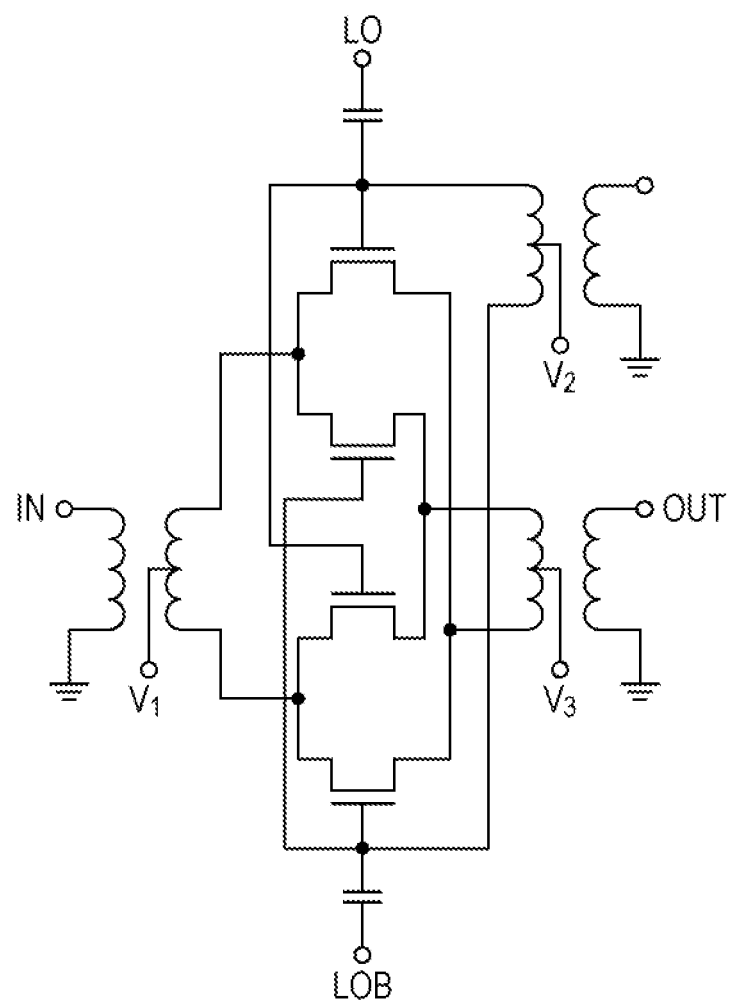
FIG. 37B is a diagram illustrating the configuration of a double-balanced mixer in which biases are supplied via baluns.

FIG. 37A illustrates the configuration of a double-balanced mixer in which biases is supplied through transmission lines 3401, and FIG. 37B illustrates the configuration of a double-balanced mixer in which biases are supplied via baluns.

The double-balanced mixer may be configured using any of a transmission line, a balun, and a transformer for an input terminal, a local terminal LO, and an output terminal.

In the double-balanced mixer in each of FIGS. 37A and 37B, each balun can also be used as a matching circuit. A bias can be supplied from a midpoint at the input side of each balun. The decoupling capacitor 3402 and the resistor 3403 in FIG. 36D may be connected to each of subsequent stages of the transmission lines 3401 in FIG. 37A and to each of the subsequent stages of the midpoints at the baluns in 37B to supply a bias. In the double-balanced mixer in each of FIGS. 37A and 37B, the DC potential between the drain and source of the mixer (MOS switch) is biased to the same potential, as in the single-ended mixer in each of FIGS. 34A, 34B, and 34C. However, the double-balanced mixer may be designed with a potential difference being given between the drain and the source.

In FIGS. 34A to 37B, the matching adjustment may be performed at any of the input terminal, local terminals LO and LOB, and the output terminal.

In addition, in the discrete-time analog circuit described above in each embodiment, the linearity of the switches (e.g., the switches 132-1 to 132-8 in FIG. 5B) used for charge sharing, other than mixing, is improved through supply of appropriate biases. A method for supplying the bias can be realized by a method for supplying a bias to each mixer (MOS switch) in FIGS. 33A to 37B.

Ninth Embodiment

In the present embodiment, a description will be given of the configuration of a discrete-time analog circuit that suppresses a reduction in the amount of ripple in the pass band and a reduction in the amount of attenuation in the stop band when the output resistance of a voltage-current conversion circuit (TA) decreases.

Figure 38:
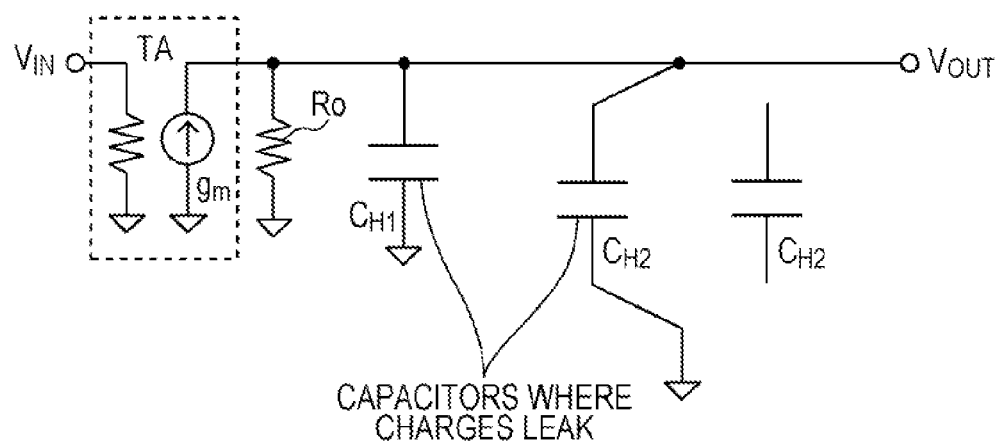
FIG. 38 is a diagram illustrating one example of a connection state in the configuration of the discrete-time analog circuit.

FIG. 38 is a diagram illustrating one example of a connection state in the configuration of the discrete-time analog circuit 100. FIG. 38 illustrates a state in which, in the discrete-time analog circuit 100 illustrated in FIG. 4, one of the two capacitors in the charge inverting circuit 130 illustrated in FIG. 5B is connected. Unlike FIG. 4, FIG. 38 illustrates an output resistor Ro of the voltage-current conversion circuit (TA) 110. When the value of the output resistor Ro of the TA 110 is small, and the charges in the capacitors are small, the time constant determined by the output resistor Ro of the TA 110 and the capacitors $C_{H1}$ and $C_{H2}$ becomes small. When the time constant is small, the charges accumulated in the capacitors $C_{H1}$ and $C_{H2}$ leak in the period Ts in FIG. 6, and the frequency characteristics deteriorate.

Since analog circuits need to be designed with a low power-supply voltage in a fine CMOS process, it is difficult to use transistors in a cascode configuration, and it is thus difficult to design an amplifier (e.g., a voltage-current conversion circuit) having a high output resistance.

Figure 39A:
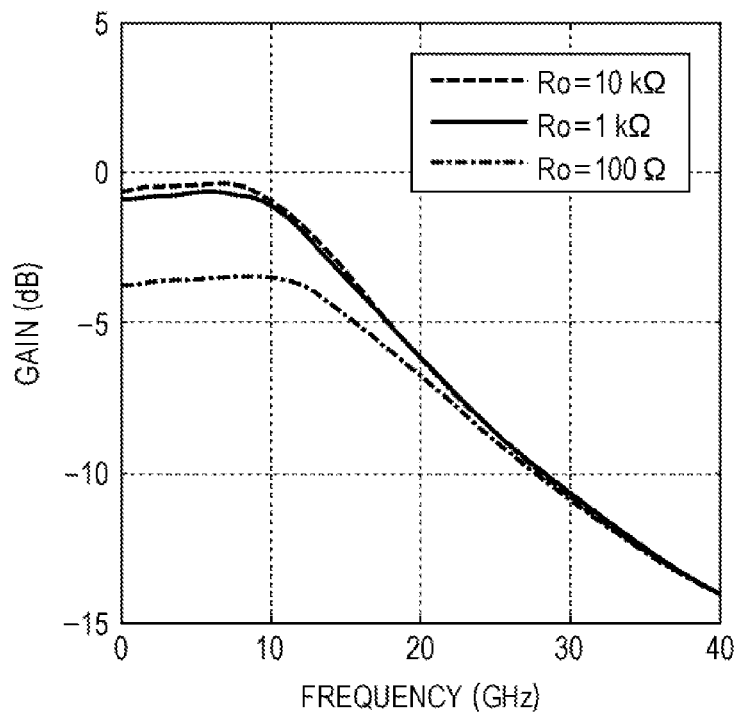
FIG. 39A is a diagram illustrating a result of circuit simulation of low-frequency passing characteristics of the discrete-time analog circuit considering an output resistor of a transconductance amplifier (TA)
Figure 39B:
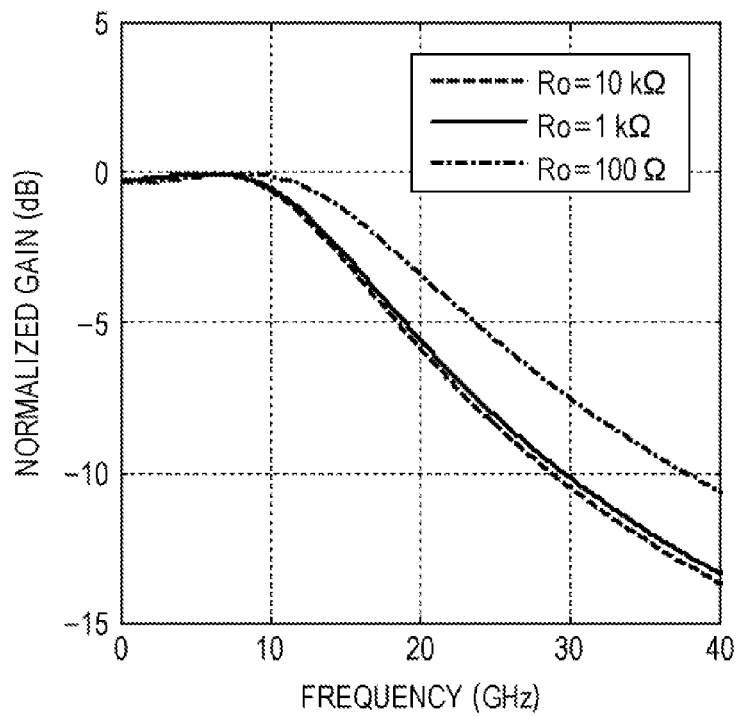
FIG. 39B is a graph illustrating a gain obtained when the result of the circuit simulation of the low-frequency passing characteristics of the discrete-time analog circuit considering the output resistor of the TA is normalized with a maximum gain.

FIG. 39A is a graph illustrating a result of circuit simulation of low-frequency passing characteristics of the discrete-time analog circuit 100 considering the output resistor Ro of the TA, and FIG. 39B is a graph illustrating a gain obtained when the result of the circuit simulation of the low-frequency passing characteristics of the discrete-time analog circuit 100 considering the output resistor Ro of the TA is normalized with a maximum gain.

In FIG. 39A, the horizontal axis represents a frequency, and the vertical axis represents a gain. The characteristic for the value of the output resistor Ro=100Ω exhibits a small gain, compared with the characteristics for the values of the output resistors Ro=10 kΩ and Ro=1 kΩ. That is, when the output resistance of the TA decreases, the gain becomes small.

In FIG. 39B, the horizontal axis represents a frequency, and the vertical axis represents a gain normalized with a maximum gain. The characteristic for the output resistor Ro=100Ω exhibits a small amount of attenuation in the stopband, compared with the output resistors Ro=10 kΩ and Ro=1 kΩ. When the output resistance of the TA decreases, the amount of ripple in the band decreases, and the amount of attenuation in the stopband in the passband width decreases.

Figure 40:
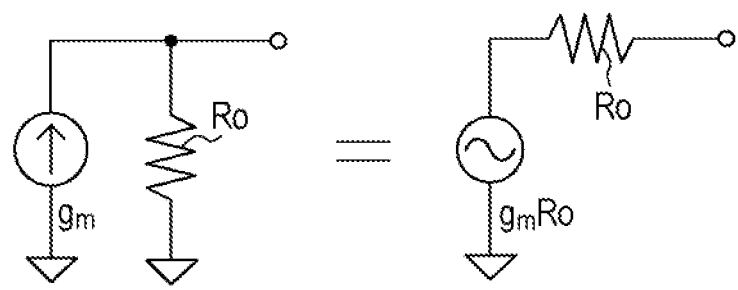
FIG. 40 is a diagram illustrating equivalent circuits of an ideal voltage source and an ideal voltage source.

FIG. 40 illustrates equivalent circuits of an ideal current source and an ideal voltage source. An output resistor Ro of the ideal current source corresponds to a serial resistor Ro of the output of the ideal voltage source. That is, when a new resistor is connected in series with an output of a voltage-current conversion circuit (TA), the serial resistance value of the output resistor of the voltage-current conversion circuit (TA) and the newly added resistor can be regarded as an output resistance of the voltage-current conversion circuit (TA). This makes it possible to increase the output resistance of the voltage-current conversion circuit (TA) while the power-supply voltage is maintained low.

Figure 41:
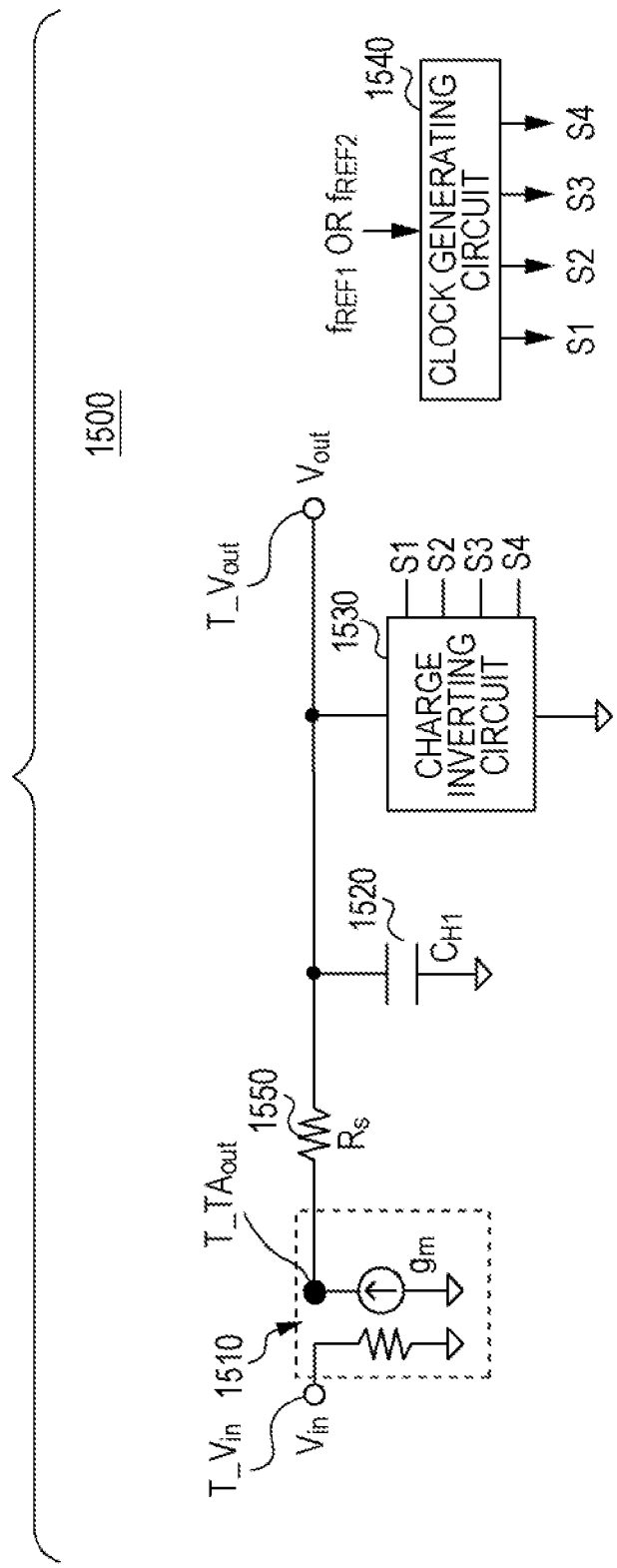
FIG. 41 is a diagram illustrating one example of the configuration of a major portion of a discrete-time analog circuit according to a ninth embodiment.

FIG. 41 is a diagram illustrating one example of the configuration of a major portion of a discrete-time analog circuit 1500 according to the ninth embodiment. The discrete-time analog circuit 1500 illustrated in FIG. 41 corresponds to the discrete-time analog circuit 15 included in the transmitting device 10 illustrated in FIG. 3A and the discrete-time analog circuit 26 included in the receiving device 20 illustrated in FIG. 3B and performs, for example, filtering processing.

The discrete-time analog circuit 1500 illustrated in FIG. 41 includes a transconductance amplifier (TA) 1510, a capacitor $C_{H1}$ 1520, a charge inverting circuit 1530, a clock generating circuit 1540, and a serial resistor 1550. A baseband analog signal is input to the discrete-time analog circuit 1500 via an input terminal $T\_V_{in}$, the charge inverting circuit 1530 performs filtering on the input analog signal, and an output voltage signal $V_{out}$ is output from the output terminal $T\_V_{out}$ via the capacitor 1520 and the charge inverting circuit 1530.

The TA 1510 is a voltage-current conversion circuit, and when an analog signal is input as the input voltage signal $V_{in}$, the TA 1510 converts the input voltage signal $V_{in}$ into current ($g_m \times V_{in}$). In this case, $g_m$ is the value of transconductance (mutual conductance) of the TA 1510.

One terminal of the capacitor 1520 is connected to the output terminal $T\_TA_{out}$ of the TA 1510, and another terminal of the capacitor 1520 is connected to ground.

One terminal of the charge inverting circuit 1530 is connected to an output terminal $T\_TV_{out}$ of the discrete-time analog circuit 1500, and another terminal of the charge inverting circuit 1530 is connected to ground. The charge inverting circuit 1530 is a circuit for performing an operation for holding charge and an operation for establishing connection through inversion of the charge. The charge inverting circuit 1530 performs charge sharing on the basis of control signals supplied from the clock generating circuit 1540 and performs filtering processing on the input analog signal.

The clock generating circuit 1540 generates clocks S1 to S4 (control signals) on the basis of the reference frequency signal ($f_{REF1}$ or $f_{REF2}$) output from the reference frequency oscillator (see FIG. 3A and FIG. 3B) and supplies the clocks S1 to S4 (control signals) to the charge inverting circuit 1530.

A specific configuration of the charge inverting circuit 1530 is the same as or similar to the configuration of the charge inverting circuit 130 illustrated in FIGS. 5A and 5B. The control signals generated by the clock generating circuit 1540 are the same as or similar to the control signals illustrated in FIG. 6. The discrete-time analog circuit 1500 performs an operation that is similar to that of the discrete-time analog circuit 100 described above in the first embodiment.

A difference from the discrete-time analog circuit 100 in the first embodiment is that the serial resistor 1550 is provided at an output of the TA 1510. The serial resistor 1550 can increase the output resistance of the TA 1510. The resistance value of the serial resistor 1550 is Rs.

Figure 42:
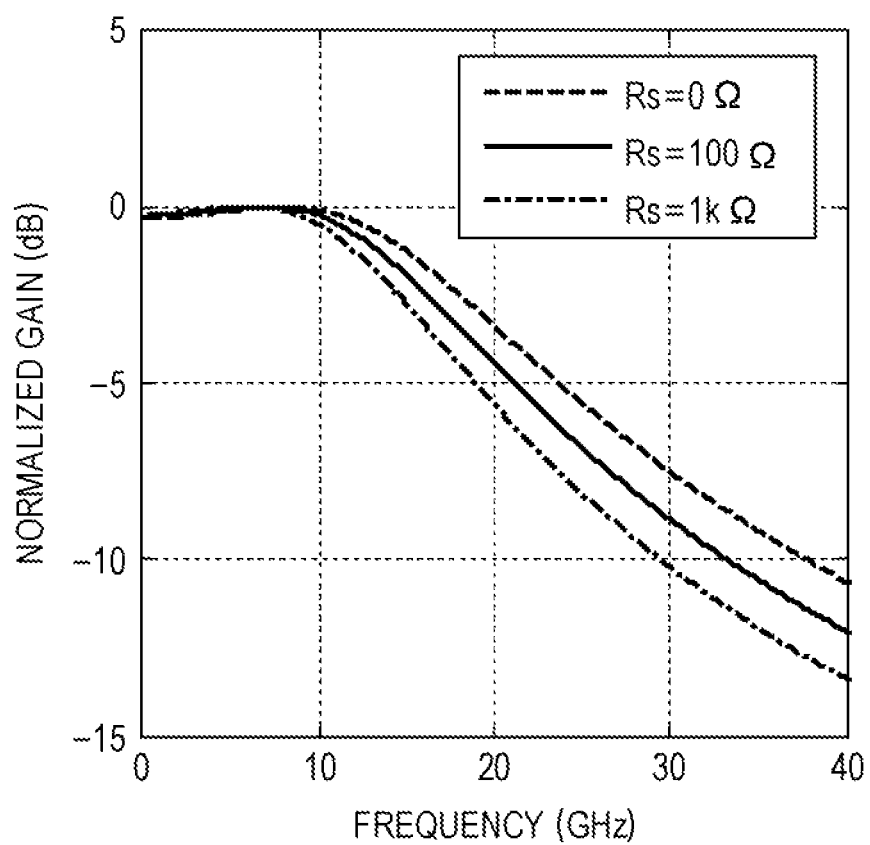
FIG. 42 is a graph illustrating one example of a simulation result of frequency characteristics for a serial resistance.

FIG. 42 illustrates one example of a simulation result of frequency characteristics for the serial resistance Rs. The horizontal axis represents a frequency, and the vertical axis represents a gain normalized with a maximum gain. For the same frequency passing band, when the serial resistance Rs is increased in the discrete-time analog circuit 1500, the amount of attenuation in the stopband can be increased, as illustrated in FIG. 42.

Figure 43:
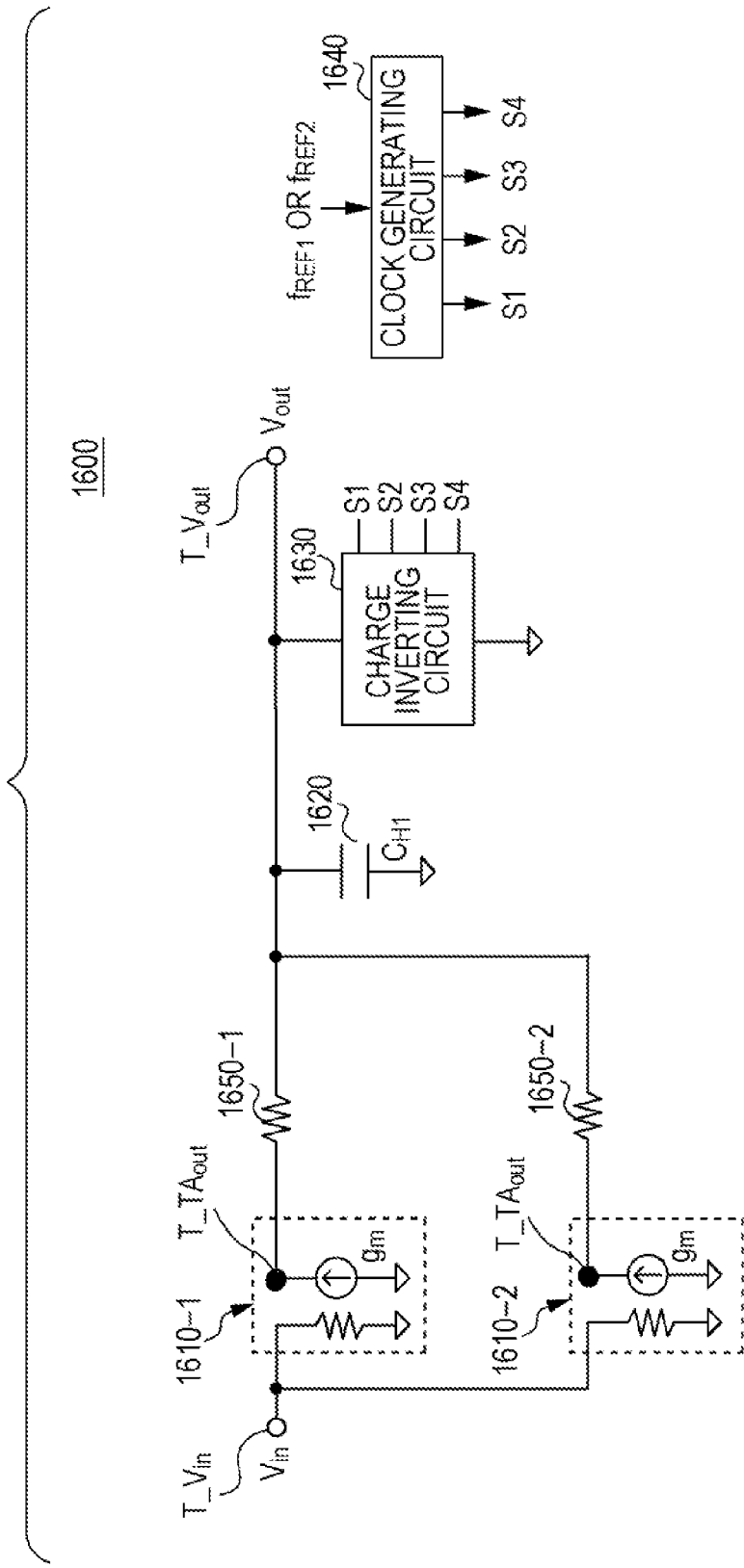
FIG. 43 is a diagram illustrating a discrete-time analog circuit, which is one modification of the ninth embodiment.

FIG. 43 illustrates a discrete-time analog circuit 1600 as one modification of the ninth embodiment. A difference from the discrete-time analog circuit 1500 illustrated in FIG. 41 is that the discrete-time analog circuit 1600 has a plurality of TAs 1610-1 and 1610-2. In the discrete-time analog circuit 1600, connecting serial resistors 1650-1 and 1650-2 in series with respective outputs of the TAs 1610-1 and 1610-2 makes it possible to reduce deterioration of the frequency characteristics and makes it possible to improve the gain.

One of the serial resistors 1650-1, the serial resistors 1650-2 and both the serial resistors 1650-1 and the serial resistors 1650-2 may be connected subsequent to the outputs of the TAs 1610-1 and 1610-2.

Figure 44:
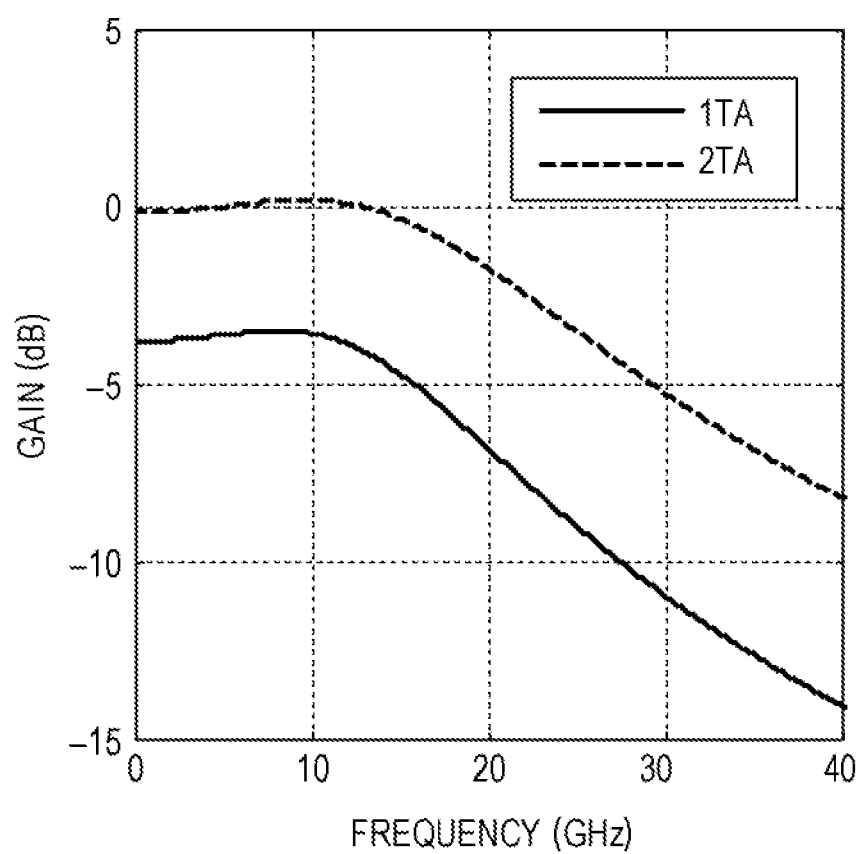
FIG. 44 is a graph illustrating one example of a simulation result of frequency characteristics with respect to the number of TAs.

FIG. 44 illustrates one example of a simulation result of frequency characteristics with respect to the number of TAs. The horizontal axis represents a frequency, and the vertical axis represents a gain of the discrete-time analog circuit. In FIG. 44, 1TA denoted by a solid line represents a configuration including one TA. Also, 2TA denoted by a dashed line in FIG. 44 indicates a configuration including two TAs arranged in parallel. In the discrete-time analog circuit, an increase in the number of TAs increases the gain.

Also, when the discrete-time analog circuits 1500 or 1600 are connected in a cascade, a multistage configuration can be realized, higher order filter characteristics can be realized, and the gain can be increased.

In the present embodiment, since the resistors are connected in series with the outputs of the voltage-current conversion circuits (TAs), as described above, it is possible to increase the output resistance of the TAs and it is possible suppress a reduction in the amount of ripple in the passband and a reduction in the amount of attenuation in the stopband.

According to the present disclosure, it is possible to provide a discrete-time analog circuit having a simple configuration and having a high degree of freedom in adjustment of in-band deviation.

Tenth Embodiment

A description will be given of a tenth embodiment of the present disclosure. The tenth embodiment provides a circuit configuration in which the discrete-time analog circuit 1500 in the ninth embodiment is configured to have a differential configuration.

[Configuration and Operation of Discrete-Time Analog Circuit 1700]

Figure 45:
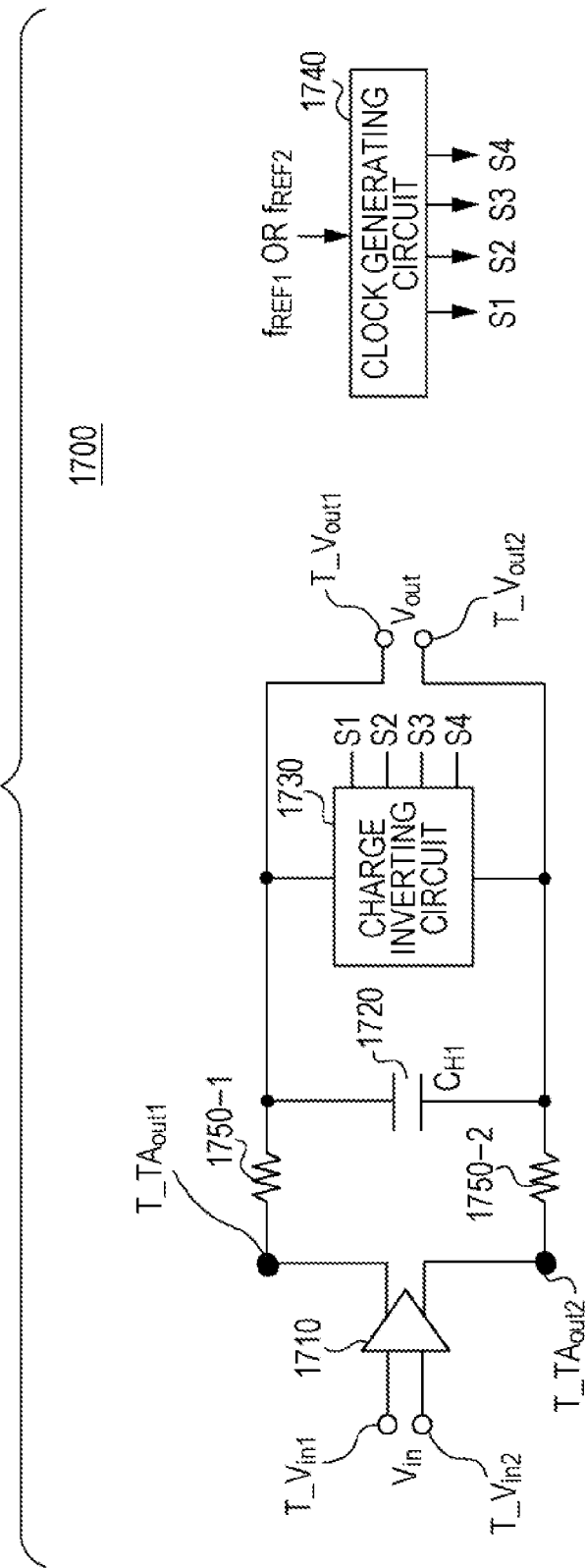
FIG. 45 is a diagram illustrating one example of the configuration of a major portion of a discrete-time analog circuit according to a tenth embodiment.

FIG. 45 is a diagram illustrating one example of the configuration of a major portion of a discrete-time analog circuit 1700 according to the tenth embodiment. The discrete-time analog circuit 1700 illustrated in FIG. 45 includes a TA 1710, a capacitor $C_{H1}$ 1720, a charge inverting circuit 1730, a clock generating circuit 1740, and serial resistors 1750 (1750-1 and 1750-2).

Unlike the discrete-time analog circuit 1500 illustrated in FIG. 41, the discrete-time analog circuit 1700 is a differential-type discrete-time analog circuit to which input voltage signals $V_{in}$ having two types of phase, that is, a normal phase and a reverse phase, are input.

The TA 1710 is a voltage-current conversion circuit. Upon input of the input voltage signals $V_{in}$ having two types of phase, that is, the normal phase and the reverse phase, the TA 1710 converts the input voltage signals $V_{in}$ into currents ($g_m \times V_{in}$) and outputs currents having two types of phase, that is, the normal phase and the reverse phase.

The capacitor 1720 is connected between a normal-phase output terminal $T\_TA_{out1}$ and a reverse-phase output terminal $T\_TA_{out2}$ of the TA 1710.

The charge inverting circuit 1730 has a configuration that is substantially the same as the charge inverting circuit 130 illustrated in FIG. 5B. A terminal A of the charge inverting circuit 1730 is connected to the normal-phase output terminal $T\_TA_{out1}$ of the TA 1710, and a terminal B of the charge inverting circuit 1730 is connected to the reverse-phase output terminal $T\_TA_{out2}$ of the TA 1710.

The clock generating circuit 1740 has a configuration that is substantially the same as the clock generating circuit 140 illustrated in FIG. 4 and supplies clock signals (control signals) similar to those illustrated in FIG. 6 to the charge inverting circuit 1730.

The serial resistors 1750 (1750-1 and 1750-2) prevent deterioration of frequency characteristics even when a TA having a low output resistance is used.

The discrete-time analog circuit 1700 illustrated in FIG. 45 has a configuration in which the connection to ground in the discrete-time analog circuit 1500 in FIG. 41 is replaced with a connection to the reverse-phase output terminal $T\_TA_{out2}$ of the TA 1710. The discrete-time analog circuit 1700 performs an operation that is the same as or similar to the operation of the discrete-time analog circuit 1500 described above in the ninth embodiment.

Similarly to the discrete-time analog circuit 1500, the discrete-time analog circuit 1700 can realize the frequency characteristics illustrated in FIG. 42. In addition, since the discrete-time analog circuit 1700 has a differential configuration, it is possible to remove even-order components after differential combination.

ADVANTAGES

As described above, according to the present embodiment, since the configuration in the ninth embodiment is made to have a differential configuration, frequency characteristics that are similar to those in the ninth embodiment can be realized, and even-order components can be removed after differential combination.

Although, in the present embodiment, the capacitor 1720 has been described above as being connected between the normal-phase output terminal $T\_TA_{out1}$ and the reverse-phase output terminal $T\_TA_{out2}$ of the TA 1710, two capacitors may also be respectively connected to the normal-phase output terminal $T\_TA_{out1}$ and the reverse-phase output terminal $T\_TA_{out2}$ of the TA 1710. In this case, the two capacitors respectively connected to the normal-phase output terminal $T\_TA_{out1}$ and the reverse-phase output terminal $T\_TA_{out2}$ of the TA 1710 may have the same value or may have mutually different values in order to enhance the degree of freedom of the characteristics, and the serial resistors 1750-1 and 1750-2 may have the same value or may have mutually different values in order to enhance the degree of freedom of the characteristics.

Also, when the discrete-time analog circuits 1700 are connected in a cascade, a multistage configuration can be realized, higher order filter characteristics can be realized, and the gain can be increased.

The discrete-time analog circuit and the wireless devices according to the present disclosure are useful for a high-frequency signal processing circuit and a baseband signal processing circuit in a wireless communication device and are also useful for filter processing or frequency conversion processing.

What is claimed is:

1. A discrete-time analog circuit, comprising:
   a voltage-current conversion circuit including a first terminal and a second terminal, which converts a voltage signal that is input to the first terminal into a current signal, and outputs the current signal from the second terminal; and
   a charge inverting circuit including a third terminal connected to the second terminal, a fourth terminal, and 2M capacitors (M is an integer greater than or equal to 1) that are provided in parallel between the third terminal and the fourth terminal, wherein, in accordance with a predetermined sampling interval, each of the 2M capacitors repeats: (1) sharing input charge that is at least part of input by the current signal, (2) holding at least part of the input charge, (3) inverting a polarity of the held charge and connecting to the third terminal to share the held charge having the inverted polarity, and (4) holding remaining charge, and wherein at a time period when one of the 2M capacitors is connected to the third terminal, the other capacitor(s) of the 2M capacitors is not connected to the third terminal.

2. The discrete-time analog circuit according to claim 1, wherein the 2M capacitors comprise:
- a first capacitor having a fifth terminal and a sixth terminal; and
- a second capacitor having a seventh terminal and an eighth terminal, and wherein, in the charge inverting circuit, at a first time period,
- the first capacitor shares the at least part of the input charge that is input by the current signal by connecting the fifth terminal to the third terminal and by connecting the sixth terminal to the fourth terminal, and
- the second capacitor holds charge that is shared at a time period immediately preceding the first time period, where the seventh terminal and the eighth terminal are not connected to either one of the third terminal and the fourth terminal, at a second time period,
- the second capacitor shares the at least part of the input charge that is input by the current signal by connecting the seventh terminal to the third terminal and by connecting the eighth terminal to the fourth terminal, and
- the first capacitor holds the charge that is shared at the first time period, where the fifth terminal and the sixth terminal are not connected to either of the third terminal and the fourth terminal, at a third time period,
- the first capacitor inverts the polarity of the charge that is held at the second time period by connecting the sixth terminal to the third terminal and by connecting the fifth terminal to the fourth terminal, and shares the charge having the inverted polarity, and
- the second capacitor holds the charge that is shared at the second time period, where the seventh terminal and the eighth terminal are not connected to either one of the third terminal and the fourth terminal, and at a fourth time period,
- the second capacitor inverts the polarity of the charge that is held at the third time period by connecting the eighth terminal to the third terminal and by connecting the seventh terminal to the fourth terminal, and shares the charge having the inverted polarity, and
- the first capacitor holds the charge that is shared at the third time period, where the fifth terminal and the sixth terminal are not connected to either one of the third terminal and the fourth terminal.

3. The discrete-time analog circuit according to claim 1, further comprising:
a first history capacitor that includes a ninth terminal and a tenth terminal, the ninth terminal being connected to the second terminal.

4. The discrete-time analog circuit according to claim 3, wherein the fourth terminal and the tenth terminal are connected to ground.

5. The discrete-time analog circuit according to claim 2, wherein the voltage-current conversion circuit further includes an 11th terminal and a 12th terminal;
the voltage signal that is input to the first terminal is a normal-phase voltage signal, a reverse-phase voltage signal is input to the 11th terminal, the voltage-current conversion circuit converts the input reverse-phase voltage signal into a reverse-phase current signal and outputs the reverse-phase current signal from the 12th terminal; and
the fourth terminal is connected to the 12th terminal.

6. The discrete-time analog circuit according to claim 1, wherein charge that is held by at least one of the 2M capacitors is monitored by using a voltage at a first output terminal connected to the second terminal and the third terminal.

7. The discrete-time analog circuit according to claim 2, wherein the charge inverting circuit further includes a 13th terminal that monitors charge held by each one of the 2M capacitors, and
wherein the 13th terminal
- is connected to the eighth terminal at the first time period,
- is connected to the fifth terminal at the second time period,
- is connected to the seventh terminal at the third time period, and
- is connected to the sixth terminal at the fourth time period.

8. The discrete-time analog circuit according to claim 1, further comprising:
a charge holding connection circuit that has includes a 14th terminal and a 15th terminal and shares the input charge that is input by the current signal, the 14th terminal being connected to the second terminal,
wherein the charge holding connection circuit comprises at least one charge holding capacitor having a 16th terminal and a 17th terminal, and
the charge holding capacitor performs the charge sharing with the charge inverting circuit by connecting the 16th terminal to the 14th terminal at each predetermined interval.

9. The discrete-time analog circuit according to claim 2, further comprising:
a first switch provided between the second terminal of the voltage-current conversion circuit and the third terminal of the charge inverting circuit,
wherein the first switch adjusts an output period of the input charge at an adjustment time period, a time length of the adjustment time period being shorter than that of at least one of the first time period, the second time period, the third time period, and the fourth time period.

10. The discrete-time analog circuit according to claim 5, further comprising:
a second switch provided between the second terminal and the third terminal;
a third switch provided between the 12th terminal and the fourth terminal;
a fourth switch provided between the second terminal and the fourth terminal; and
a fifth switch provided between the 12th terminal and the third terminal,
wherein the second switch and the third switch adjust an output period of the input charge at a first adjustment time period, a time length of the first adjustment time period being shorter than that of at least one of the first time period, the second time period, the third time period, and the fourth time period,
the fourth switch and the fifth switch adjust the output period of the input charge at a second adjustment time period, and
a first control signal for the first adjustment time period has a phase offset of 180 degrees compared to a second control signal for the second adjustment time period.

11. The discrete-time analog circuit according to claim 10, wherein the discrete-time analog circuit is a double-balanced mixer.

12. A multistage-type discrete-time analog circuit comprising:
- at least two discrete-time analog circuits connected in series, each of the at least two discrete-time analog circuits including:
  - a voltage-current conversion circuit including a first terminal and a second terminal, which converts a voltage signal that is input to the first terminal into a current signal, and that outputs the current signal from the second terminal, and
  - a charge inverting circuit including a third terminal connected to the second terminal, a fourth terminal, and 2M capacitors (M is an integer greater than or equal to 1) that are provided in parallel between the third terminal and the fourth terminal, wherein, in accordance with a predetermined sampling interval, each of the 2M capacitors repeats: (1) sharing input charge that is input by the current signal, (2) holding at least part of the input charge, (3) inverting a polarity of the held charge and connecting to the third terminal to share the held charge having the inverted polarity, and (4) holding remaining charge, and wherein at a time period when one of the 2M capacitors is connected to the third terminal, the other capacitor(s) of the 2M capacitors is not connected to the third terminal.

13. A transmitting device comprising:
- the discrete-time analog circuit according to claim 1;
- a digital-to-analog converter that performs digital-to-analog conversion to convert a digital baseband signal into an analog baseband signal and outputs the analog baseband signal to the discrete-time analog circuit;
- a power amplifier that amplifies a signal output from the discrete-time analog circuit; and
- an antenna that outputs the signal amplified by the power amplifier.

14. A receiving device comprising:
- the discrete-time analog circuit according to claim 1;
- an antenna that receives an input signal;
- a low-noise amplifier that amplifies the signal received by the antenna and outputs the amplified signal to the discrete-time analog circuit; and
- an analog-to-digital converter that performs analog-to-digital conversion to convert a baseband signal output from the discrete-time analog circuit into a digital baseband signal and outputs the digital baseband signal.

* * * * *